United States Patent
Yanagida et al.

(10) Patent No.: US 9,497,841 B2
(45) Date of Patent: Nov. 15, 2016

(54) EXTREME ULTRAVIOLET LIGHT GENERATION SYSTEM

(71) Applicant: GIGAPHOTON INC., Tochigi (JP)

(72) Inventors: Tatsuya Yanagida, Oyama (JP); Osamu Wakabayashi, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 14/945,096

(22) Filed: Nov. 18, 2015

(65) Prior Publication Data

US 2016/0073487 A1 Mar. 10, 2016

Related U.S. Application Data

(63) Continuation of application No. PCT/JP2014/064265, filed on May 29, 2014.

(30) Foreign Application Priority Data

May 31, 2013 (JP) ................................ 2013-116242

(51) Int. Cl.
*H05G 2/00* (2006.01)
*H01S 3/00* (2006.01)
(Continued)

(52) U.S. Cl.
CPC .............. *H05G 2/008* (2013.01); *H01S 3/0602* (2013.01); *H01S 3/1115* (2013.01); *H05G 2/006* (2013.01)

(58) Field of Classification Search
CPC ...... H05G 2/008; H05G 2/003; H05G 2/005; H05G 2/006; H01S 3/131; H01S 3/1643; G21K 5/00; G21K 5/08
USPC ....... 250/504 R, 396 ML, 423 P, 426, 492.1; 372/27, 29.014
See application file for complete search history.

(56) References Cited

U.S. PATENT DOCUMENTS 7,432,517 B2 * 10/2008 Botma ............... B23K 26/0613
　　　　　　　　　　　　　　　　250/493.1
8,436,328 B2 * 5/2013 Yanagida ............ G03F 7/70033
　　　　　　　　　　　　　　　　250/396 ML
(Continued)

FOREIGN PATENT DOCUMENTS

EP　　2 538 759 A1　12/2012
JP　2006-303461 A　11/2006
(Continued)

OTHER PUBLICATIONS

International Search Report issued in Application No. PCT/JP2014/064265, mailed Sep. 2, 2014, 2 pages.

*Primary Examiner* — David A Vanore
(74) *Attorney, Agent, or Firm* — Studebaker & Brackett PC

(57) ABSTRACT

An extreme ultraviolet light (EUV) generation system is configured to improve conversion efficiency of energy of a laser system to EUV energy by improving the efficiency of plasma generation. The EUV generation system includes a target generation unit configured to output a target toward a plasma generation region in a chamber. The laser system is configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order. In addition, the EUV generation system includes a controller configured to control the laser system so that a fluence of the second pre-pulse laser beam is equal to or higher than 1 J/cm$^2$ and equal to or lower than a fluence of the main pulse laser beam.

20 Claims, 35 Drawing Sheets

(51) Int. Cl.
*H01S 3/06* (2006.01)
*H01S 3/11* (2006.01)

(56) References Cited

U.S. PATENT DOCUMENTS

| | | | | |
|---|---|---|---|---|
| 8,558,202 | B2* | 10/2013 | Yanagida | G03F 7/70033 250/396 ML |
| 8,653,491 | B2* | 2/2014 | Partlo | H05G 2/003 250/504 R |
| 9,072,153 | B2* | 6/2015 | Wakabayashi | H05G 2/008 |
| 9,113,540 | B2* | 8/2015 | Hori | H01S 3/10061 |
| 9,119,278 | B2* | 8/2015 | Chrobak | H05G 2/003 |
| 9,167,678 | B2* | 10/2015 | Hori | H01S 3/10061 |
| 9,232,623 | B2* | 1/2016 | Rafac | H05G 2/008 |
| 9,239,269 | B1* | 1/2016 | Liu | G01J 11/00 |
| 2005/0129177 | A1 | 6/2005 | Berglund et al. | |
| 2006/0215712 | A1 | 9/2006 | Ziener et al. | |
| 2007/0158577 | A1 | 7/2007 | Tomie | |
| 2010/0220756 | A1 | 9/2010 | Krzysztof et al. | |
| 2011/0079736 | A1 | 4/2011 | Hansson et al. | |
| 2012/0243566 | A1 | 9/2012 | Hori et al. | |
| 2012/0248344 | A1* | 10/2012 | Wakabayashi | H05G 2/008 250/504 R |
| 2012/0305811 | A1* | 12/2012 | Wakabayashi | H05G 2/008 250/504 R |
| 2012/0307851 | A1 | 12/2012 | Hori et al. | |
| 2014/0084183 | A1* | 3/2014 | Wakabayashi | H05G 2/008 250/492.1 |
| 2015/0123019 | A1* | 5/2015 | Hori | F21K 2/00 250/504 R |
| 2016/0073487 | A1* | 3/2016 | Yanagida | H05G 2/006 250/504 R |
| 2016/0128172 | A1* | 5/2016 | Hori | H05G 2/008 250/504 R |

FOREIGN PATENT DOCUMENTS

| | | |
|---|---|---|
| JP | 2010-003548 A | 1/2010 |
| JP | 2010-226096 A | 10/2010 |
| JP | 2012-134433 A | 7/2012 |
| JP | 2013-004258 A | 1/2013 |
| JP | 2013-020926 A | 1/2013 |

* cited by examiner

FIG. 11A
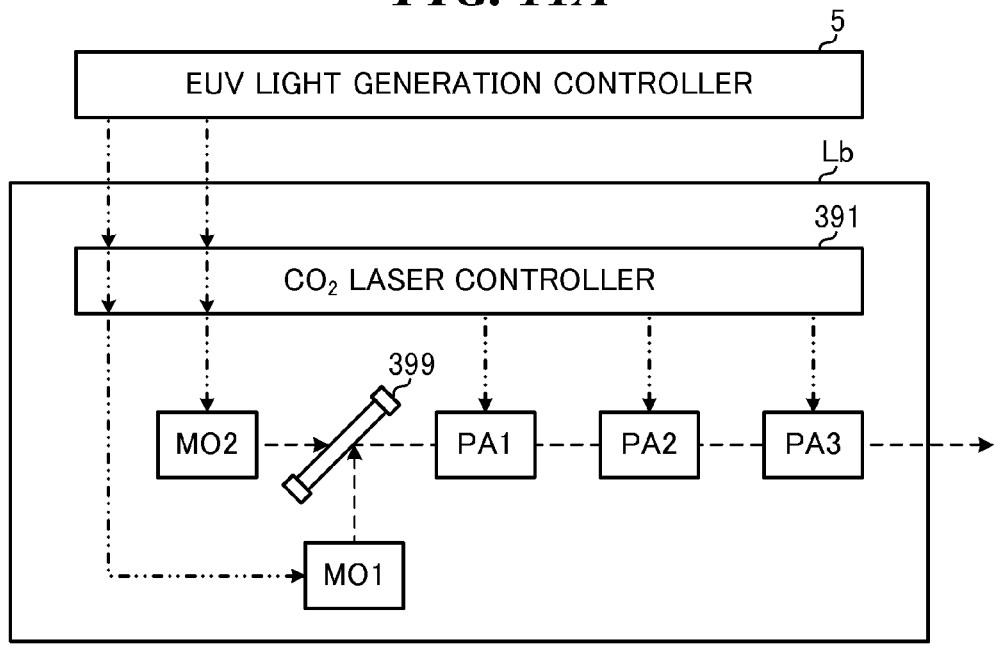
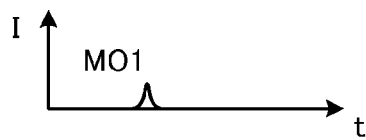
FIG. 11B
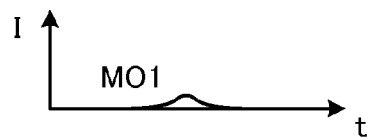
FIG. 11F
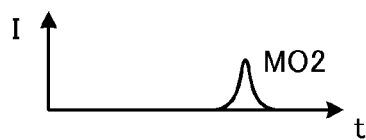
FIG. 11C
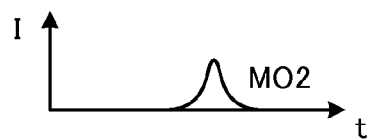
FIG. 11G
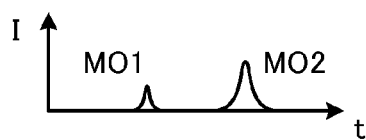
FIG. 11D
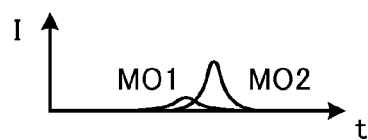
FIG. 11H
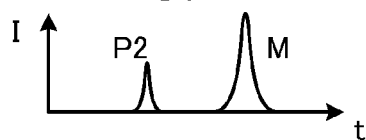
FIG. 11E
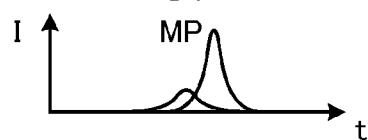
FIG. 11I

EXTREME ULTRAVIOLET LIGHT GENERATION SYSTEM

TECHNICAL FIELD

The present disclosure relates to an extreme ultraviolet light generation system.

BACKGROUND ART

In recent years, as semiconductor processes become finer, transfer patterns for use in photolithographies of semiconductor processes have rapidly become finer. In the next generation, microfabrication at 70 nm to 45 nm, further, microfabrication at 32 nm or less would be demanded. In order to meet the demand for microfabrication at 32 nm or less, for example, it is expected to develop an exposure apparatus in which a system for generating EUV (extreme ultraviolet) light at a wavelength of approximately 13 nm is combined with a reduced projection reflective optics.

Three types of EUV light generation systems have been proposed, which include an LPP (laser produced plasma) type system using plasma generated by irradiating a target with a laser beam, a DPP (discharge produced plasma) type system using plasma generated by electric discharge, and an SR (synchrotron radiation) type system using orbital radiation.

SUMMARY

An extreme ultraviolet light generation system according to one aspect of the present disclosure may include: a chamber; a target generation unit configured to output a target toward a plasma generation region in the chamber; a laser system configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order; and a controller configured to control the laser system so that a fluence of the second pre-pulse laser beam is equal to or higher than 1 J/cm$^2$ and equal to or lower than a fluence of the main pulse laser beam.

An extreme ultraviolet light generation system according to another aspect of the present disclosure may include: a chamber; a target generation unit configured to output a target toward a plasma generation region in the chamber; a laser system configured to generate a pre-pulse laser beam and a main pulse laser beam so that the target is irradiated with the pre-pulse laser beam and the main pulse laser beam in this order; and a controller configured to control a pulse waveform of the main pulse laser beam so that the pulse waveform includes a first stage in which light intensity increases at a rate of increase equal to or lower than a first rate of increase, a second stage in which the light intensity increases at a rate of increase equal to or higher than a second rate of increase that is higher than the first rate of increase, and a third stage in which the light intensity decreases and so that a fluence of the main pulse laser beam in the first stage is equal to or higher than 2 J/cm$^2$ and equal to or lower than a fluence of the main pulse laser beam in the second and third stages.

An extreme ultraviolet light generation system according to another aspect of the present disclosure may include: a chamber; a target generation unit configured to output a target toward a plasma generation region in the chamber; a laser system configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order, the main pulse laser beam having a wavelength longer than a wavelength of the first pre-pulse laser beam and a wavelength of the second pre-pulse laser beam; a laser focusing optics configured to focus the first pre-pulse laser beam, the second pre-pulse laser beam, and the main pulse laser beam on the plasma generation region; and a controller configured to control a beam diameter of at least one of the first pre-pulse laser beam, the second pre-pulse laser beam, and the main pulse laser beam so that a beam diameter of the second pre-pulse laser beam entering the laser focusing optics is smaller than a beam diameter of the first pre-pulse laser beam entering the laser focusing optics and a beam diameter of the main pulse laser beam entering the laser focusing optics.

An extreme ultraviolet light generation system according to another aspect of the present disclosure may include: a chamber; a target generation unit configured to output a target toward a plasma generation region in the chamber; a laser system configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order; and a controller configured to control a laser beam path axis of at least one of the first pre-pulse laser beam and the main pulse laser beam so that a position where the target is irradiated with the first pre-pulse laser beam is closer to the target generation unit than a position where the target is irradiated with the main pulse laser beam.

An extreme ultraviolet light generation system according to another aspect of the present disclosure may include: a chamber; a target generation unit configured to output a target toward a plasma generation region in the chamber; and a laser system configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order, wherein a difference between a wavelength of the main pulse laser beam and a wavelength of the second pre-pulse laser beam may be smaller than a difference between the wavelength of the second pre-pulse laser beam and a wavelength of the first pre-pulse laser beam.

An extreme ultraviolet light generation system according to another aspect of the present disclosure may include: a chamber; a target generation unit configured to output a target toward a plasma generation region in the chamber; a laser system configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order; and a controller configured to control the laser system so that a period of time from a timing when the target is irradiated with the first pre-pulse laser beam to a timing when the target is irradiated with the second pre-pulse laser beam is shorter than a period of time from the timing when the target is irradiated with the second pre-pulse laser beam to a timing when the target is irradiated with the main pulse laser beam.

BRIEF DESCRIPTION OF DRAWINGS

Hereinafter, selected embodiments of the present disclosure will be described with reference to the accompanying drawings by way of example.

FIG. 11A schematically illustrates a first configuration example of a $CO_2$ laser apparatus in the second embodiment. FIG. 11B is a graph showing a first example of a pulse waveform of a first seed laser beam that is outputted from a first master oscillator. FIG. 11C is a graph showing a first example of a pulse waveform of a second seed laser beam that is outputted from a second master oscillator. FIG. 11D is a graph showing a first example of a pulse waveform of a pulse laser beam that is outputted from a beam combiner. FIG. 11E is a graph showing a first example of a pulse waveform of a pulse laser beam that is outputted from the $CO_2$ laser apparatus. FIG. 11F is a graph showing a second example of the pulse waveform of the first seed laser beam that is outputted from the first master oscillator. FIG. 11G is a graph showing a second example of the pulse waveform of the second seed laser beam that is outputted from the second master oscillator. FIG. 11H is a graph showing a second example of the pulse waveform of the pulse laser beam that is outputted from the beam combiner. FIG. 11I is a graph showing a second example of the pulse waveform of the pulse laser beam that is outputted from the $CO_2$ laser apparatus.

DESCRIPTION OF EMBODIMENTS

Contents

Figure 1:
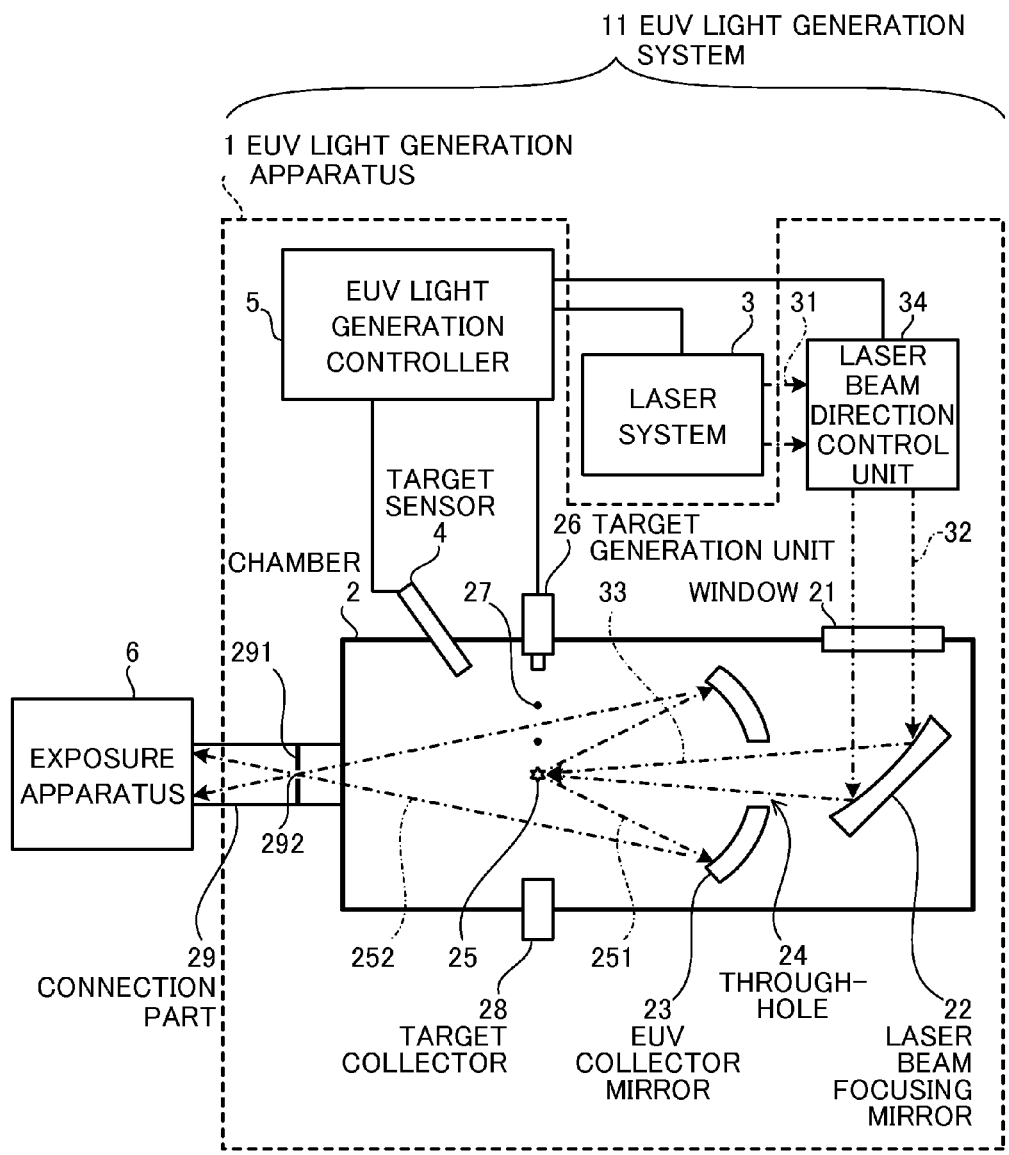
FIG. 1 schematically illustrates a configuration example of an LPP type EUV light generation system.

1. Overview
2. Description of terms
3. Overview of an EUV light generation system
    3.1 Configuration
    3.2 Operation
4. EUV light generation system in which a target is irradiated with first and second pre-pulse laser beams
    4.1 Configuration
        4.1.1 Target generation unit
        4.1.2 Target sensor and light-emitting unit
        4.1.3 Laser system
        4.1.4 Laser beam direction control unit
        4.1.5 Beam detector
        4.1.6 Focusing optics
        4.1.7 EUV collector mirror and EUV light sensor
    4.2 Operation
        4.2.1 Output of the target
        4.2.2 Output of the pulse laser beams
        4.2.3 Transmission of the pulse laser beams
        4.2.4 Detection of the pulse laser beams
        4.2.5 Focusing of the pulse laser beams
    4.3 First example of laser optics
        4.3.1 Adjustment of positions of irradiation with the pulse laser beams
        4.3.2 Focusing diameters of the pulse laser beams
    4.4 Second example of the laser optics
    4.5 Third example of the laser optics
5. EUV light generation system in which two trigger signals are inputted to a $CO_2$ laser apparatus
    5.1 Configuration
    5.2 Operation
    5.3 Example of laser optics
    5.4 Variation of a pulse waveform of a pulse laser beam from the $CO_2$ laser apparatus
    5.5 First configuration example of the $CO_2$ laser apparatus to which two trigger signals are inputted
    5.6 Second configuration example of the $CO_2$ laser apparatus to which two trigger signals are inputted
    5.7 Third configuration example of the $CO_2$ laser apparatus to which two trigger signals are inputted
6. Relationship between the parameters of pulse laser beams and CE
    6.1 Fluence and light intensity of a second pre-pulse laser beam P2, or of a main pulse laser beam MP in the first stage
    6.2 Timing of irradiation with the second pre-pulse laser beam P2
    6.3 Fluence of the main pulse laser beam M or MP
    6.4 Timing of irradiation with the first pre-pulse laser beam P1
    6.5 Timing of irradiation with the first and second pre-pulse laser beams
7. Changes of a target irradiated with the pulse laser beams
    7.1 Case where the first pre-pulse laser beam has a pulse duration of the picosecond order
    7.2 Case where the first pre-pulse laser beam has a pulse duration of the nanosecond order
8. EUV light generation system in which a YAG laser apparatus outputs a plurality of pulses
    8.1 Configuration
    8.2 Operation
    8.3 Example of laser optics
    8.4 Variation in which a fourth trigger signal is used
    8.5 Improvement of CE
    8.6 Changes of a target irradiated with the pulse laser beams
9. Others (YAG laser apparatus)
    9.1 First example
    9.2 Second example
        9.2.1 Case where no voltage is applied to the Pockels cell
        9.2.2 Case where voltage is applied to the Pockels cell
10. Configuration of the controller Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Corresponding elements may be referenced by corresponding reference numerals and characters, and duplicate descriptions thereof may be omitted.

1. OVERVIEW

In an LPP type EUV light generation system, a target generation unit may output a droplet target so that the droplet target reaches a plasma generation region in a chamber. At a point of time when the target reaches the plasma generation region, the target may be irradiated with a pulse laser beam by a laser system. The target may turn into plasma from which EUV light may be emitted. The emitted EUV light may be collected by an EUV collector mirror disposed within the chamber and may be outputted to an exposure apparatus or the like.

For the EUV light generation system, there is a demand to improve conversion efficiency (CE) from energy of the pulse laser beam to energy of the EUV light.

In one aspect of the present disclosure, an EUV light generation system may be configured such that a droplet target is irradiated with a first pre-pulse laser beam, irradiated with a second pre-pulse laser beam, and then irradiated with a main pulse laser beam. By being irradiated with the first pre-pulse laser beam, the droplet target may be broken up into fine particles to form a target being expanded. By being irradiated with the second pre-pulse laser beam, the target may become steam or pre-plasma. By being irradiated with the main pulse laser beam, the steam or pre-plasma may efficiently turn into plasma.

2. DESCRIPTION OF TERMS

Several terms used in the present application will be described hereinafter.

A "trajectory" of a target may be an ideal path of a target outputted from a target generation unit, or may be a path of a target according to the design of a target generation unit.

An "actual path" of the target may be an actual path of a target outputted from a target generation unit.

"Plasma generation region" may refer to a region where the generation of plasma for generating EUV light begins.

A "beam path axis" of a pulse laser beam may refer to a central axis of a beam path of the pulse laser beam.

3. OVERVIEW OF AN EUV LIGHT GENERATION SYSTEM

3.1 Configuration

FIG. 1 schematically illustrates a configuration example of an LPP type EUV light generation system. An EUV light generation apparatus 1 may be used with at least one laser system 3. Hereinafter, a system that includes the EUV light generation apparatus 1 and the laser system 3 may be referred to as an EUV light generation system 11. As shown in FIG. 1 and described in detail below, the EUV light generation apparatus 1 may include a chamber 2 and a target generation unit 26. The chamber 2 may be sealed airtight. The target generation unit 26 may be mounted onto the chamber 2, for example, to penetrate a wall of the chamber 2. A target material to be outputted by the target generation unit 26 may include, but is not limited to, tin, terbium, gadolinium, lithium, xenon, or a combination of any two or more of them.

The chamber 2 may have at least one through-hole in its wall. A window 21 may be located at the through-hole. A pulse laser beam 32 that is outputted from the laser system 3 may travel through the window 21. In the chamber 2, an EUV collector mirror 23 having a spheroidal reflective surface may be provided. The EUV collector mirror 23 may have a first focusing point and a second focusing point. The surface of the EUV collector mirror 23 may have a multi-layered reflective film in which molybdenum layers and silicon layers are alternately laminated. The EUV collector mirror 23 may be arranged such that the first focusing point is positioned in a plasma generation region 25 and the second focusing point is positioned in an intermediate focus (IF) region 292. The EUV collector mirror 23 may have a through-hole 24 formed at the center thereof so that a pulse laser beam 33 may travel through the through-hole 24.

The EUV light generation apparatus 1 may include an EUV light generation controller 5, a target sensor 4, and the like. The target sensor 4 may have an imaging function and be configured to detect the presence, actual path, position, speed and the like of a target 27.

Further, the EUV light generation apparatus 1 may include a connection part 29 for allowing the interior of the chamber 2 to be in communication with the interior of the exposure apparatus 6. In the connection part 29, a wall 291 having an aperture may be provided. The wall 291 may be positioned such that the second focusing point of the EUV collector mirror 23 lies in the aperture formed in the wall 291.

The EUV light generation apparatus 1 may also include a laser beam direction control unit 34, a laser beam focusing mirror 22, and a target collector 28 for collecting the target 27. The laser beam direction control unit 34 may include an optical element for defining the traveling direction of the laser beam and an actuator for adjusting the position or the posture of the optical element.

3.2 Operation

With continued reference to FIG. 1, a pulse laser beam 31 outputted from the laser system 3 may pass through the laser beam direction control unit 34 and be outputted therefrom as the pulse laser beam 32 to travel through the window 21 and enter into the chamber 2. The pulse laser beam 32 may travel inside the chamber 2 along at least one laser beam path, be reflected by the laser beam focusing mirror 22, and strike at least one target 27 as a pulse laser beam 33.

The target generation unit 26 may be configured to output the target(s) 27 toward the plasma generation region 25 in the chamber 2. The target 27 may be irradiated with at least one pulse of the pulse laser beam 33. Upon being irradiated with the pulse laser beam, the target 27 may be turned into plasma, and rays of light 251 may be emitted from the plasma. EUV light included in the light 251 may be reflected by the EUV collector mirror 23 at higher reflectance than light of the other wavelength regions. The reflected light 252 including the EUV light reflected by the EUV collector mirror 23 may be focused on the intermediate focus region 292 and outputted to the exposure apparatus 6. Here, one target 27 may be irradiated with multiple pulses included in the pulse laser beam 33.

The EUV light generation controller 5 may be configured to integrally control the entire EUV light generation system 11. The EUV light generation controller 5 may be configured to process image data and the like of the target 27 captured by the target sensor 4. Further, the EUV light generation controller 5 may be configured to control the timing when the target 27 is outputted, the direction to which the target 27 is outputted, and the like. Furthermore, the EUV light generation controller 5 may be configured to control the timing when the laser system 3 oscillates, the direction in which the pulse laser beam 32 travels, the position at which the pulse laser beam 33 is focused, and the like. The various controls mentioned above are merely examples, and other controls may be added as necessary.

4. EUV LIGHT GENERATION SYSTEM IN WHICH A TARGET IS IRRADIATED WITH FIRST AND SECOND PRE-PULSE LASER BEAMS

4.1 Configuration

Figure 2:
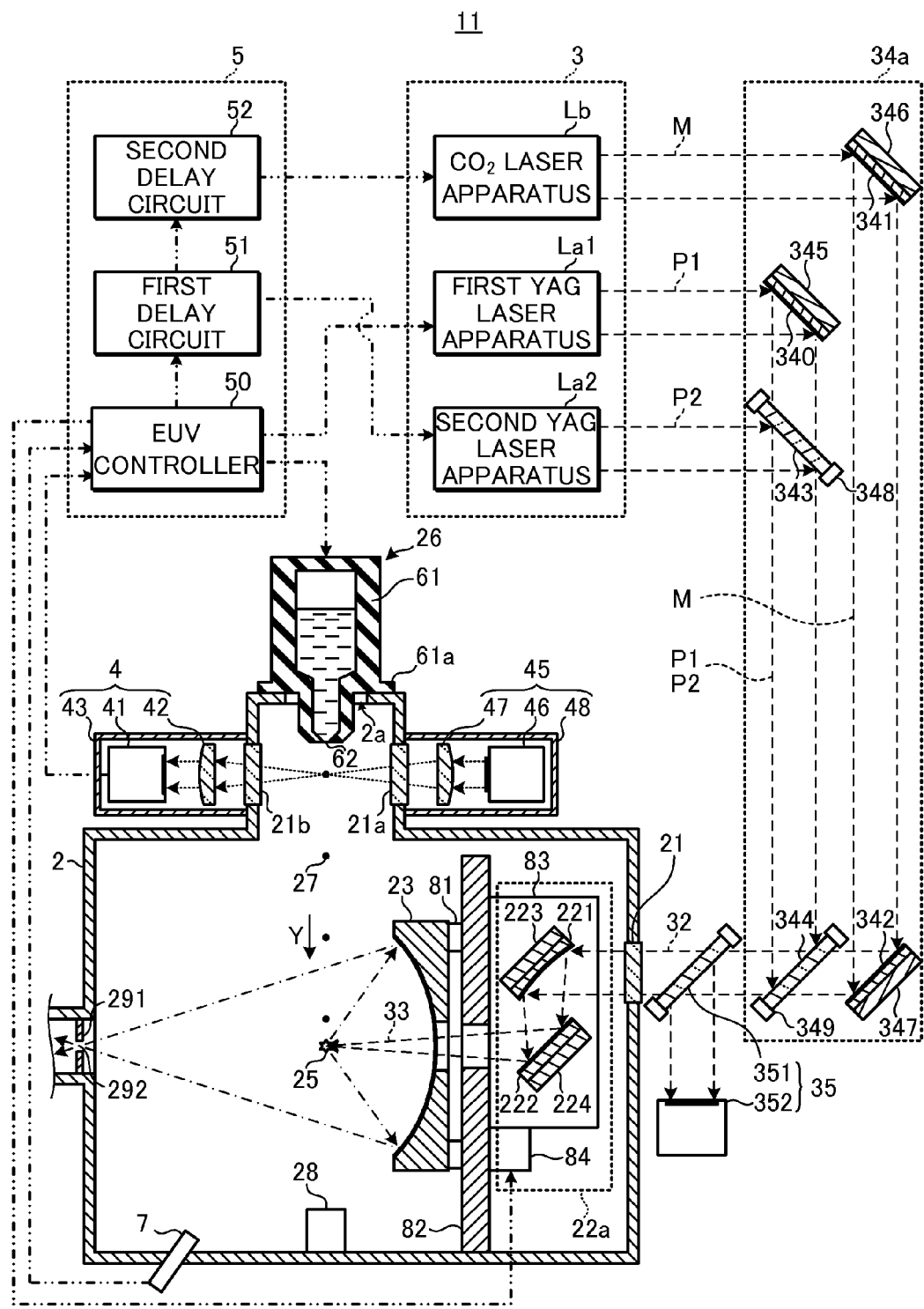
FIG. 2 is a partial cross-sectional view showing a configuration of an EUV light generation system according to a first embodiment.

FIG. 2 is a partial cross-sectional view showing a configuration of the EUV light generation system 11 according to a first embodiment. As shown in FIG. 2, a focusing optics 22a, the EUV collector mirror 23, a target collector 28, an EUV collector mirror holder 81, and plates 82 and 83 may be provided inside the chamber 2. A target generation unit 26, the target sensor 4, a light-emitting unit 45, and an EUV light sensor 7 may be attached to the chamber 2.

The laser system 3, a laser beam direction control unit 34a, a beam detector 35, and the EUV light generation controller 5 may be arranged outside the chamber 2. The EUV light generation controller 5 may include an EUV controller 50, a first delay circuit 51, and a second delay circuit 52.

4.1.1 Target Generation Unit

The target generation unit 26 may have a reservoir 61. The reservoir 61 may have a molten target material stored therein. The target material may be maintained at a temperature equal to or higher than a melting point thereof by a heater (not shown) provided in the reservoir 61. A part of the reservoir 61 may penetrate a wall of the chamber 2 through a through-hole 2a so that an end of the reservoir 61 may be located inside the chamber 2. At the aforementioned end of the reservoir 61, an opening 62 may be formed. The reservoir 61 may have a flange 61a fixed in close contact with the wall of the chamber 2 around the through-hole 2a.

4.1.2 Target Sensor and Light-Emitting Unit

The target sensor 4 and the light-emitting unit 45 may be disposed on opposite sides to each other with the trajectory of the target 27 therebetween. Windows 21a and 21b may be attached to the chamber 2. The window 21a may be located between the light-emitting unit 45 and the trajectory of the target 27. The window 21b may be located between the trajectory of the target 27 and the target sensor 4.

The target sensor 4 may include an optical sensor 41, a focusing optics 42, and a container 43. The container 43 may be fixed to an outer part of the chamber 2. In the container 43, the optical sensor 41 and the focusing optics 42 may be fixed. The light-emitting unit 45 may include a light source 46, a focusing optics 47, and a container 48. The container 48 may be fixed to an outer part of the chamber 2. In the container 48, the light source 46 and the focusing optics 47 may be fixed.

Output light from the light source 46 may be focused by the focusing optics 47 at a position substantially on the trajectory of the target 27 between the target generation unit 26 and the plasma generation region 25. When the target 27 passes through a position at which light emitted by the light-emitting unit 45 is focused, the target sensor 4 may detect a change in light intensity of light passing through the trajectory of the target 27 and an area therearound. The target sensor 4 may then output a target detection signal.

4.1.3 Laser System

The laser system 3 may include a first YAG laser apparatus La1, a second YAG laser apparatus La2, and a $CO_2$ laser apparatus Lb. The YAG laser apparatuses and the $CO_2$ laser apparatus, which are taken as an example here, may be replaced by other types of laser apparatuses, e.g. laser apparatuses using $Nd:YVO_4$. The YAG laser apparatuses may each be one that includes a laser oscillator and, as needed, a laser amplifier and uses a YAG crystal as a laser medium for either one or both of the laser oscillator and the laser amplifier. The $CO_2$ laser apparatus may be one that includes a laser oscillator and, as needed, a laser amplifier and uses a $CO_2$ gas as a laser medium for either one or both of the laser oscillator and the laser amplifier.

The first YAG laser apparatus La1 may output a first pre-pulse laser beam P1. The second YAG laser apparatus La2 may output a second pre-pulse laser beam P2. The $CO_2$ laser apparatus Lb may output a main pulse laser beam M.

4.1.4 Laser Beam Direction Control Unit

The laser beam direction control unit 34a may include high reflection mirrors 340, 341, and 342 and beam combiners 343 and 344. The high reflection mirror 340 may be supported by a holder 345. The high reflection mirror 341 may be supported by a holder 346. The high reflection mirror 342 may be supported by a holder 347.

The beam combiner 343 may be supported by a holder 348. The beam combiner 343 may include a polarizer configured to transmit a linearly-polarized beam, whose direction of polarization is parallel to the paper plane, at high transmittance. The polarizer may reflect a linearly-polarized beam, whose direction of polarization is perpendicular to the paper plane, at high reflectance. The polarizer may thereby substantially make the two beams coincide with each other.

The beam combiner 344 may be supported by a holder 349. The beam combiner 344 may include a dichroic mirror configured to transmit a beam containing a first wavelength component at high transmittance. The dichroic mirror may reflect a beam containing a second wavelength component at high reflectance. The dichroic mirror may thereby substantially make the two beams coincide with each other.

In a case where the first and second pre-pulse laser beams P1 and P2 have different wavelength components from each other, the beam combiner 343 may also be a dichroic mirror.

4.1.5 Beam Detector

The beam detector 35 may be provided in a beam path of the pulse laser beam 32 between the laser beam direction control unit 34a and the focusing optics 22a. The beam detector 35 may include a beam splitter 351 and an optical sensor 352.

4.1.6 Focusing Optics

The plate 82 may be fixed to the chamber 2. The plate 83 may be supported by the plate 82. The focusing optics 22a may include an off-axis paraboloidal mirror 221 and a flat mirror 222. The off-axis paraboloidal mirror 221 may be supported by a holder 223. The flat mirror 222 may be supported by a holder 224. The holders 223 and 224 may be fixed to the plate 83.

A positioning mechanism 84 may be able to adjust the position of the plate 83 relative to the plate 82 in accordance with a control signal that is outputted from the EUV controller 50. The positions of the off-axis paraboloidal mirror 221 and the flat mirror 222 may be adjusted by adjusting the position of the plate 83. The positions of the off-axis paraboloidal mirror 221 and the flat mirror 222 may be adjusted so that the pulse laser beam 33 reflected by these mirrors may be focused on the plasma generation region 25.

4.1.7 EUV Collector Mirror and EUV Light Sensor

The EUV collector mirror 23 may be fixed to the plate 82 via the EUV collector mirror holder 81. The EUV light sensor 7 may receive a part of the EUV light generated in the plasma generation region 25 and detect energy of the EUV light or light intensity of the EUV light. The EUV light sensor 7 may output a detection result to the EUV controller 50.

4.2 Operation

4.2.1 Output of the Target

The EUV controller 50 of the EUV light generation controller 5 may output a control signal to the target generation unit 26 so that the target generation unit 26 may output a target 27.

The target generation unit 26 may output a plurality of droplet targets 27 in sequence through the opening 62. The plurality of droplet targets 27 may reach the plasma generation region 25 in order of output. The target collector 28 may be disposed on the extension line of the trajectory of a target 27 to collect a target having passed through the plasma generation region 25.

The EUV controller 50 may receive the target detection signal that is outputted from the target sensor 4.

4.2.2 Output of the Pulse Laser Beams

The EUV controller 50 may control the laser system 3 so that the pulse laser beam 33 is focused on a target 27 at a timing when the target 27 reaches the plasma generation region 25 or the vicinity thereof.

The EUV controller 50 may output, to the first YAG laser apparatus La1 and to the first delay circuit 51, a first trigger signal on the basis of the target detection signal. The first YAG laser apparatus La1 may output the first pre-pulse laser beam P1 in accordance with the first trigger signal.

The first delay circuit 51 may receive the first trigger signal. The first delay circuit 51 may output, to the second YAG laser apparatus La2 and to the second delay circuit 52, a second trigger signal indicating that a first delay time has elapsed since the timing of reception of the first trigger signal. The second YAG laser apparatus La2 may output the second pre-pulse laser beam P2 in accordance with the second trigger signal.

The second delay circuit 52 may receive the second trigger signal. The second delay circuit 52 may output, to the $CO_2$ laser apparatus Lb, a third trigger signal indicating that a second delay time has elapsed since the timing of reception of the second trigger signal.

Alternatively, the EUV controller 50 may output the first trigger signal, also to the second delay circuit 52. Upon receiving the first trigger signal, the second delay circuit 52 may output, to the $CO_2$ laser apparatus Lb, a third trigger signal indicating that the first and second delay times have elapsed since the timing of reception of the first trigger signal.

The $CO_2$ laser apparatus Lb may output the main pulse laser beam M in accordance with the third trigger signal.

In this manner, the laser system 3 may output the first pre-pulse laser beam P1, the second pre-pulse laser beam P2, and the main pulse laser beam M in this order.

4.2.3 Transmission of the Pulse Laser Beams

The high reflection mirror 340 of the laser beam direction control unit 34a may be provided in a beam path of the first pre-pulse laser beam P1 outputted by the first YAG laser apparatus La1. The high reflection mirror 340 may reflect the first pre-pulse laser beam P1 at high reflectance.

The beam combiner 343 may be disposed at a position where two beam paths intersect. The two beam paths may include a beam path of the first pre-pulse laser beam P1 reflected by the high reflection mirror 340 and a beam path of the second pre-pulse laser beam P2 outputted by the second YAG laser apparatus La1. The first pre-pulse laser beam P1 may be a linearly-polarized beam whose direction of polarization is parallel to the paper plane. The second pre-pulse laser beam P2 may be a linearly-polarized beam whose direction of polarization is perpendicular to the paper plane.

The first pre-pulse laser beam P1 may be incident on the beam combiner 343 from the upper side in FIG. 2. The second pre-pulse laser beam P2 may be incident on the beam combiner 343 from the left side in FIG. 2. The beam combiner 343 may transmit the first pre-pulse laser beam P1 at high transmittance, and reflect the second pre-pulse laser beam P2 at high reflectance, so as to guide these beams to the beam combiner 344.

The high reflection mirrors 341 and 342 may be provided in a beam path of the main pulse laser beam M outputted by the $CO_2$ laser apparatus Lb. The high reflection mirrors 341 and 342 may reflect, in sequence, the main pulse laser beam M at high reflectance.

The beam combiner 344 may be provided at a position where other two beam paths intersect. The two beam paths include a beam path of the first and second pre-pulse laser beams P1 and P2 and a beam path of the main pulse laser beam M reflected by the high reflection mirror 342. The main pulse laser beam M may contain a wavelength component that is different from those contained in the first and second pre-pulse laser beams P1 and P2.

The first and second pre-pulse laser beams P1 and P2 may be incident on the beam combiner 344 from the upper side in FIG. 2. The main pulse laser beam M may be incident on the beam combiner 344 from the right side in FIG. 2. The beam combiner 344 may reflect the first and second pre-pulse laser beams P1 and P2 at high reflectance, and transmit the main pulse laser beam M at high transmittance, so as to guide these beams as the pulse laser beam 32 to the focusing optics 22a.

4.2.4 Detection of the Pulse Laser Beams

The beam splitter 351 of the beam detector 35 may transmit the pulse laser beam 32 at high transmittance toward the focusing optics 22a and reflect a part of the pulse laser beam 32 toward the optical sensor 352. The optical sensor 352 may receive that part of the pulse laser beam 32 reflected by the beam splitter 351 and output, to the EUV controller 50, a laser beam reception signal representing the timing of the reception and other parameters. A timing at which the pulse laser beam 32 is received by the optical sensor 352 may substantially coincide with a timing at which the pulse laser beam 33 strikes a target 27.

Figure 3:
FIG. 3 is a waveform chart showing an example of a laser beam reception signal in the first embodiment.

FIG. 3 is a waveform chart showing an example of a laser beam reception signal in the first embodiment. In FIG. 3, the horizontal axis may represent time t, and the vertical axis may represent light intensity I. The pulse laser beam 32 that the optical sensor 352 receives may include the first pre-pulse laser beam P1, the second pre-pulse laser beam P2, and the main pulse laser beam M. The first pre-pulse laser beam P1, the second pre-pulse laser beam P2, and the main pulse laser beam M may be incident on the optical sensor 352 in this order. Pulse energy of the main pulse laser beam M may be greater than pulse energy of each of the first and second pre-pulse laser beams P1 and P2. Here, the pulse energy may be estimated by integrating the light intensity I.

4.2.5 Focusing of the Pulse Laser Beams

Referring back to FIG. 2, the off-axis paraboloidal mirror 221 of the focusing optics 22a may be provided in the beam path of the pulse laser beam 32. The off-axis paraboloidal mirror 221 may reflect the pulse laser beam 32 toward the flat mirror 222. The flat mirror 222 may reflect the pulse laser beam 32, which has been reflected by the off-axis paraboloidal mirror 221, as the pulse laser beam 33 toward the plasma generation region 25 or the vicinity thereof. The pulse laser beam 33 may be focused on the plasma generation region 25 or the vicinity thereof in conformance with the shape of a reflective surface of the off-axis paraboloidal mirror 221.

In the plasma generation region 25 or the vicinity thereof, a single target 27 may be irradiated with the first pre-pulse laser beam P1, the second pre-pulse laser beam P2, and the main pulse laser beam M in this order. By being irradiated with the first pre-pulse laser beam P1, the droplet target 27 may be broken up into a plurality of fine particles and diffused to form a secondary target. By being irradiated with the second pre-pulse laser beam P2, the secondary target may turn into a tertiary target including at least steam or pre-plasma. By being irradiated with the main pulse laser beam M, the tertiary target may efficiently turn into plasma to generate EUV light.

4.3 First Example of Laser Optics

Figure 4:
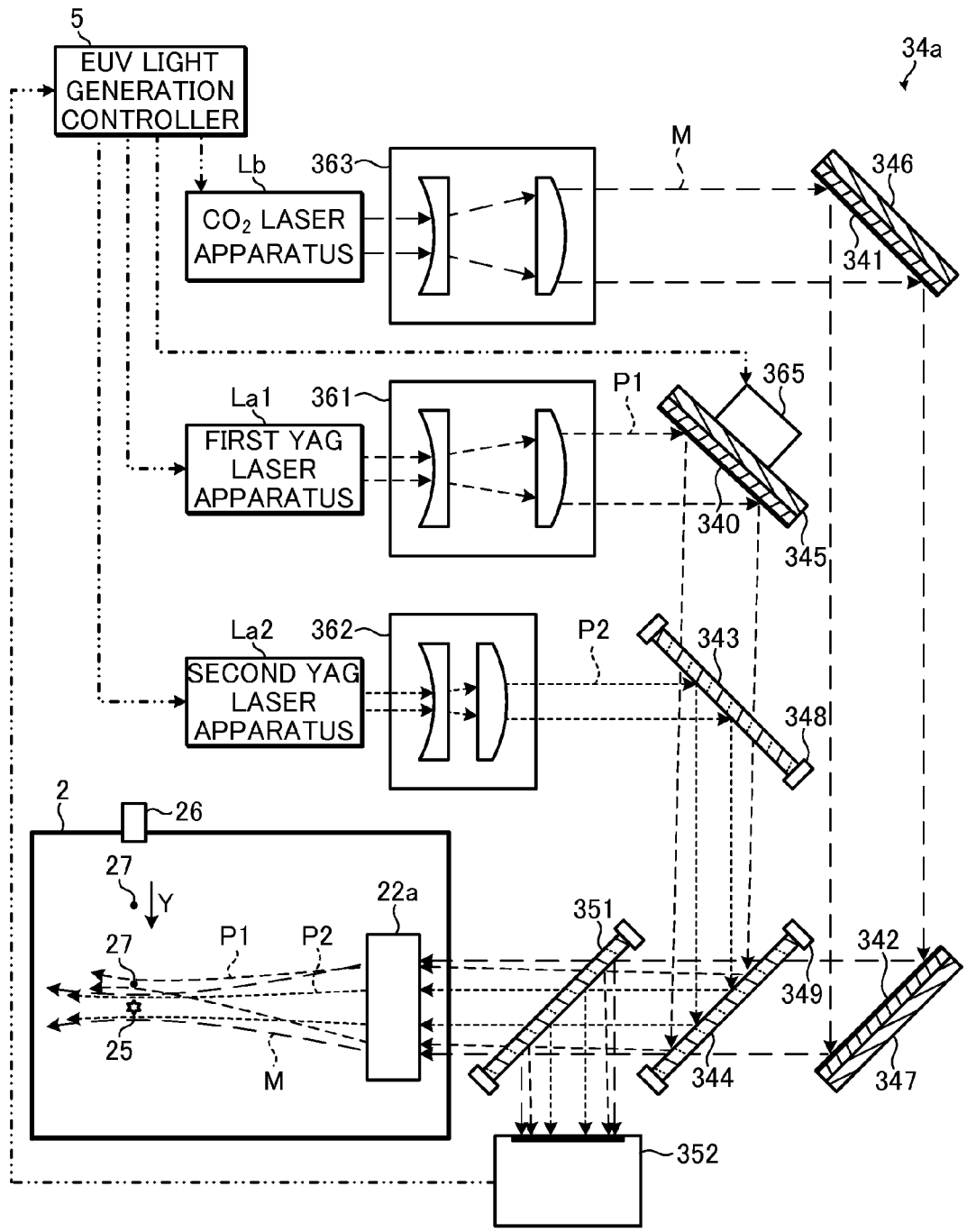
FIG. 4 schematically illustrates a first configuration example of a laser beam direction control unit and components therearound in the EUV light generation system shown in FIG. 2.

FIG. 4 schematically illustrates a first configuration example of the laser beam direction control unit 34a and components therearound in the EUV light generation system 11 shown in FIG. 2. FIG. 4 omits to illustrate components accompanying the chamber 2, such as the EUV collector mirror 23 and the target sensor 4. FIG. 4 also omits to specifically illustrate the structures of the focusing optics 22a and the target generation unit 26.

4.3.1 Adjustment of Positions of Irradiation with the Pulse Laser Beams

A target 27 may move in the direction of an arrow Y during a period of time from a timing when the target 27 is irradiated with the first pre-pulse laser beam P1 to a timing when the target 27 is irradiated with the second pre-pulse laser beam P2. If the period of time from the timing when the target 27 is irradiated with the first pre-pulse laser beam P1 to the timing when the target 27 is irradiated with the second pre-pulse laser beam P2 is relatively long as shown in FIG. 3, the target 27 may move a long distance.

Considering the above, the first pre-pulse laser beam P1 may preferably have its beam path axis substantially intersecting with the trajectory of the target 27 upstream of the plasma generation region 25 against the direction in which the target 27 moves. Further, the second pre-pulse laser beam P2 and the main pulse laser beam M may preferably have their beam path axes passing through the plasma generation region 25.

The speed of a target 27 reaching the vicinity of the plasma generation region 25 may for example be 100 m/s. A delay time from the timing when a target 27 is irradiated with the first pre-pulse laser beam P1 to the timing when the target 27 is irradiated with the second pre-pulse laser beam P2 may for example be 2.0 µs. In this case, the first pre-pulse laser beam P1 may have its beam path axis intersecting with the trajectory of the target 27 at a position shifted 200 µm upstream of the plasma generation region 25 against the direction in which the target 27 moves.

As shown in FIG. 4, the high reflection mirror 340 is disposed at a position that is in the beam path of the first pre-pulse laser beam P1 and that is out of the beam path of the second pre-pulse laser beam P2 and the beam path of the main pulse laser beam M. An actuator 365 may be attached to the holder 345 of the high reflection mirror 340, and the EUV light generation controller 5 may control the actuator 365 so that the posture of the high reflection mirror 340 may be adjusted. With this configuration, the direction in which the first pre-pulse laser beam P1 travels may be controlled so that the first pre-pulse laser beam P1 intersects with the trajectory of a target at a desired position in the vicinity of the plasma generation region 25.

For a change in delay time from the timing when a target 27 is irradiated with the first pre-pulse laser beam P1 to the timing when the target 27 is irradiated with the second pre-pulse laser beam P2 or in the event of a change in speed of a target 27, the posture of the high reflection mirror 340 may be further adjusted.

The present disclosure is not limited to a case where an actuator is attached to the high reflection mirror 340, although FIG. 4 illustrates such a case. Alternatively, an actuator may be attached to a high reflection mirror (not shown) provided in the beam path of the second pre-pulse laser beam P2 or the high reflection mirror 341.

4.3.2 Focusing Diameters of the Pulse Laser Beams

During the period of time from the timing when the target 27 is irradiated with the first pre-pulse laser beam P1 to the timing when the target 27 is irradiated with the second pre-pulse laser beam P2, the target 27, which has been broken up, may be diffused to form the secondary target. If the period of time from the timing when the target 27 is irradiated with the first pre-pulse laser beam P1 to the timing when the target 27 is irradiated with the second pre-pulse laser beam P2 is relatively long as shown in FIG. 3, the secondary target may have a large dispersion diameter.

Preferably, the focusing diameter of the first pre-pulse laser beam P1 may be substantially equal to or slightly larger than the diameter of a target 27. Further, preferably, the focusing diameter of the second pre-pulse laser beam P2 may be substantially equal to or slightly larger than the dispersion diameter of a target 27 diffused by being irradiated with the first pre-pulse laser beam P1. The focusing diameter of the main pulse laser beam M may be substantially equal to the focusing diameter of the second pre-pulse laser beam P2. Therefore, the focusing diameter of the first pre-pulse laser beam P1 may preferably be smaller than the focusing diameter of each of the second pre-pulse laser beam P2 and the focusing diameter of the main pulse laser beam M.

It may be assumed here that a pulse laser beam having a plane wave is focused on a target at a beam waist of the pulse laser beam focused by the focusing optics 22a.

If a plane-wave laser beam enters a focusing optics and the beam is focused, a focusing diameter D at the beam waist may be represented by the following approximate expression:

$$D \approx 4F \cdot \lambda \cdot M^2 / (\pi \cdot B),$$

where F may be the focal length of the focusing optics, $\lambda$ may be the wavelength of the laser beam, $M^2$ may be a value that indicates how close the beam is to being a single-transverse-mode beam, which in turn determines how small a beam waist may be focused, and B may be the beam diameter of the laser beam entering the focusing optics.

As indicated by the approximate expression, the focusing diameter D of the laser beam may be proportional to the wavelength $\lambda$ of the laser beam and inversely proportional to the beam diameter B of the laser beam.

Considering the above, the first pre-pulse laser beam P1 may have a wavelength shorter than the wavelength of the main pulse laser beam M. In this case, assuming for example that the beam diameter of the first pre-pulse laser beam P1 and the beam diameter of the main pulse laser beam M are substantially equal to each other, the focusing diameter of the first pre-pulse laser beam P1 may be smaller than the focusing diameter of the main pulse laser beam M.

Further, the first pre-pulse laser beam P1 may have a beam diameter larger than the beam diameter of the second pre-pulse laser beam P2. In this case, assuming for example that the wavelength of the first pre-pulse laser beam P1 and the wavelength of the second pre-pulse laser beam P2 are substantially equal to each other, the focusing diameter of the first pre-pulse laser beam P1 may be smaller than the focusing diameter of the second pre-pulse laser beam P2.

In the first embodiment, a pulse laser beam having a wavelength of 1.06 µm outputted from the first YAG laser apparatus La1 may be used as the first pre-pulse laser beam P1. Similarly, a pulse laser beam having a wavelength of 1.06 µm outputted from the second YAG laser apparatus La1 may be used as the second pre-pulse laser beam P2. Furthermore, a pulse laser beam having a wavelength of 10.6 µm outputted from the $CO_2$ laser apparatus Lb may be used as the main pulse laser beam M.

Further, as shown in FIG. 4, a first beam expander 361 may be disposed at a position that is in the beam path of the first pre-pulse laser beam P1 and that is out of the beam path of the second pre-pulse laser beam P2 and the beam path of the main pulse laser beam M. A second beam expander 362 may be disposed at a position that is in the beam path of the second pre-pulse laser beam P2 and that is out of the beam path of the first pre-pulse laser beam P1 and the beam path of the main pulse laser beam M. A third beam expander 363 may be disposed at a position that is in the beam path of the main pulse laser beam M and that is out of the beam path of the first pre-pulse laser beam P1 and the beam path of the second pre-pulse laser beam P2.

The first beam expander 361, the second beam expander 362, and the third beam expander 363 may each include a spherical concave lens and a spherical convex lens. Alternatively, the third beam expander 363 may include a spherical concave mirror and a spherical convex mirror to withstand a high thermal load.

Moreover, the first to third beam expanders 361 to 363 may control the respective beam diameters so that the beam diameter of the first pre-pulse laser beam P1 and the beam diameter of the main pulse laser beam M are larger than the beam diameter of the second pre-pulse laser beam P2.

According to the above-described configuration, the focusing diameter of the first pre-pulse laser beam P1 may be made to be smaller than the focusing diameter of the second pre-pulse laser beam P2 and the focusing diameter of the main pulse laser beam M.

For example, it may be assumed that the focusing optics 22a has a focal length F of 200 mm. Further, it may be assumed that $M^2$ takes on a value of 1 for the first pre-pulse laser beam P1, the second pre-pulse laser beam P2, and the main pulse laser beam M. According to the foregoing approximate expression, a beam diameter B for obtaining a desired focusing diameter D may be calculated as follows:

In order for the first pre-pulse laser beam P1 to have a focusing diameter D of 70 μm with a wavelength 1 of 1.06 μm, the beam diameter B of the first pre-pulse laser beam P1 entering the focusing optics 22a may be calculated to be approximately 3.9 mm.

In order for the second pre-pulse laser beam P2 to have a focusing diameter D of 300 μm with a wavelength λ of 1.06 μm, the beam diameter B of the second pre-pulse laser beam P2 entering the focusing optics 22a may be calculated to be approximately 0.9 mm.

In order for the main pulse laser beam M to have a focusing diameter D of 300 μm with a wavelength λ of 10.6 μm, the beam diameter B of the main pulse laser beam M entering the focusing optics 22a may be calculated to be approximately 9.0 mm.

4.4 Second Example of the Laser Optics

Figure 5:
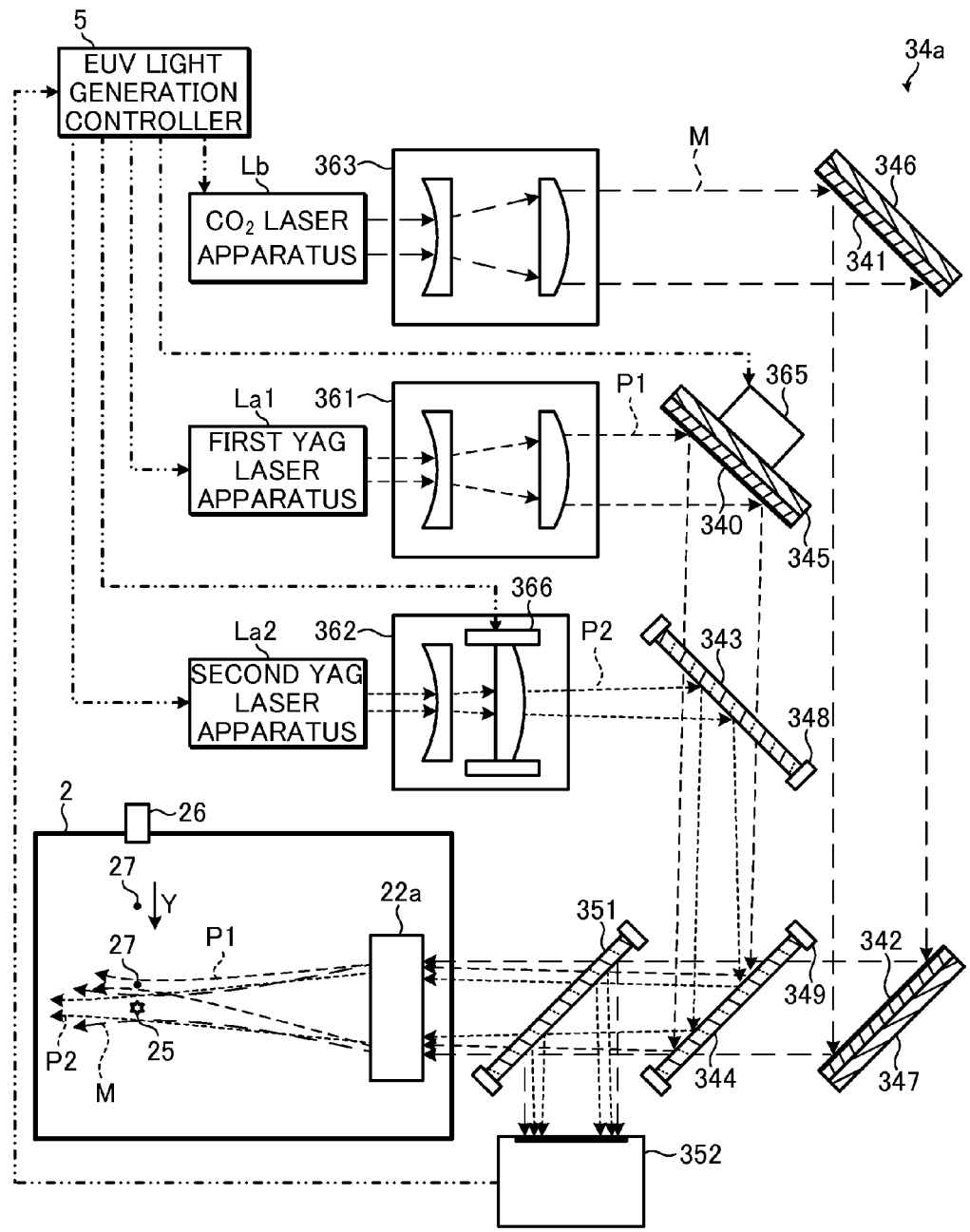
FIG. 5 schematically illustrates a second configuration example of the laser beam direction control unit and the components therearound in the EUV light generation system shown in FIG. 2.

FIG. 5 schematically illustrates a second configuration example of the laser beam direction control unit 34a and the components thereareound in the EUV light generation system 11 shown in FIG. 2. FIG. 5 omits to illustrate the components accompanying the chamber 2, such as the EUV collector mirror 23 and the target sensor 4. FIG. 5 also omits to specifically illustrate the structures of the focusing optics 22a and the target generation unit 26.

The configuration example shown in FIG. 5 differs from that shown in FIG. 4 in that the second beam expander 362 is provided with an actuator 366 for controlling the wavefront and beam diameter of the second pre-pulse laser beam P2. The other points are the same as those of the configuration example shown in FIG. 4 and, as such, are not described in detail.

The actuator 366 shown in FIG. 5 may be attached to the spherical convex lens of the second beam expander 362. The EUV light generation controller 5 may control the actuator 366 so that the distance between the spherical convex and concave lenses of the second beam expander 362 may increase and decrease. This may cause the second pre-pulse laser beam P2 to have a wavefront with a curvature other than that of a plane wave, thus making it possible to change the distance from the focusing optics 22a to the beam waist of the second pre-pulse laser beam P2.

FIG. 5 illustrates an example where the second pre-pulse laser beam P2, outputted from the second beam expander 362, takes the form of a wave having a convex wavefront, i.e. a convex wave. In this case, the distance from the focusing optics 22a to the beam waist of the second pre-pulse laser beam P2 may be longer than the focal length of the focusing optics 22a. Furthermore, in FIG. 5, the beam diameter of the second pre-pulse laser beam P2 at the position of entering the focusing optics 22a is larger than the beam diameter of the second pre-pulse laser beam P2 in FIG. 4. By thus controlling the wavefront and beam diameter of the second pre-pulse laser beam P2, the beam diameter of the second pre-pulse laser beam P2 in the plasma generation region 25 may be controlled.

The present disclosure is not limited to a case where an actuator is attached to the second beam expander 362, although FIG. 5 illustrates such a case. Alternatively, an actuator may be attached to the first beam expander 361 or the third beam expander 363.

4.5 Third Example of the Laser Optics

Figure 6:
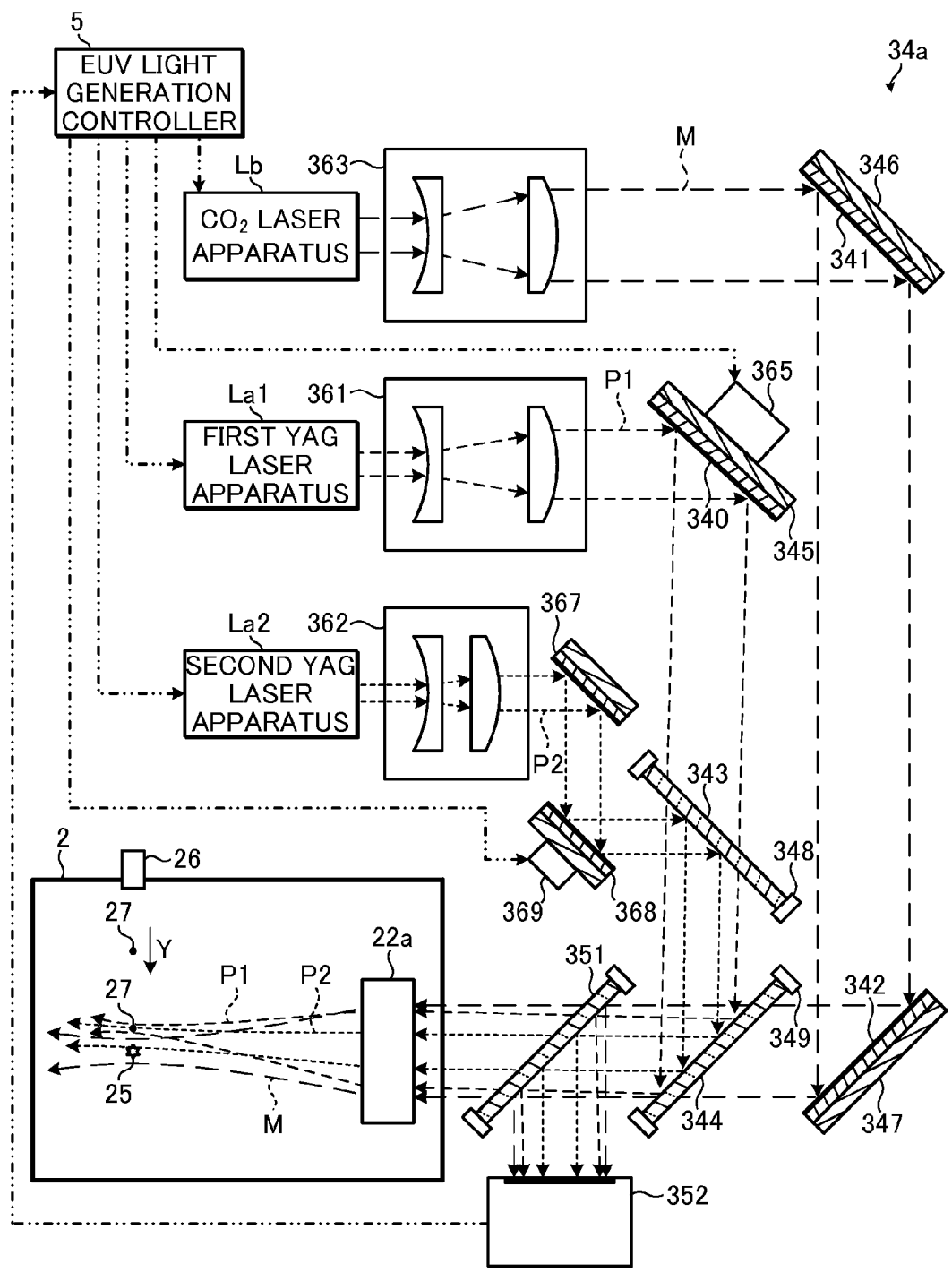
FIG. 6 schematically illustrates a third configuration example of the laser beam direction control unit and the components therearound in the EUV light generation system shown in FIG. 2.

FIG. 6 schematically illustrates a third configuration example of the laser beam direction control unit 34a and the components thereareound in the EUV light generation system 11 shown in FIG. 2. FIG. 6 omits to illustrate the components accompanying the chamber 2, such as the EUV collector mirror 23 and the target sensor 4. FIG. 6 also omits to specifically illustrate the structures of the focusing optics 22a and the target generation unit 26.

The configuration example shown in FIG. 6 differs from that shown in FIG. 4 in that a beam path adjuster is provided which includes high reflection mirrors 367 and 368 and an actuator 369 attached to a holder of the high reflection mirror 368. The other points are the same as those of the configuration example shown in FIG. 4 and, as such, are not described in detail. The beam path adjuster may be provided at a position that is in the beam path of the second pre-pulse laser beam P2 and that is out of the beam path of the first pre-pulse laser beam P1 and the beam path of the main pulse laser beam M.

As shown in FIG. 6, the high reflection mirror 367 may be disposed in the beam path of the second pre-pulse laser beam P2 between the second beam expander 362 and the beam combiner 343. The high reflection mirror 367 may reflect the second pre-pulse laser beam P2 at high reflectance. The high reflection mirror 368 may be disposed in the beam path of the second pre-pulse laser beam P2 between the high reflection mirror 367 and the beam combiner 343. The high reflection mirror 368 may reflect the second pre-pulse laser beam P2 at high reflectance toward the beam combiner 343.

The EUV light generation controller 5 may control the actuator 369 so that the posture of the high reflection mirror 368 may be adjusted. With this configuration, the traveling direction of the second pre-pulse laser beam P2 may be controlled. The beam path axis of the second pre-pulse laser beam P2 may intersect with the trajectory of a target 27 at a predetermined position. The predetermined position may be located between the plasma generation region 25 and a position where the beam path axis of the first pre-pulse laser beam P1 and the trajectory of the target 27 intersect.

5. EUV LIGHT GENERATION SYSTEM IN WHICH TWO TRIGGER SIGNALS ARE INPUTTED TO A CO₂ LASER APPARATUS

5.1 Configuration

Figure 7:
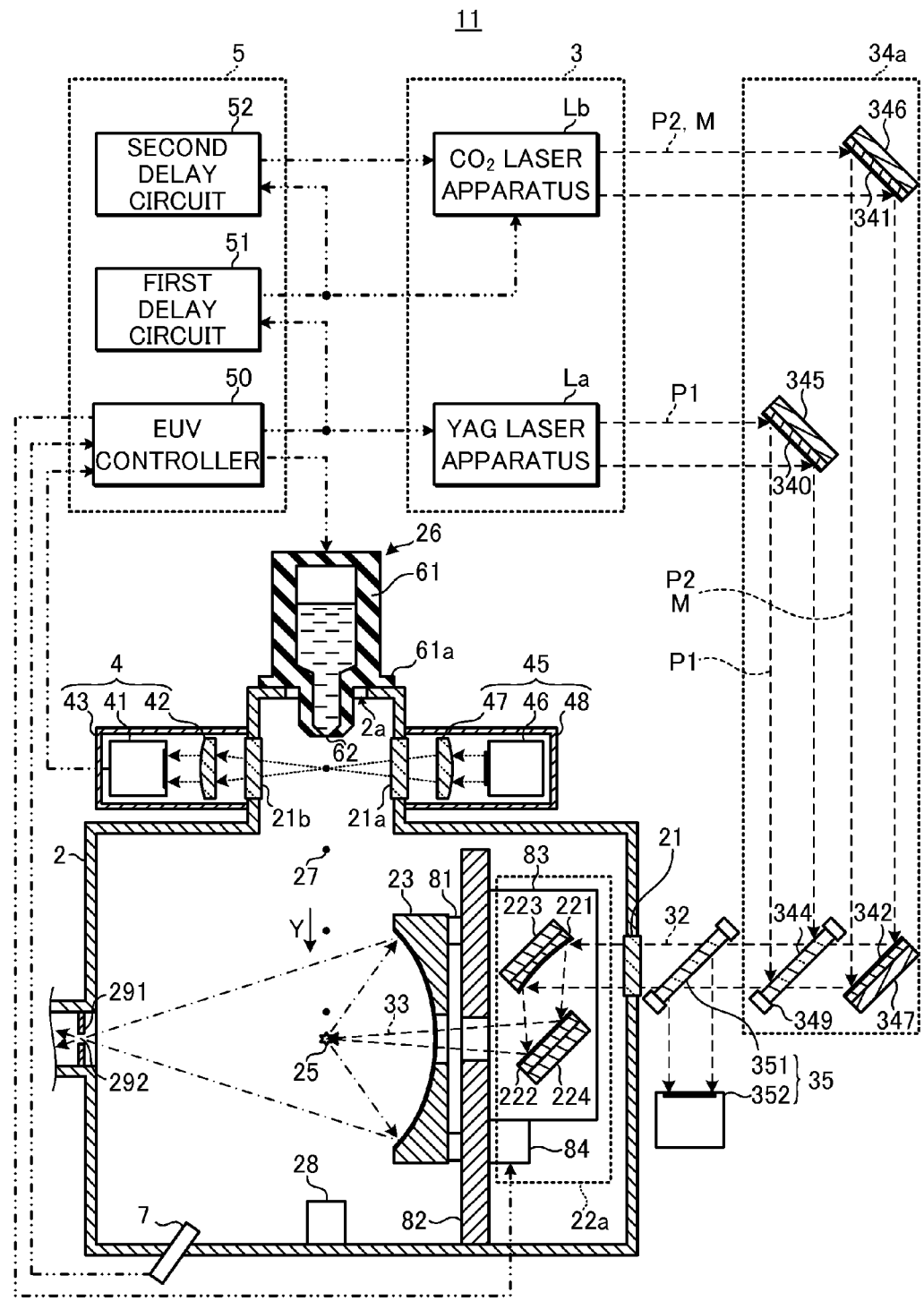
FIG. 7 is a partial cross-sectional view showing a configuration of an EUV light generation system according to a second embodiment.

FIG. 7 is a partial cross-sectional view showing a configuration of an EUV light generation system 11 according to a second embodiment. The second embodiment shown in FIG. 7 differs from the first embodiment shown in FIG. 2 in that the laser system 3 includes a single YAG laser apparatus La and a single $CO_2$ laser apparatus Lb. Furthermore, the second embodiment differs from the first embodiment in that a second trigger signal from the first delay circuit 51 and a third trigger signal from the second delay circuit 52 are inputted to the $CO_2$ laser apparatus Lb. The beam combiner 343 in the first embodiment may be eliminated.

5.2 Operation

The EUV controller 50 may output, to the YAG laser apparatus La and to the first delay circuit 51, a first trigger signal on the basis of a target detection signal. The YAG laser apparatus La may output the first pre-pulse laser beam P1 in accordance with the first trigger signal.

The first delay circuit 51 may receive the first trigger signal. The first delay circuit 51 may output, to the $CO_2$ laser apparatus Lb and to the second delay circuit 52, a second trigger signal indicating that a first delay time has elapsed since the timing of reception of the first trigger signal. The $CO_2$ laser apparatus Lb may output the second pre-pulse laser beam P2 in accordance with the second trigger signal.

The second delay circuit 52 may receive the second trigger signal. The second delay circuit 52 may output, to the $CO_2$ laser apparatus Lb, a third trigger signal indicating that a second delay time has elapsed since the timing of reception of the second trigger signal.

Alternatively, the EUV controller 50 may output the first trigger signal, also to the second delay circuit 52. Upon receiving the first trigger signal, the second delay circuit 52 may output, to the $CO_2$ laser apparatus Lb, a third trigger signal indicating that the first and second delay times have elapsed since the timing of reception of the first trigger signal.

The $CO_2$ laser apparatus Lb may output the main pulse laser beam M in accordance with the third trigger signal.

In this manner, the laser system 3 may output the first pre-pulse laser beam P1, the second pre-pulse laser beam P2, and the main pulse laser beam M in this order.

Figure 8:
FIG. 8 is a waveform chart showing an example of a laser beam reception signal in the second embodiment.

FIG. 8 is a waveform chart showing an example of a laser beam reception signal in the second embodiment. In FIG. 8, the horizontal axis may represent time t, and the vertical axis may represent light intensity I. The pulse laser beam 32 that the optical sensor 352 receives may include the first pre-pulse laser beam P1, the second pre-pulse laser beam P2, and the main pulse laser beam M. The first pre-pulse laser beam P1, the second pre-pulse laser beam P2, and the main pulse laser beam M may be incident on the optical sensor 352 in this order. Pulse energy of the main pulse laser beam M may be greater than pulse energy of each of the first and second pre-pulse laser beams P1 and P2.

5.3 Example of Laser Optics

Figure 9:
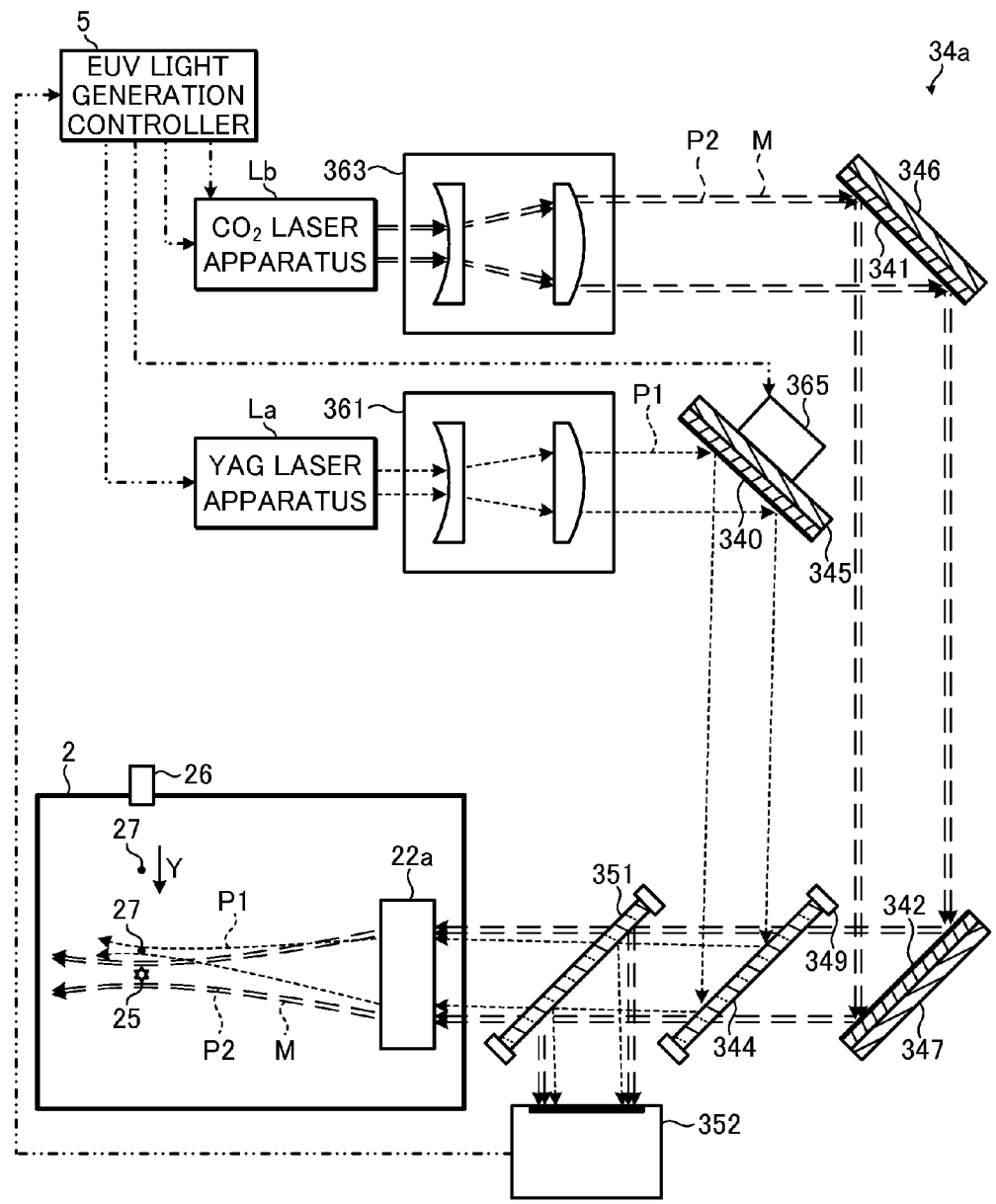
FIG. 9 schematically illustrates a configuration example of a laser beam direction control unit and components therearound in the EUV light generation system shown in FIG. 7.

FIG. 9 schematically illustrates a configuration example of the laser beam direction control unit 34a and components therearound in the EUV light generation system 11 shown in FIG. 7. FIG. 9 omits to illustrate components accompanying the chamber 2, such as the EUV collector mirror 23 and the target sensor 4. FIG. 9 also omits to specifically illustrate the structures of the focusing optics 22a and the target generation unit 26.

As shown in FIG. 9, the first pre-pulse laser beam P1 outputted from the YAG laser apparatus La may be reflected by the high reflection mirror 340 and the beam combiner 344 and enter the focusing optics 22a. The second pre-pulse laser beam P2 and the main pulse laser beam M outputted from the $CO_2$ laser apparatus Lb may be reflected by the high reflection mirrors 341 and 342 and enter the focusing optics 22a.

As shown in FIG. 8, a period of time from a timing when a target 27 is irradiated with the second pre-pulse laser beam P2 to a timing when the target 27 is irradiated with the main pulse laser beam M may be shorter than a period of time from the timing when the target 27 is irradiated with the first pre-pulse laser beam P1 to a timing when the target 27 is irradiated with the second pre-pulse laser beam P2. For this reason, during the period of time from the timing when the target 27 is irradiated with the second pre-pulse laser beam P2 to the timing when the target 27 is irradiated with the main pulse laser beam M, target movement distance and target diffusion diameter growth may be small.

Therefore, the second pre-pulse laser beam P2 and the main pulse laser beam M may have substantially the same wavelengths with each other and substantially the same beam diameters with each other. With this configuration, the second pre-pulse laser beam P2 and the main pulse laser beam M may be focused into substantially the same focusing diameters with each other by the focusing optics 22a. Further, the beam path axis of the second pre-pulse laser beam P2 and the beam path axis of the main pulse laser beam M from the focusing optics 22a to the plasma generation region 25 may be substantially the same with each other.

The other points may be the same as those of the first embodiment.

Figure 10:
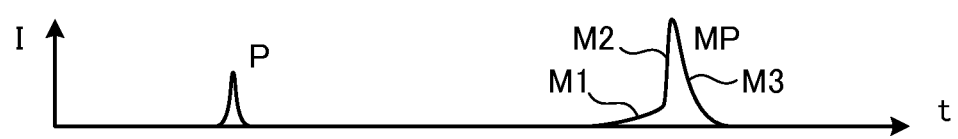
FIG. 10 is a waveform chart showing another example of the laser beam reception signal in the second embodiment.

5.4 Variation of a Pulse Waveform of a Pulse Laser Beam from the $CO_2$ Laser Apparatus FIG. 10 is a waveform chart showing another example of a laser beam reception signal in the second embodiment. In FIG. 10, the horizontal axis may represent time t, and the vertical axis may represent light intensity I. The pulse laser beam 32 that the optical sensor 352 receives may include a pre-pulse laser beam P and a main pulse laser beam MP. The pre-pulse laser beam P and the main pulse laser beam MP may be incident on the optical sensor 352 in this order. Pulse energy of the main pulse laser beam MP may be greater than pulse energy of the pre-pulse laser beam P.

As with the first pre-pulse laser beam P1 shown in FIG. 8, the pre-pulse laser beam P may be outputted from the YAG laser apparatus La.

The main pulse laser beam MP may be outputted from the $CO_2$ laser apparatus Lb. The second pre-pulse laser beam P2 shown in FIG. 8 does not need to be outputted. The pulse waveform of the main pulse laser beam MP as shown in FIG. 10 may include a first stage M1 in which light intensity is low and gently increases, a second stage M2 in which the light intensity steeply increases after the first stage M1, and a third stage M3 in which the light intensity decreases after the second stage M2. That is, the rate of increase in light intensity in the second stage M2 may be higher than the rate of increase in light intensity in the first stage M1.

5.5 First Configuration Example of the $CO_2$ Laser Apparatus to which Two Trigger Signals are Inputted FIG. 11A schematically illustrates a first configuration example of the $CO_2$ laser apparatus Lb in the second embodiment. In the second embodiment, the $CO_2$ laser apparatus Lb may include first and second master oscillators MO1 and MO2, a $CO_2$ laser controller 391, a beam combiner 399, and first to third amplifiers PA1 to PA3.

The first master oscillator MO1 may output a first seed laser beam in accordance with a second trigger signal outputted from the $CO_2$ laser controller 391. The second master oscillator MO2 may output a second seed laser beam in accordance with a third trigger signal outputted from the $CO_2$ laser controller 391. The beam combiner 399 may combine beam paths of the seed laser beams respectively from the first and second master oscillators MO1 and MO2 and output the seed laser beams toward the first amplifier PA1. The beam combiner 399 may be constituted by a half mirror or a grating.

The present disclosure is not limited to the illustrated embodiment. The beam combiner 399 may be replaced by a beam splitter (not shown) disposed in a beam path between amplifiers (i.e. between the amplifiers PA1 and PA2 or between the amplifiers PA2 and PA3). In this case, the beam splitter may combine a pulse laser beam outputted from the second master oscillator MO2 having passed through at least the first amplifier PA1 and a pulse laser beam outputted from the first master oscillator MO1.

FIG. 11B is a graph showing a first example of a pulse waveform of the first seed laser beam that is outputted from the first master oscillator MO1. FIG. 11C is a graph showing a first example of a pulse waveform of the second seed laser beam that is outputted from the second master oscillator MO2. The first seed laser beam that is outputted from the first master oscillator MO1 may have a lower peak intensity than the second seed laser beam that is outputted from the second master oscillator MO2. The second seed laser beam that is outputted from the second master oscillator MO2 may have a constant delay relative to the first seed laser beam that is outputted from the first master oscillator MO1.

FIG. 11D is a graph showing a first example of a pulse waveform of a pulse laser beam that is outputted from the beam combiner 399. FIG. 11E is a graph showing a first example of a pulse waveform of a pulse laser beam that is outputted from the $CO_2$ laser apparatus Lb. By combining the beam paths of the seed laser beams respectively outputted from the first and second master oscillators MO1 and MO2, the beam combiner 399 may output a pulse laser beam having such a pulse waveform as that shown in FIG. 11D. By amplifying this pulse laser beam, the $CO_2$ laser apparatus Lb may output the second pre-pulse laser beam P2, which is outputted first, and the main pulse laser beam M, which is outputted after the second pre-pulse laser beam P2.

FIG. 11F is a graph showing a second example of the pulse waveform of the first seed laser beam that is outputted from the first master oscillator MO1. FIG. 11G is a graph showing a second example of the pulse waveform of the second seed laser beam that is outputted from the second master oscillator MO2. The pulse waveforms shown in FIGS. 11F and 11G may be similar to those shown in FIGS. 11B and 11C, respectively. Note, however, that a time lag between the second seed laser beam that is outputted from the second master oscillator MO2 and the first seed laser beam that is outputted from the first master oscillator MO1 in FIGS. 11F and 11G may be smaller than that in FIGS. 11B and 11C. Further, the first seed laser beam shown in FIG. 11F that is outputted from the first master oscillator MO1 may have a pulse waveform having a longer pulse duration than the first seed laser beam shown in FIG. 11B.

FIG. 11H is a graph showing a second example of the pulse waveform of the pulse laser beam that is outputted from the beam combiner 399. FIG. 11I is a graph showing a second example of the pulse waveform of the pulse laser beam that is outputted from the $CO_2$ laser apparatus Lb. By combining the beam paths of the seed laser beams respectively outputted from the first and second master oscillators MO1 and MO2, the beam combiner 399 may output a pulse laser beam having such a pulse waveform as that shown in FIG. 11H. By being amplified, this pulse laser beam may form a main pulse laser beam MP including a first stage in which light intensity is low and gently increases, a second stage in which the light intensity steeply increases after the first stage and reaches a peak value, and a third stage in which the light intensity decreases after the second stage.

Figure 12A:
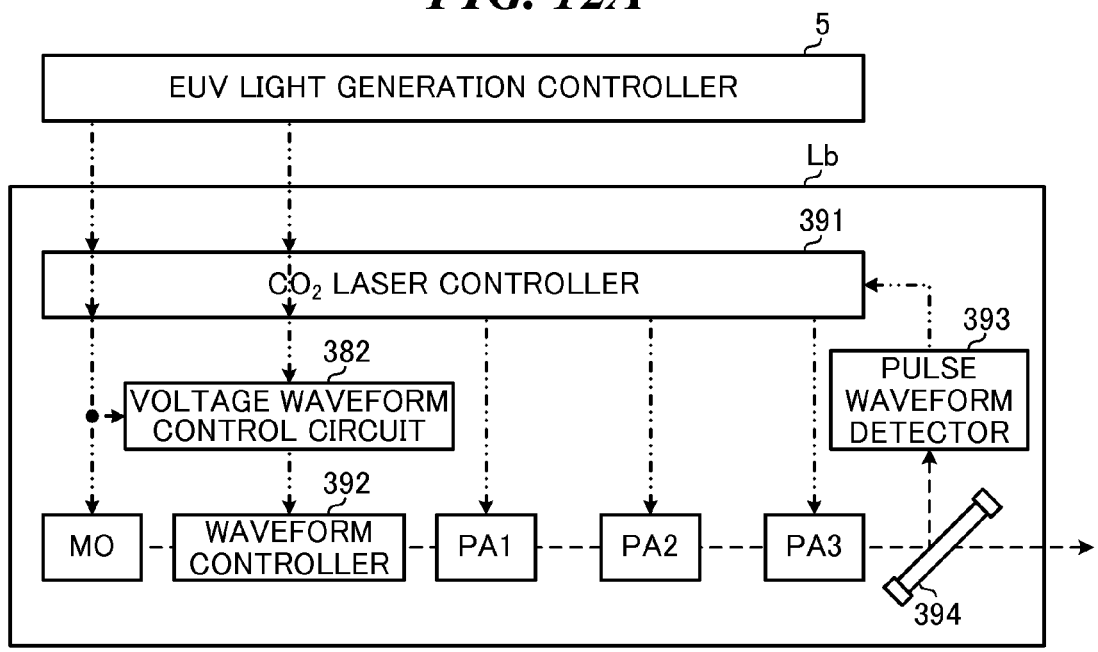
FIG. 12A schematically illustrates a second configuration example of the $CO_2$ laser apparatus in the second embodiment.

5.6 Second Configuration Example of the $CO_2$ Laser Apparatus to which Two Trigger Signals are Inputted FIG. 12A schematically illustrates a second configuration example of the $CO_2$ laser apparatus Lb in the second embodiment. In the second configuration example, the $CO_2$ laser apparatus Lb may include a waveform controller 392, a beam splitter 394, a pulse waveform detector 393, and a voltage waveform control circuit 382.

The waveform controller 392 may be disposed in a beam path of a pulse laser beam between a master oscillator MO and the amplifier PA1. The beam splitter 394 may be disposed in a beam path of a pulse laser beam that is outputted from the amplifier PA3. The pulse waveform detector 393 may be disposed in one of two beam paths split by the beam splitter 394. The pulse waveform detector 393 may detect a waveform of the pulse laser beam that is outputted from the third amplifier PA3 and output a detection result to the $CO_2$ laser controller 391 for feedback control.

Figure 12B:
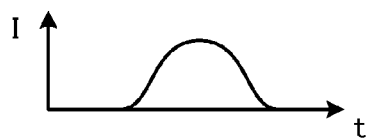
FIG. 12B is a graph showing a first example of a pulse waveform of a pulse laser beam that is outputted from a master oscillator.

FIG. 12B is a graph showing a first example of a pulse waveform of a pulse laser beam that is outputted from the master oscillator MO. FIG. 12C is a graph showing a first example of a voltage waveform that is outputted from the voltage waveform control circuit 382. FIG. 12D is a graph showing a first example of a pulse waveform of a pulse laser beam that is outputted from the waveform controller 392. FIG. 12E is a graph showing a first example of a pulse waveform of the pulse laser beam that is outputted from the third amplifier PA3. The master oscillator MO may output the pulse laser beam in accordance with the second trigger signal outputted from the $CO_2$ laser controller 391.

As shown in FIG. 12B, the pulse waveform of the pulse laser beam that is outputted from the master oscillator MO may be a pulse waveform of a length including a period of time from the beginning of a pulse waveform of the second pre-pulse laser beam P2 to the end of a pulse waveform of the main pulse laser beam M.

The voltage waveform control circuit 382 may generate such a voltage waveform as that shown in FIG. 12C in accordance with the second and third trigger signals outputted from the $CO_2$ laser controller 391. The voltage waveform shown in FIG. 12C may have first and second peaks respectively corresponding to the timings of the second and third trigger signals.

The waveform controller 392 may adjust the pulse waveform of the pulse laser beam outputted from the master oscillator MO. For example, upon receiving a pulse laser beam having the pulse waveform shown in FIG. 12B and the voltage waveform shown in FIG. 12C, the waveform controller 392 may output a pulse laser beam having the pulse waveform shown in FIG. 12D. By amplifying this pulse laser beam, the $CO_2$ laser apparatus Lb may output the second pre-pulse laser beam P2, which is outputted first, and the main pulse laser beam M, which is outputted after the second pre-pulse laser beam P2.

Figure 12F:
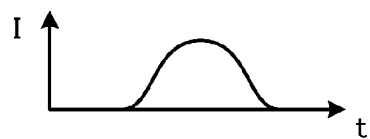
FIG. 12F is a graph showing a second example of the pulse waveform of the pulse laser beam that is outputted from the master oscillator.
Figure 12C:
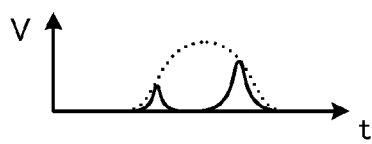
FIG. 12C is a graph showing a first example of a voltage waveform that is outputted from a voltage waveform control circuit.
Figure 12G:
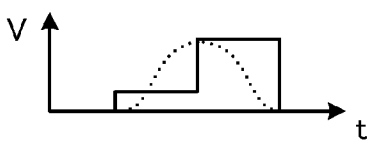
FIG. 12G is a graph showing a second example of the voltage waveform that is outputted from the voltage waveform control circuit.
Figure 12D:
FIG. 12D is a graph showing a first example of a pulse waveform of a pulse laser beam that is outputted from a waveform controller.
Figure 12H:
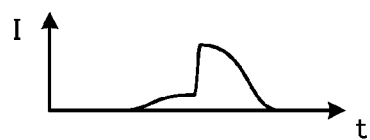
FIG. 12H is a graph showing a second example of the pulse waveform of the pulse laser beam that is outputted from the waveform controller.
Figure 12E:
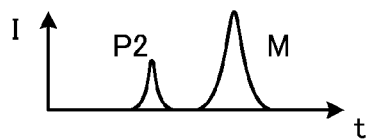
FIG. 12E is a graph showing a first example of a pulse waveform of a pulse laser beam that is outputted from a third amplifier.
Figure 12I:
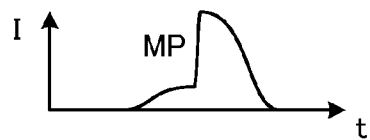
FIG. 12I is a graph showing a second example of the pulse waveform of the pulse laser beam that is outputted from the third amplifier.

FIG. 12F is a graph showing a second example of the pulse waveform of the pulse laser beam that is outputted from the master oscillator MO. FIG. 12G is a graph showing a second example of the voltage waveform that is outputted from the voltage waveform control circuit 382. FIG. 12H is a graph showing a second example of the pulse waveform of the pulse laser beam that is outputted from the waveform controller 392. FIG. 12I is a graph showing a second example of the pulse waveform of the pulse laser beam that is outputted from the third amplifier PA3.

As shown in FIG. 12F, the pulse waveform of the pulse laser beam that is outputted from the master oscillator MO may be a pulse waveform of a length including a period of time from the beginning of the first stage of the main pulse laser beam MP to the end of the third stage of the main pulse laser beam MP.

The voltage waveform shown in FIG. 12G may be a waveform that has a comparatively low voltage in a first half thereof and has a comparatively high voltage in a second half thereof. The timing of transition from the first half of the voltage waveform to the second half of the voltage waveform may be coincide with the timing of input of the third trigger signal to the voltage waveform control circuit 382.

The waveform controller 392 may adjust the pulse waveform of the pulse laser beam outputted from the master oscillator MO. For example, upon receiving a pulse laser beam having the pulse waveform shown in FIG. 12F and the voltage waveform shown in FIG. 12G, the waveform controller 392 may output a pulse laser beam having the pulse waveform shown in FIG. 12H. By amplifying this pulse laser beam, the $CO_2$ laser apparatus Lb may output a main pulse laser beam MP including a first stage in which light intensity is low and gently increases, a second stage in which the light intensity steeply increases after the first stage and reaches a peak value, and a third stage in which the light intensity decreases after the second stage.

Figure 13:
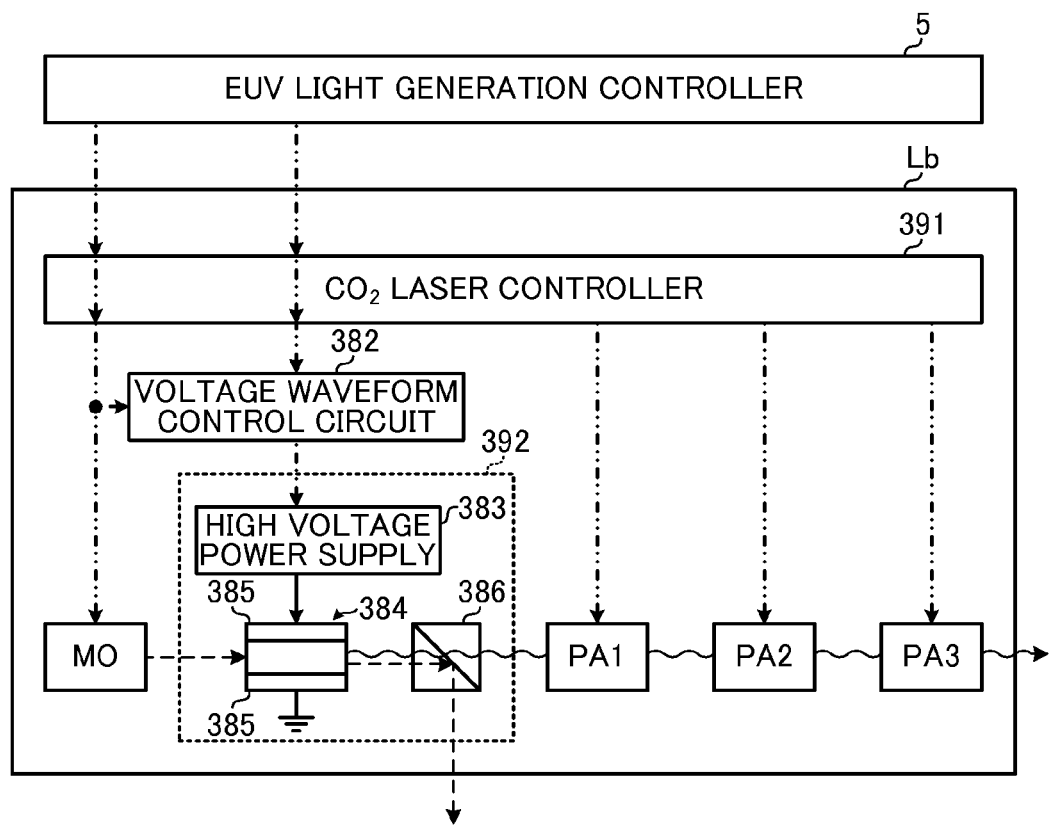
FIG. 13 schematically illustrates a configuration example of the $CO_2$ laser apparatus shown in FIG. 12A.

FIG. 13 schematically illustrates a configuration example of the $CO_2$ laser apparatus Lb shown in FIG. 12A. FIG. 13 omits to illustrate the beam splitter 394 and the pulse waveform detector 393. The waveform controller 392 shown in FIG. 12A may include a high voltage power supply 383, a Pockels cell 384, and a polarizer 386.

The Pockels cell 384 may include a pair of electrodes 385 positioned at both surfaces of the electro-optic crystal. The pulse laser beam that is outputted from the master oscillator MO may be linearly polarized in a direction perpendicular to the paper plane. The pulse laser beam outputted from the master oscillator MO may be transmitted through the electro-optic crystal between the pair of electrodes 385. The Pockels cell 384, when a given voltage is applied between the pair of electrodes 385, may transmit the pulse laser beam as rotating the polarization direction by 90 degrees. The Pockels cell 384, when the voltage is not applied between the pair of electrodes 385, may transmit the pulse laser beam without rotating the polarization direction.

The polarizer 386 may transmit a pulse laser beam linearly polarized in the direction parallel to the paper plane at high transmittance toward the amplifier PA1. The polarizer 386 may reflect a pulse laser beam linearly polarized in a direction perpendicular to the paper plane at high reflectance toward a laser damper (not shown).

The $CO_2$ laser controller 391 may output the second trigger signal to the master oscillator MO and output the third trigger signal to the voltage waveform control circuit 382. The master oscillator MO may output a pulse laser beam in response to the second trigger signal that is outputted from the $CO_2$ laser controller 391. The voltage waveform control circuit 382 may generate a voltage waveform in response to the third trigger signal outputted from the $CO_2$ laser controller 391 and supply this voltage waveform to the high voltage power supply 383. This voltage waveform may be the one shown in FIG. 12C or 12G. The high voltage power supply 383 may generate pulse voltage based on the voltage waveform and apply this pulse voltage to the pair of electrodes 385 of the Pockels cell 384.

When voltage having the voltage waveform shown in FIG. 12C or 12G is applied to the Pockels cell 384, polarization components of a pulse laser beam transmitted through the Pockels cell 384 may be changed in response to the voltage. In this manner, the waveform of a pulse laser beam that is outputted from the waveform controller 392 may be controlled according to a voltage waveform that the voltage waveform control circuit 382 generates.

Figure 14:
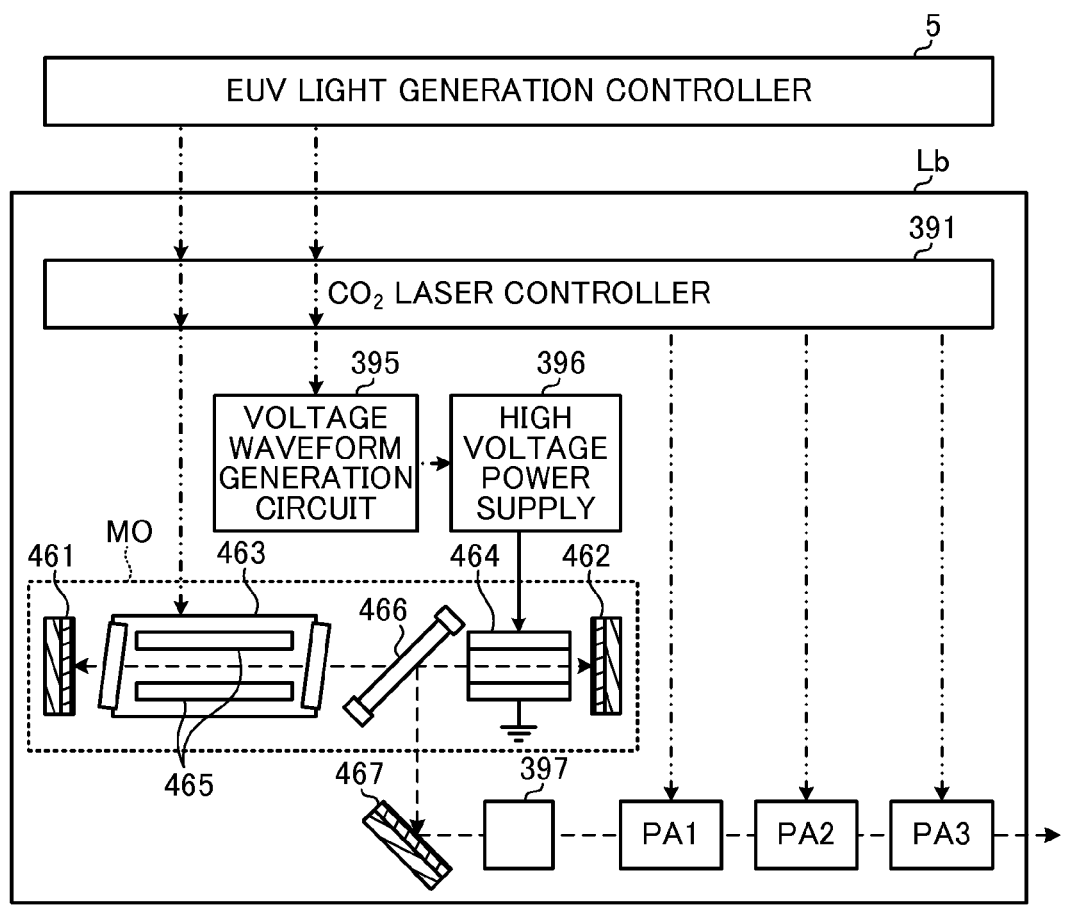
FIG. 14 schematically illustrates a third configuration example of the $CO_2$ laser apparatus in the second embodiment.

5.7 Third Configuration Example of the $CO_2$ Laser Apparatus to which Two Trigger Signals are Inputted FIG. 14 schematically illustrates a third configuration example of the $CO_2$ laser apparatus Lb in the second embodiment. In the third configuration example, the $CO_2$ laser apparatus Lb may include, between the master oscillator MO and the amplifier PA1, a high reflection mirror 467 and a saturable absorber cell 397. Further, the $CO_2$ laser apparatus Lb may include a voltage waveform generation circuit 395 and a high voltage power supply 396.

The master oscillator MO of the $CO_2$ laser apparatus Lb may include an optical resonator including high reflection mirrors 461 and 462. In the optical resonator, a laser chamber 463, a polarizer 466, and a Pockels cell 464 may be provided in this order from the side of the high reflection mirror 461. In the laser chamber 463, a pair of electrodes 465 may be disposed, and a $CO_2$ gas may be contained as a laser medium.

The master oscillator MO may excite the laser medium in the laser chamber 463 by generating electric discharge between the pair of electrodes 465. A laser beam may be amplified by traveling back and forth between the high reflection mirrors 461 and 462. The laser beam traveling back and forth between the high reflection mirrors 461 and 462 may be linearly polarized in the direction parallel to the paper plane. The polarizer 466 may transmit the laser beam linearly polarized in the direction parallel to the paper plane at high transmittance.

The Pockels cell 464 may include an electro-optic crystal (not shown) and a pair of electrodes (not shown). The high voltage power supply 396 may output pulse voltage on the basis of a voltage waveform generated by the voltage waveform generation circuit 395. The pulse voltage outputted by the high voltage power supply 396 may be applied to the pair of electrodes of the Pockels cell 464. When the voltage is applied to the pair of electrodes of the Pockels cell 464, the Pockels cell 464 may shift the phases of orthogonal polarization components of the incident laser beam by ¼ wavelengths to be transmitted. In the laser beam transmitted through the Pockels cell 464 from the left side to the right side in the drawing, reflected by the high reflection mirror 462, and transmitted again through the Pockels cell 464 from the right side to the left side in the drawing, the phases of the orthogonal polarization components may be shifted by ½ wavelengths in total. Then, the laser beam may be incident on the polarizer 466 as a laser beam linearly polarized in the direction perpendicular to the paper plane. The polarizer 466 may reflect the laser beam linearly polarized in the direction perpendicular to the paper plane to output the laser beam from the master oscillator MO.

Here, the waveform of the pulse voltage applied to the Pockels cell 464 by the high voltage power supply 396 may be similar to the waveform of the pulse voltage as shown in FIG. 12G. Thus, the pulse waveform of a pulse laser beam that is reflected by the polarizer 466 may include: a first stage in which light intensity is low and gently increases, a second stage in which the light intensity steeply increases after the first stage and reaches a peak value, and a third stage in which the light intensity decreases after the second stage.

The high reflection mirror 467 may be disposed in a beam path of the pulse laser beam reflected by the polarizer 466. The high reflection mirror 467 may reflect the pulse laser beam at high reflectance toward the saturable absorber cell 397. The saturable absorber cell 397 may contain a saturable absorber gaseous material, for example. The saturable absorber cell 397 may absorb much incident light having a light intensity lower than a predetermined threshold value and transmit much incident light having a light intensity equal to or higher than the predetermined value. For example, a saturable absorber cell that is used for a $CO_2$ laser beam may be a gas cell containing an $SF_6$ gas.

The other points may be the same as those of the second configuration example described with reference to FIG. 12A.

6. RELATIONSHIP BETWEEN THE PARAMETERS OF PULSE LASER BEAMS AND CE

Figure 15:
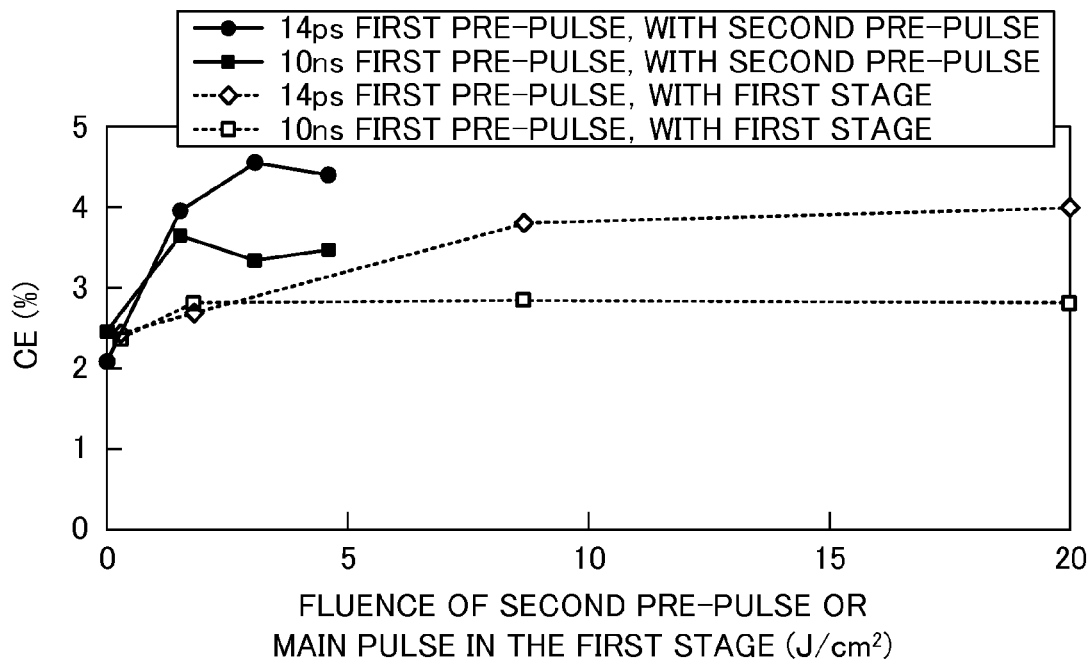
FIG. 15 is a graph showing results of measurement of CE in the EUV light generation systems according to the first and second embodiments.
Figure 16:
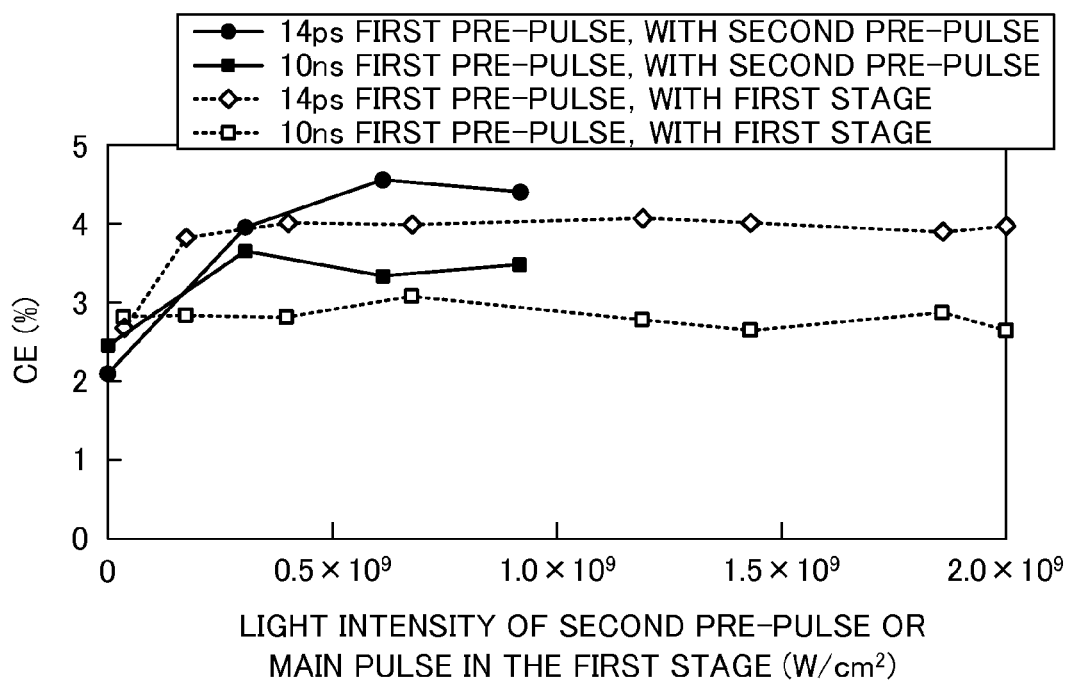
FIG. 16 is a graph showing results of measurement of CE in the EUV light generation systems according to the first and second embodiments.

6.1 Fluence and Light Intensity of a Second Pre-Pulse Laser Beam P2 or of a Main Pulse Laser Beam MP in the First Stage Each of FIGS. 15 and 16 is a graph showing results of measurement of CE in the EUV light generation systems 11 according to the first and second embodiments. In FIG. 15, the horizontal axis may represent the fluence of a second pre-pulse laser beam P2 or of a main pulse laser beam MP in the first stage, and the vertical axis may represent CE. In FIG. 16, the horizontal axis may represent the light intensity per unit area of the second pre-pulse laser beam P2 or of the main pulse laser beam MP in the first stage, and the vertical axis may represent CE.

CE was measured under the following conditions:
Liquid tin was used as targets 27. Diameter of each of the targets 27 was in a range from 21 µm to 22 µm.

The following two types of first pre-pulse laser beam P1 were used:
(1) As a first pre-pulse laser beam P1 having a pulse duration of a nanosecond order, a pulse laser beam having a wavelength of 1.06 µm was generated by a Nd:YAG (neodymium-doped yttrium aluminum garnet) laser apparatus. This pulse laser beam had a full-width at half-maximum pulse duration of 10 ns, and pulse energy in a range from 0 mJ to 2.7 mJ.
(2) As a first pre-pulse laser beam P1 having a pulse duration of a picosecond order, a pulse laser beam having a wavelength of 1.06 µm was generated by using as a master oscillator a mode-locked laser apparatus using Nd:$YVO_4$ and amplified by a regenerative amplifier using Nd:YAG. This pulse laser beam had a full-width at half-maximum pulse duration of 14 ps, and pulse energy in a range from 0 mJ to 2.0 mJ.

Each of these first pre-pulse laser beams P1 had a focusing diameter of 70 µm as expressed by the diameter of a portion having a light intensity equal to or higher than $1/e^2$ of the peak intensity at the position where the first pre-pulse laser beam P1 is focused.

Furthermore, CE was measured under either one of the following two sets of conditions:

(1) A target 27 was first irradiated with a first pre-pulse laser beam P1 and then irradiated with a second pre-pulse laser beam P2 and a main pulse laser beam M. Various values of energy of the second pre-pulse laser beam P2 were set in a range from 0 mJ to 2.4 mJ. Then, CE was measured with varying timings of irradiation with the second pre-pulse laser beam P2. The highest CE at each value of energy of the second pre-pulse laser beam P2 is shown in FIGS. 15 and 16.
(2) A target 27 was first irradiated with a first pre-pulse laser beam P1 and then irradiated with a main pulse laser beam MP having first to third stages. The first stage of the main pulse laser beam MP had a duration of time of approximately 50 ns, and CE was measured with varying energy in the first stage in a range from 0 mJ to 80 mJ.

As the second pre-pulse laser beam P2, a pulse laser beam having a wavelength of 1.06 µm was generated by a Nd:YAG laser apparatus. This pulse laser beam had a full-width at half-maximum pulse duration of 5 ns. The second pre-pulse laser beam P2 had a focusing diameter of 400 µm as expressed by the diameter of a portion having a light intensity equal to or higher than $1/e^2$ of the peak intensity at the position where a target was irradiated with the second pre-pulse laser beam P2.

As the main pulse laser beam M or the main pulse laser beam MP, a pulse laser beam having a wavelength of 10.6 µm was generated by a $CO_2$ laser apparatus. This pulse laser beam had a full-width at half-maximum pulse duration of 15 ns, and pulse energy in a range from 20 mJ to 170 mJ. The main pulse laser beam M had a focusing diameter of 300 µm as expressed by the diameter of a portion having a light intensity equal to or higher than $1/e^2$ of the peak intensity at the position where a target was irradiated with the main pulse laser beam M.

The fluence F of a pulse laser beam is defined as $F=4 \cdot P/(\pi D^2)$, where D is the focusing diameter of the pulse laser beam at the position where a target was irradiated with the pulse laser beam and P is the pulse energy of the pulse laser beam.

Further, the light intensity I per unit area of a pulse laser beam is defined as $I=F/Td$, where Td is the full-width at half-maximum pulse duration of the pulse laser beam. In a case where the duration of time of the first stage of the main pulse laser beam MP is 50 ns as set under the aforementioned conditions, a value of Td for calculating the light intensity I per unit area of the first stage may be 50 ns.

The results shown in FIG. 15 may present the following findings:
(1) CE was higher in a case where the target was irradiated with the second pre-pulse laser beam P2 than in a case where the target was not irradiated with the second pre-pulse laser beam P2, i.e. than in a case where the fluence of the second pre-pulse laser beam P2 was 0 $J/cm^2$. Further, CE was higher in a case where the main pulse laser beam MP included the first stage than in a case where the main pulse laser beam MP included no first stage, i.e. than in a case where the fluence of the main pulse laser beam MP in the first stage was 0 $J/cm^2$.
(2) CE improved as the fluence of the second pre-pulse laser beam P2 became higher. The fluence of the second pre-pulse laser beam P2 may be 1.0 $J/cm^2$ or higher or preferably be 1.5 $J/cm^2$ or higher, and may be equal to or lower than the fluence of the main pulse laser beam M. Further, CE improved as the fluence of the main pulse laser beam MP in the first stage became higher. The fluence of the main pulse laser beam MP in the first stage may be 2 $J/cm^2$ or higher or preferably be 5 $J/cm^2$ or higher, and may be equal to or lower than a total value of the fluence of the main pulse laser beam MP in the second and third stages.

(3) Higher CE was attained with lower fluence in a case where the second pre-pulse laser beam P2 and the main pulse laser beam M were used than in a case where the main pulse laser beam MP having the first to third stages was used.

(4) Higher CE was attained in the case of the first pre-pulse laser beam P1 having a pulse duration of the picosecond order than in the case of the first pre-pulse laser beam P1 having a pulse duration of the nanosecond order.

The results shown in FIG. 16 may present the following findings:

The light intensity per unit area of the second pre-pulse laser beam P2 may be $0.4 \times 10^8$ W/cm$^2$ or higher or preferably be $3.0 \times 10^8$ W/cm$^2$ or higher, and may be equal to or lower than the light intensity per unit area of the main pulse laser beam M. Further, the light intensity per unit area of the main pulse laser beam MP in the first stage may be $0.4 \times 10^8$ W/cm$^2$ or higher or preferably be $1.7 \times 10^8$ W/cm$^2$ or higher, and may be equal to or lower than the light intensity per unit area of the main pulse laser beam MP in the second and third stages.

6.2 Timing of Irradiation with the Second Pre-Pulse Laser Beam P2

Figure 17:
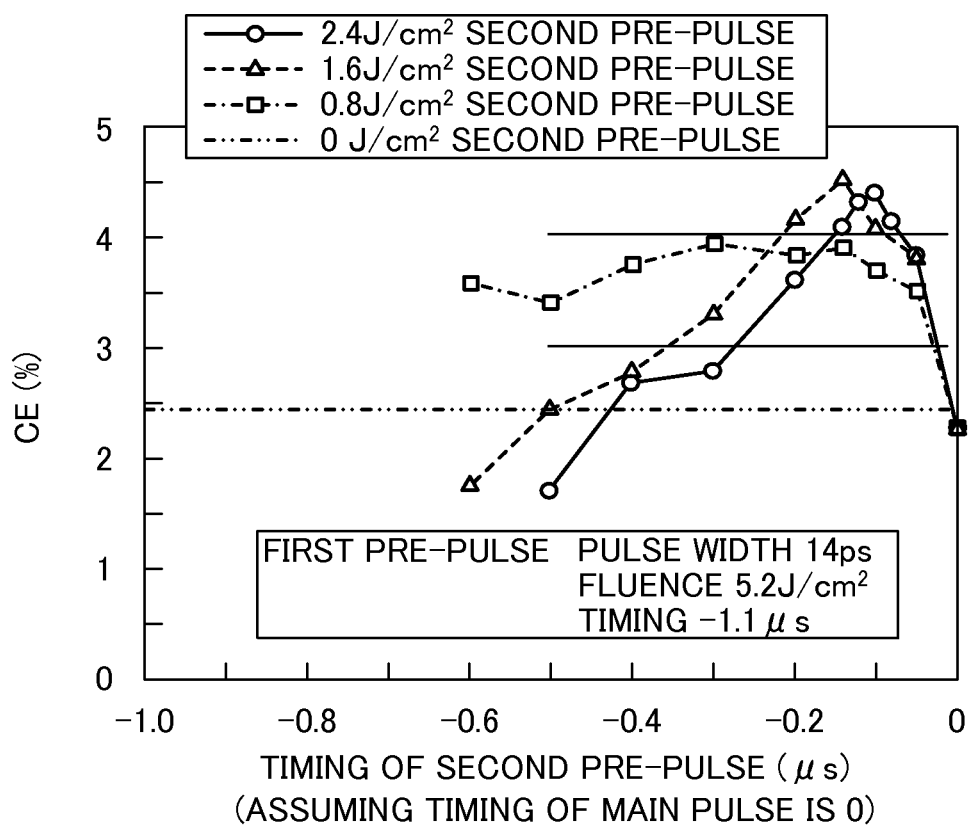
FIG. 17 is another graph showing results of measurement of CE in the EUV light generation system according to the first embodiment.
Figure 18:
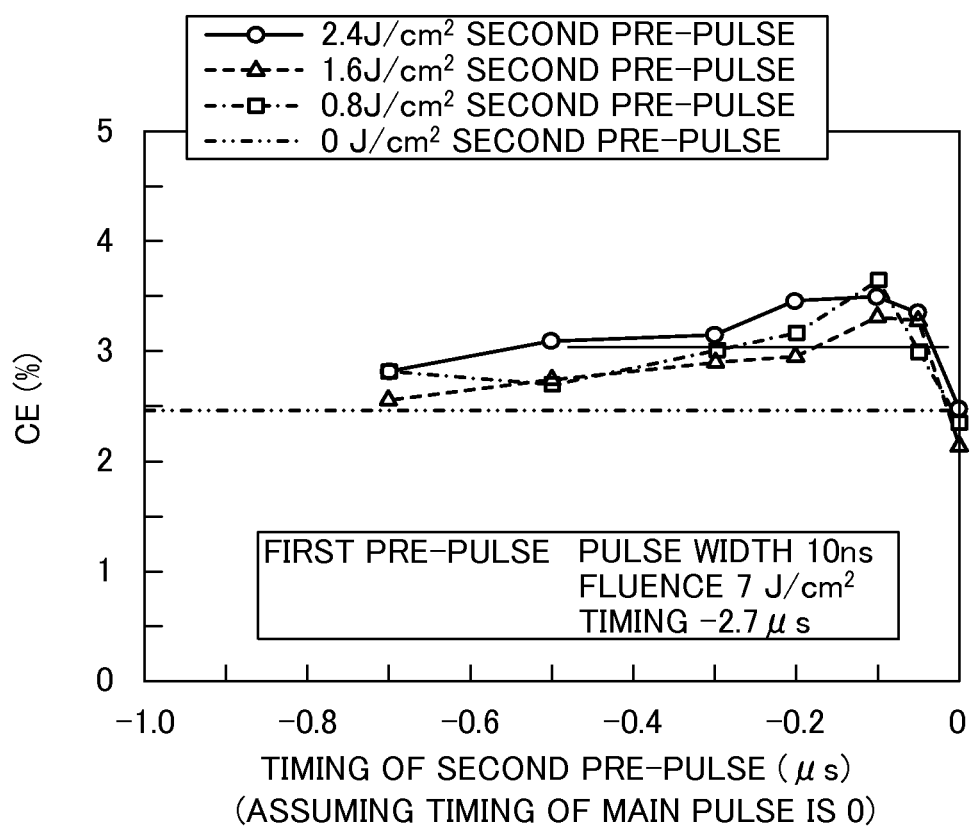
FIG. 18 is another graph showing results of measurement of CE in the EUV light generation system according to the first embodiment.

Each of FIGS. 17 and 18 is another graph showing results of measurement of CE in the EUV light generation system 11 according to the first embodiment. In each of FIGS. 17 and 18, the horizontal axis may represent the timing of irradiation with the second pre-pulse laser beam P2, and the vertical axis may represent CE. Here, the timing of irradiation with the second pre-pulse laser beam P2 may be a time that precedes the timing of irradiation with the main pulse laser beam M, assuming that the timing of irradiation with the main pulse laser beam M is 0.

Targets 27, the conditions of irradiation with the second pre-pulse laser beam P2, and the conditions of irradiation with the main pulse laser beam M were the same as those described with reference to FIGS. 15 and 16. Then, CE was measured with varying timings of irradiation with the second pre-pulse laser beam P2 in the range of $-0.6$ μs to $0$ μs for each value of energy of the second pre-pulse laser beam P2.

The results shown in FIG. 17 are those obtained by using the first pre-pulse laser beam P1 having a pulse duration of the picosecond order under the conditions described with reference to FIGS. 15 and 16. Note, however, that the fluence of the first pre-pulse laser beam P1 was 5.2 J/cm$^2$. The timing of irradiation with the first pre-pulse laser beam P1 was a timing of $-1.1$ μs, which precedes the timing of irradiation with the main pulse laser beam M, assuming that the timing of irradiation with the main pulse laser beam M is 0.

The results shown in FIG. 18 are those obtained by using the first pre-pulse laser beam P1 having a pulse duration of the nanosecond order under the conditions described with reference to FIGS. 15 and 16. Note, however, that the fluence of the first pre-pulse laser beam P1 was 7.0 J/cm$^2$. The timing of irradiation with the first pre-pulse laser beam P1 was a timing of $-2.7$ μs, which precedes the timing of irradiation with the main pulse laser beam M, assuming that the timing of irradiation with the main pulse laser beam M is 0.

The results shown in FIG. 17 may present the following findings:

In the case of the first pre-pulse laser beam P1 having a pulse duration of the picosecond order, the timing of irradiation with the second pre-pulse laser beam P2 may preferably be within the range of $-0.37$ μs to $-0.03$ μs, more preferably $-0.22$ μs to $-0.07$ μs, assuming that the timing of irradiation with the main pulse laser beam M is 0.

The results shown in FIG. 18 may present the following findings:

In the case of the first pre-pulse laser beam P1 having a pulse duration of the nanosecond order, the timing of irradiation with the second pre-pulse laser beam P2 may preferably be within the range of $-0.57$ μs to $-0.03$ μs, assuming that the timing of irradiation with the main pulse laser beam M is 0.

6.3 Fluence of the Main Pulse Laser Beam M or MP

Figure 19:
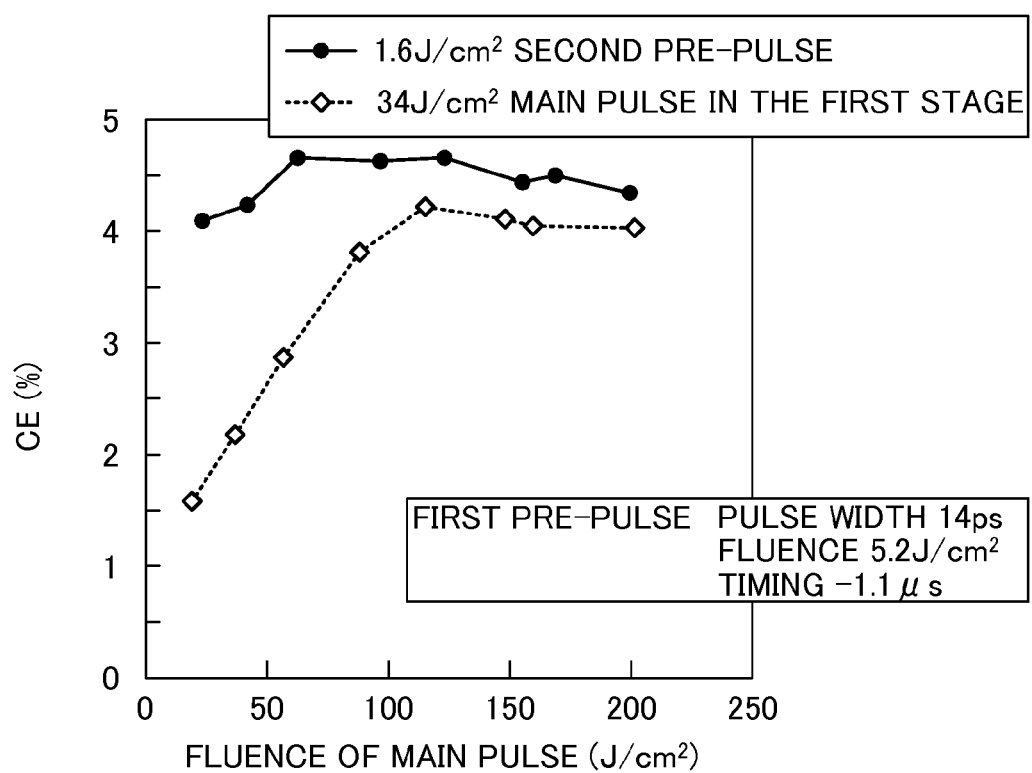
FIG. 19 is still another graph showing results of measurement of CE in the EUV light generation systems according to the first and second embodiments.
Figure 20:
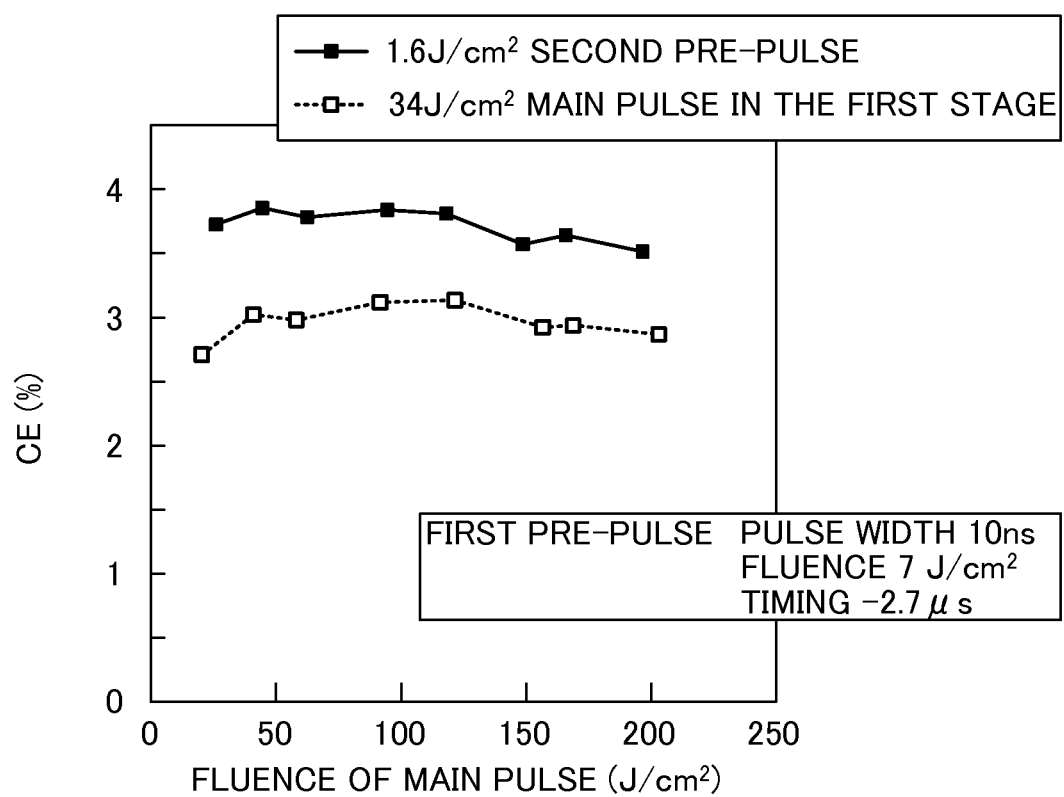
FIG. 20 is still another graph showing results of measurement of CE in the EUV light generation systems according to the first and second embodiments.

Each of FIGS. 19 and 20 is still another graph showing results of measurement of CE in the EUV light generation systems 11 according to the first and second embodiments. In each of FIGS. 19 and 20, the horizontal axis may represent the fluence of the main pulse laser beam M or MP, and the vertical axis may represent CE.

Targets 27, the conditions of irradiation with the second pre-pulse laser beam P2, the conditions of irradiation with the main pulse laser beam M, and the conditions of irradiation with the main pulse laser beam MP having the first to third stages were the same as those described with reference to FIGS. 15 and 16. Note, however, that the fluence of the second pre-pulse laser beam P2 was 1.6 J/cm$^2$, and CE was measured with varying values of the fluence of the main pulse laser beam M in the range of 20 J/cm$^2$ to 200 J/cm$^2$. Further, the fluence of the first stage of the main pulse laser beam MP was 34 J/cm$^2$, and CE was measured with varying total values of the fluence of the main pulse laser beam MP in the second and third stages in the range of 20 J/cm$^2$ to 200 J/cm$^2$.

The results shown in FIG. 19 are those obtained by using the first pre-pulse laser beam P1 having a pulse duration of the picosecond order under the conditions described with reference to FIGS. 15 and 16. Note, however, that the fluence of the first pre-pulse laser beam P1 was 5.2 J/cm$^2$. The timing of irradiation with the first pre-pulse laser beam P1 was a timing of $-1.1$ μs, which precedes the timing of irradiation with the main pulse laser beam M, assuming that the timing of irradiation with the main pulse laser beam M is 0.

The results shown in FIG. 20 are those obtained by using the first pre-pulse laser beam P1 having a pulse duration of the nanosecond order under the conditions described with reference to FIGS. 15 and 16. Note, however, that the fluence of the first pre-pulse laser beam P1 was 7.0 J/cm$^2$. The timing of irradiation with the first pre-pulse laser beam P1 was a timing of $-2.7$ μs, which precedes the timing of irradiation with the main pulse laser beam M, assuming that the timing of irradiation with the main pulse laser beam M is 0.

The results shown in FIG. 19 may present the following findings:

In the case where the target was irradiated with the first pre-pulse laser beam P1 having a pulse duration of the picosecond order and the target was irradiated with the second pre-pulse laser beam P2 and the main pulse laser beam M, high CE was attained across the whole measurement range of the fluence of the main pulse laser beam M.

In the case where the target was irradiated with the first pre-pulse laser beam P1 having a pulse duration of the picosecond order and the target was irradiated with the main pulse laser beam MP, high CE was attained in the range of 100 J/cm$^2$ to 200 J/cm$^2$ of the fluence of the second and third stages of the main pulse laser beam MP.

The results shown in FIG. 20 may present the following findings:

In the case where the target was irradiated with the first pre-pulse laser beam P1 having a pulse duration of the nanosecond order and the target was irradiated with the second pre-pulse laser beam P2 and the main pulse laser beam M, a certain level of CE was attained across the whole measurement range of the fluence of the main pulse laser beam M.

In the case where the target was irradiated with the first pre-pulse laser beam P1 having a pulse duration of the nanosecond order and the target was irradiated with the main pulse laser beam MP, a certain level of CE was attained across the whole measurement range of the fluence of the main pulse laser beam MP in the second and third stages.

6.4 Timing of Irradiation with the First Pre-Pulse Laser Beam P1

Figure 21:
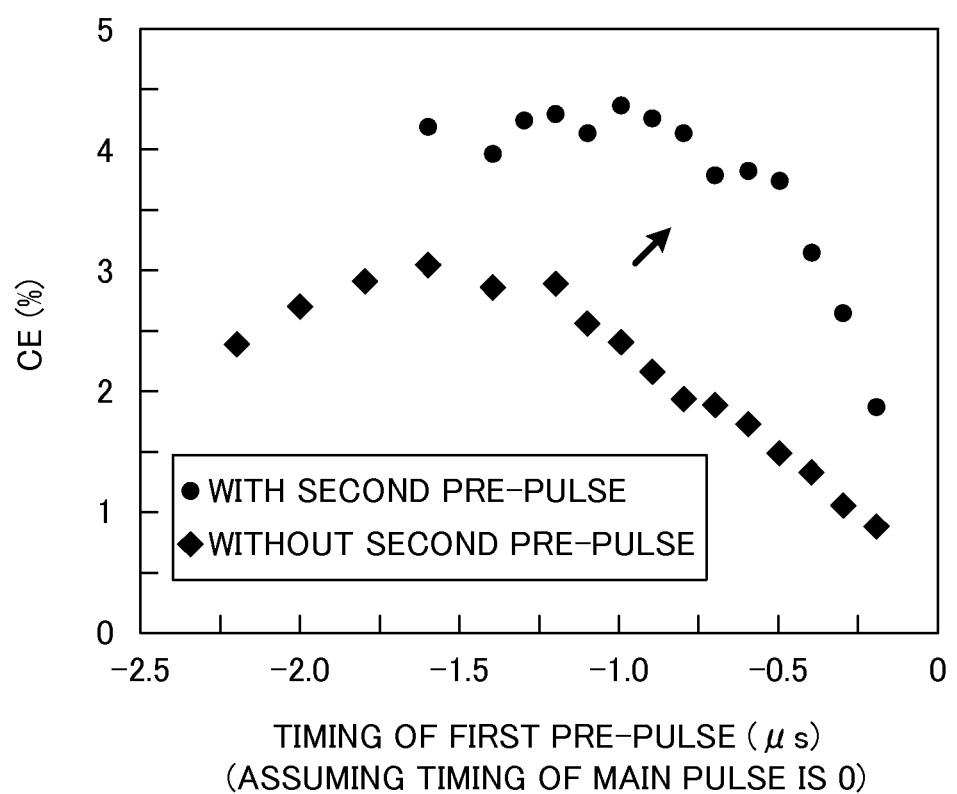
FIG. 21 is still another graph showing results of measurement of CE in the EUV light generation system according to the first embodiment.

FIG. 21 is still another graph showing results of measurement of CE in the EUV light generation system 11 according to the first embodiment. In FIG. 21, the horizontal axis represents a time lag between the timing of irradiation with the first pre-pulse laser beam P1 and the timing of irradiation with the main pulse laser beam, and the vertical axis represents CE. Here, the timing of irradiation with the first pre-pulse laser beam P1 may be a time that precedes the timing of irradiation with the main pulse laser beam M, assuming that the timing of irradiation with the main pulse laser beam M is 0.

Targets 27, the conditions of irradiation with the second pre-pulse laser beam P2, and the conditions of irradiation with the main pulse laser beam M were the same as those described with reference to FIGS. 15 and 16. Note, however, that the fluence of the second pre-pulse laser beam P2 took on either of the following two values: 1.6 J/cm$^2$ and 0 J/cm$^2$. The timing of irradiation with the second pre-pulse laser beam P2 was a timing of −0.1 μs, which precedes the timing of irradiation with the main pulse laser beam M, assuming that the timing of irradiation with the main pulse laser beam M is 0.

The first pre-pulse laser beam P1 used was the first pre-pulse laser beam P1 having a pulse duration of the picosecond order under the conditions described with reference to FIGS. 15 and 16. Note, however, that the fluence of the first pre-pulse laser beam P1 was 5.2 J/cm$^2$.

The results shown in FIG. 21 may present the following findings:

Higher CE was attained in a case where the fluence of the second pre-pulse laser beam P2 was 1.6 J/cm$^2$ than in a case where the target was not irradiated with the second pre-pulse laser beam P2, i.e. than in a case where the fluence of the second pre-pulse laser beam P2 was 0 J/cm$^2$. Further, a time lag between the first pre-pulse laser beam P1 and the main pulse laser beam M for obtaining high CE was shorter in a case where the fluence of the second pre-pulse laser beam P2 was 1.6 J/cm$^2$ than in a case where the fluence of the second pre-pulse laser beam P2 was 0 J/cm$^2$.

In a case where the target was irradiated with the second pre-pulse laser beam P2, the time lag between the timing of irradiation with the first pre-pulse laser beam P1 and the timing of irradiation with the main pulse laser beam M may preferably be 0.5 μs or longer and 1.6 μs or shorter, more preferably 0.8 μs or longer and 1.3 μs or shorter.

6.5 Timing of Irradiation with the First and Second Pre-Pulse Laser Beams

Figure 22:
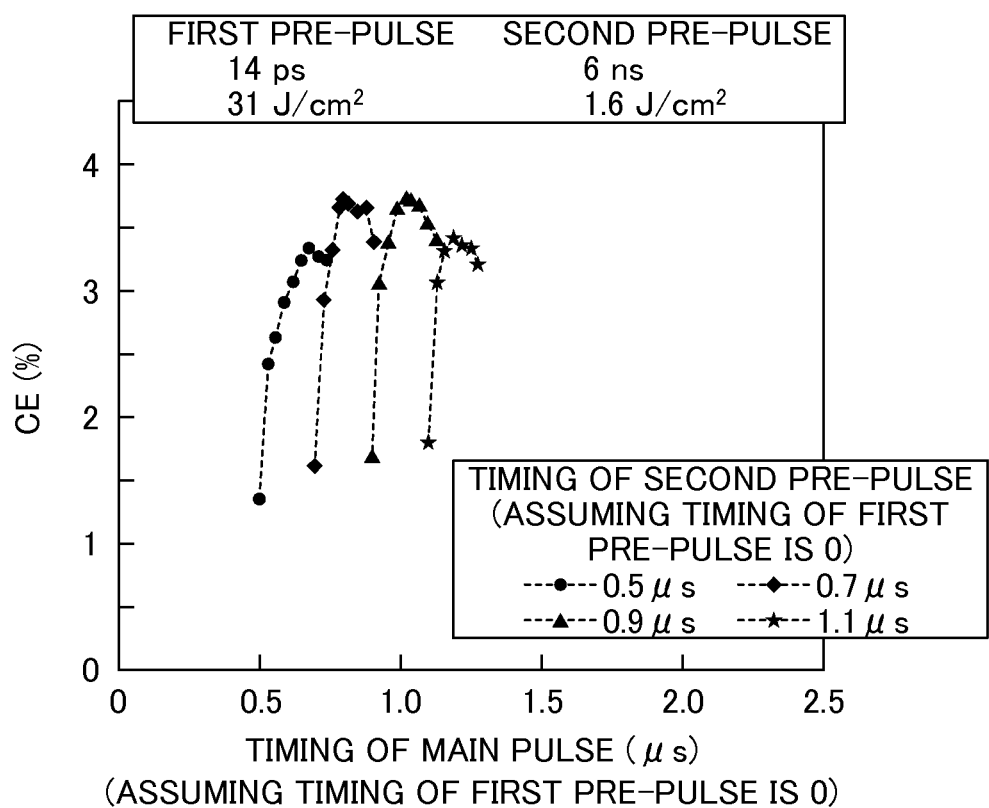
FIG. 22 is still another graph showing results of measurement of CE in the EUV light generation system according to the first embodiment.

FIG. 22 is still another graph showing results of measurement of CE in the EUV light generation system 11 according to the first embodiment. In FIG. 22, the horizontal axis represents the timing of irradiation with the main pulse laser beam M, and the vertical axis represents CE. It should be noted here that the timing of irradiation with the main pulse laser beam M may be a time elapsed during a period from the timing of irradiation with the first pre-pulse laser beam P1 to the timing of irradiation with the main pulse laser beam M, assuming that the timing of irradiation with the first pre-pulse laser beam P1 is 0.

CE was measured under the following conditions:

Liquid tin was used as targets 27. Each of the targets 27 had a diameter of approximately 23 μm.

As a first pre-pulse laser beam P1, a pulse laser beam having a wavelength of 1.06 μm was generated by using as a master oscillator a mode-locked laser apparatus using Nd:YVO$_4$ and amplified by a regenerative amplifier using Nd:YAG. The first pre-pulse laser beam P1 had a full-width at half-maximum pulse duration of 14 ps, pulse energy of 2 mJ, a focusing diameter of 90 μm, and a fluence of 31 J/cm$^2$. The focusing diameter of the first pre-pulse laser beam P1 may be a diameter as expressed by the diameter of a portion having a light intensity equal to or higher than $1/e^2$ of the peak intensity at the position where the first pre-pulse laser beam P1 is focused.

The target 27 having been first irradiated with the first pre-pulse laser beam P1 was then irradiated with a second pre-pulse laser beam P2 and a main pulse laser beam M. As the second pre-pulse laser beam P2, a pulse laser beam having a wavelength of 1.06 μm was generated by a Nd:YAG laser apparatus. The second pre-pulse laser beam P2 had a full-width at half-maximum pulse duration of 6 ns, pulse energy of 2 mJ, a focusing diameter of 400 μm, and a fluence of 1.6 J/cm$^2$. The focusing diameter of the second pre-pulse laser beam P2 may be a diameter as expressed by the diameter of a portion having a light intensity equal to or higher than $1/e^2$ of the peak intensity at the position where the second pre-pulse laser beam P2 is focused.

FIG. 22 shows cases where the timing of irradiation with the second pre-pulse laser beam P2 was 0.5 μs, 0.7 μs, 0.9 μs, and 1.1 μs, respectively. Here, the timing of irradiation with the second pre-pulse laser beam P2 may be a time elapsed during a period from the timing of irradiation with the first pre-pulse laser beam P1 to the timing of irradiation with the second pre-pulse laser beam P2, assuming that the timing of irradiation with the first pre-pulse laser beam P1 is 0.

As the main pulse laser beam M, a pulse laser beam having a wavelength of 10.6 μm was generated by a CO$_2$ laser apparatus. The main pulse laser beam M had a full-width at half-maximum pulse duration of 15 ns and pulse energy of 100 mJ. The main pulse laser beam M had a focusing diameter of 300 μm as expressed by the diameter of a portion having a light intensity equal to or higher than $1/e^2$ of the peak intensity at the position where a target was irradiated with the main pulse laser beam M. The fluence of the main pulse laser beam M was 142 J/cm$^2$.

Figure 23:
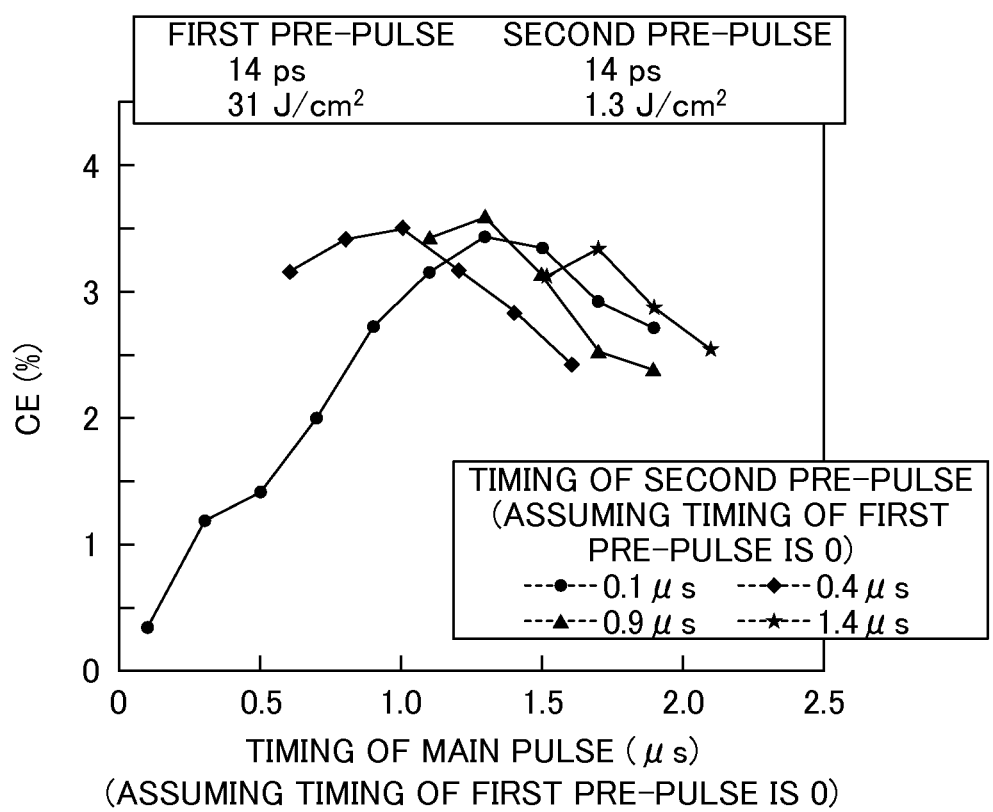
FIG. 23 is still another graph showing results of measurement of CE in the EUV light generation system according to the first embodiment.

FIG. 23 is still another graph showing results of measurement of CE in the EUV light generation system 11 according to the first embodiment.

In FIG. 23, as the second pre-pulse laser beam P2, a pulse laser beam having a wavelength of 1.06 μm was generated by using as a master oscillator a mode-locked laser apparatus using Nd:YVO$_4$ and amplified by a regenerative amplifier using Nd:YAG. The second pre-pulse laser beam P2 had a full-width at half-maximum pulse duration of 14 ps, pulse energy of 1.6 mJ, a focusing diameter of 400 μm, and a fluence of 1.3 J/cm$^2$.

FIG. 23 shows cases where the timing of irradiation with the second pre-pulse laser beam P2 was 0.1 μs, 0.4 μs, 0.9 μs, and 1.4 μs, respectively.

In other respects, measurement conditions were identical to the measurement conditions in FIG. 22.

The results shown in FIGS. 22 and 23 may present the following findings:

(1) The maximum CE was slightly lower in a case where both the first and second pre-pulse laser beams P1 and P2 had pulse durations of the picosecond order as shown in FIG. 23 than in a case where the first pre-pulse laser beam P1 had a pulse duration of the picosecond order and the second pre-pulse laser beam P2 had a pulse duration of the nanosecond order as shown in FIG. 22.

(2) The graph of FIG. 23 had a gentler slope than the graph of FIG. 22. Therefore, in a case where both the first and second pre-pulse laser beams P1 and P2 have pulse durations of the picosecond order, stable CE is expected to be attained, even with some variation in timing of irradiation with the main pulse laser beam M.

Figure 24:
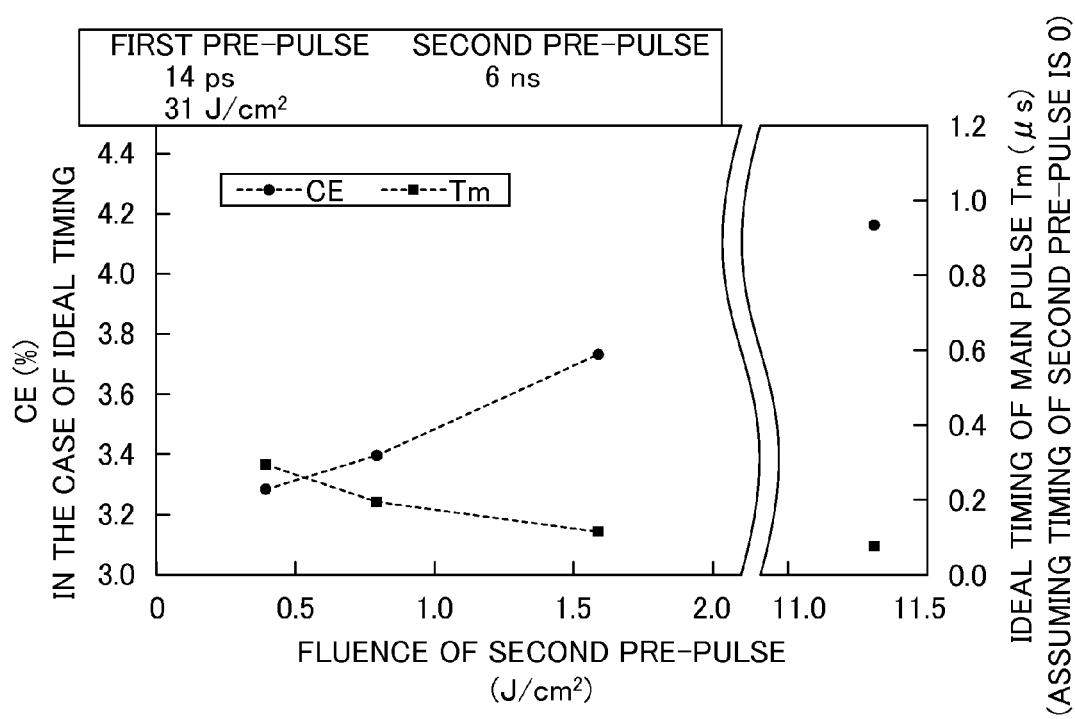
FIG. 24 is still another graph showing results of measurement of CE in the EUV light generation system according to the first embodiment.

FIG. 24 is still another graph showing results of measurement of CE in the EUV light generation system 11 according to the first embodiment. In FIG. 24, the horizontal axis represents the fluence of the second pre-pulse laser beam P2. In FIG. 24, each target 27 was irradiated with a first pre-pulse laser beam P1, a second pre-pulse laser beam P2, and a main pulse laser beam M in this order. Further, with four values set as the fluence of the second pre-pulse laser beam P2, CE was measured with varying timings of irradiation with the main pulse laser beam M. Then, for each of the set values of the fluence of the second pre-pulse laser beam P2, the timing Tm of irradiation with the main pulse laser beam M at which the highest CE was attained and CE attained at that timing were tabulated in FIG. 24. Here, the timing of irradiation with the main pulse laser beam M may be a time elapsed during a period from the timing of irradiation with the second pre-pulse laser beam P2 to the timing of irradiation with the main pulse laser beam M, assuming that the timing of irradiation with the second pre-pulse laser beam P2 is 0.

Liquid tin was used as targets 27. Each of the targets 27 had a diameter of approximately 23 μm.

As the first pre-pulse laser beam P1, a pulse laser beam having a wavelength of 1.06 μm was generated by using as a master oscillator a mode-locked laser apparatus using Nd:YVO$_4$ and amplified by a regenerative amplifier using Nd:YAG. The first pre-pulse laser beam P1 had a full-width at half-maximum pulse duration of 14 ps, pulse energy of 2 mJ, a focusing diameter of 90 μm, and a fluence of 31 J/cm$^2$. The focusing diameter of the first pre-pulse laser beam P1 may be a diameter as expressed by the diameter of a portion having a light intensity equal to or higher than $1/e^2$ of the peak intensity at the position where the first pre-pulse laser beam P1 is focused.

The target 27 having been first irradiated with the first pre-pulse laser beam P1 was then irradiated with the second pre-pulse laser beam P2 and the main pulse laser beam M. As the second pre-pulse laser beam P2, a pulse laser beam having a wavelength of 1.06 μm was generated by a Nd:YAG laser apparatus. The second pre-pulse laser beam P2 had a full-width at half-maximum pulse duration of 6 ns and a focusing diameter of 400 μm. The focusing diameter of the second pre-pulse laser beam P2 may be a diameter as expressed by the diameter of a portion having a light intensity equal to or higher than $1/e^2$ of the peak intensity at the position where the second pre-pulse laser beam P2 is focused.

As the main pulse laser beam M, a pulse laser beam having a wavelength of 10.6 μm was generated by a CO$_2$ laser apparatus. The main pulse laser beam M had a full-width at half-maximum pulse duration of 15 ns and pulse energy of 100 mJ. The main pulse laser beam M had a focusing diameter of 300 μm as expressed by the diameter of a portion having a light intensity equal to or higher than $1/e^2$ of the peak intensity at the position where a target was irradiated with the main pulse laser beam M. The fluence of the main pulse laser beam M was 142 J/cm$^2$.

Figure 25:
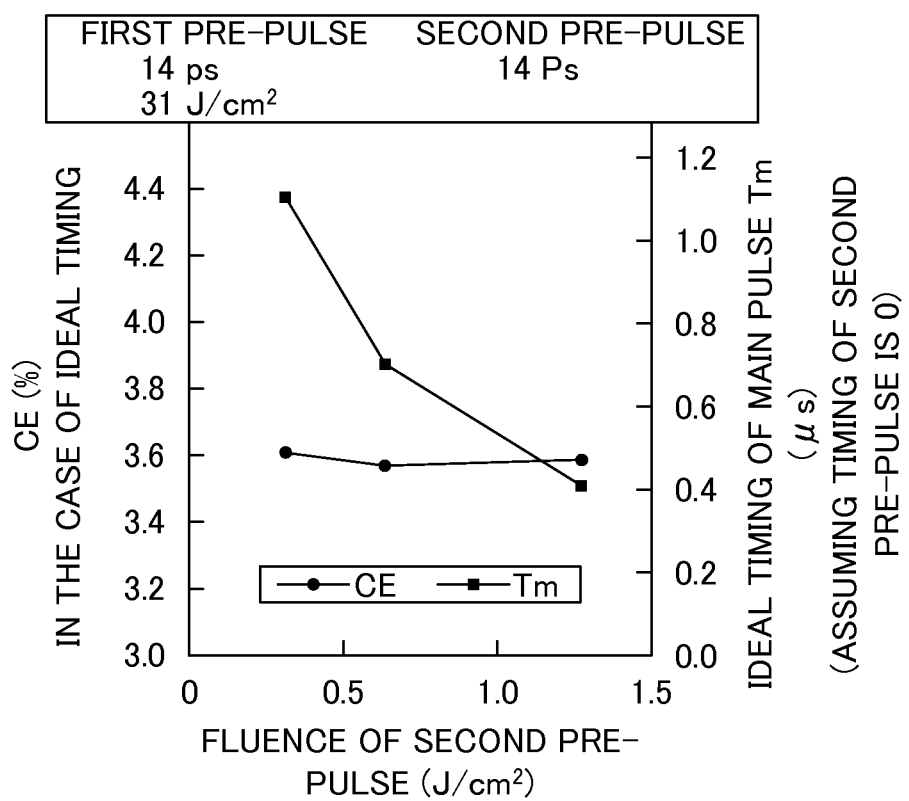
FIG. 25 is still another graph showing results of measurement of CE in the EUV light generation system according to the first embodiment.

FIG. 25 is still another graph showing results of measurement of CE in the EUV light generation system 11 according to the first embodiment.

In FIG. 25, as the second pre-pulse laser beam P2, a pulse laser beam having a wavelength of 1.06 μm was generated by using as a master oscillator a mode-locked laser apparatus using Nd:YVO$_4$ and amplified by a regenerative amplifier using Nd:YAG. The second pre-pulse laser beam P2 had a full-width at half-maximum pulse duration of 14 ps and a focusing diameter of 400 μm.

In FIG. 25, with three values set as the fluence of the second pre-pulse laser beam P2, CE was measured with varying timings of irradiation with the main pulse laser beam M. Then, for each of the set values of the fluence of the second pre-pulse laser beam P2, the timing I'm of irradiation with the main pulse laser beam M at which the highest CE was attained and CE attained at that timing were tabulated in FIG. 25.

In other respects, the conditions were identical to the measurement conditions in FIG. 24.

The results shown in FIGS. 24 and 25 may present the following findings:

(1) The maximum CE was lower in a case where both the first and second pre-pulse laser beams P1 and P2 had pulse durations of the picosecond order as shown in FIG. 25 than in a case where the first pre-pulse laser beam P1 had a pulse duration of the picosecond order and the second pre-pulse laser beam P2 had a pulse duration of the nanosecond order as shown in FIG. 24.

(2) The CE graph of FIG. 25 had a gentler slope than the graph of FIG. 24. Therefore, in a case where both the first and second pre-pulse laser beams P1 and P2 have pulse durations of the picosecond order, stable CE is expected to be attained, even with some variation in fluence of the second pre-pulse laser beam P2.

(3) As shown in FIGS. 24 and 25, with a higher fluence of the second pre-pulse laser beam P2, an ideal timing of irradiation with the main pulse laser beam M tends to become earlier. In particular, as shown in FIG. 25, the tendency is stronger in a case where both the first and second pre-pulse laser beams P1 and P2 have pulse durations of the picosecond order.

7. CHANGES OF A TARGET IRRADIATED WITH PULSE LASER BEAMS

Figure 26A:
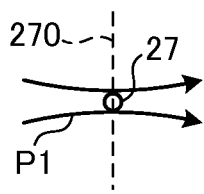
FIG. 26A schematically illustrates an appearance of a target being irradiated with a first pre-pulse laser beam having a pulse duration of a picosecond order in the first and second embodiments.

7.1 Case where the First Pre-Pulse Laser Beam has a Pulse Duration of the Picosecond Order FIG. 26A schematically illustrates an appearance of a target 27 being irradiated with the first pre-pulse laser beam P1 having a pulse duration of the picosecond order in the first and second embodiments. A broken line 270 indicates the trajectory of the target 27 and the extension line of the trajectory. The first pre-pulse laser beam P1 may have a focusing diameter substantially equal to or slightly larger than the diameter of the target 27.

Figure 26B:
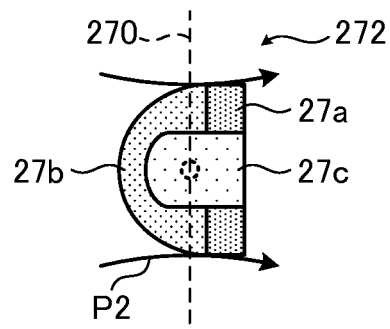
FIG. 26B schematically illustrates an appearance of the target being irradiated with a second pre-pulse laser beam.

FIG. 26B schematically illustrates an appearance of the target being irradiated with the second pre-pulse laser beam P2. By being irradiated with the first pre-pulse laser beam P1, the droplet target 27 may be broken up into a plurality of fine particles and diffused to form a secondary target 272. The roughness and fineness of dots in FIG. 26B may correspond to the distribution density of the target material. As shown in FIG. 26B, the secondary target 272, generated by irradiating a target with the first pre-pulse laser beam P1 having a pulse duration of the picosecond order, may have a disc portion 27a and a dome portion 27b. The disc portion 27a may be diffused downstream along the beam path of the first pre-pulse laser beam P1, and may be comparatively high in density of the target material. The dome portion 27b may be diffused upstream along the beam path of the first pre-pulse laser beam P1, and may be comparatively low in density of the target material. Inside the dome portion 27b, a portion 27c may be generated. The portion 27c may be further lower in density of the target material.

As shown in FIG. 26B, the secondary target 272 thus diffused may be irradiated with the second pre-pulse laser beam P2. The second pre-pulse laser beam P2 may have a focusing diameter substantially equal to or slightly larger than the diameter of the secondary target 272 thus diffused.

Figure 26C:
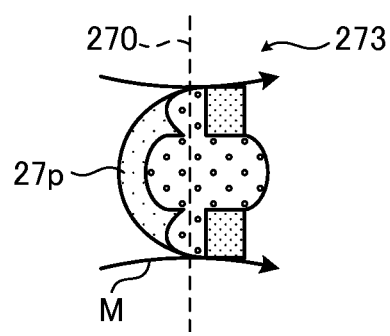
FIG. 26C schematically illustrates an appearance of the target being irradiated with a main pulse laser beam.

FIG. 26C schematically illustrates an appearance of the target being irradiated with the main pulse laser beam M. By irradiating the secondary target 272 shown in FIG. 26B with the second pre-pulse laser beam P2, the secondary target 272 may turn into a tertiary target 273 including at least steam or pre-plasma 27p.

The present disclosure is not limited to a case where the secondary target 272 is irradiated with the second pre-pulse laser beam P2 to form the tertiary target 273, although such a case is described here. Alternatively, by being irradiated with a portion of the main pulse laser beam MP that corresponds to the first stage, the secondary target 272 may similarly turn into a tertiary target 273 including at least steam or pre-plasma.

As shown in FIG. 26C, the tertiary target 273 including at least steam or pre-plasma 27p may be irradiated with the main pulse laser beam M or portions of the main pulse laser beam MP corresponding to the second and third stages. The main pulse laser beam M or the main pulse laser beam MP may have a focusing diameter substantially equal to or slightly larger than the dispersion diameter of the tertiary target 273.

Figure 26D:
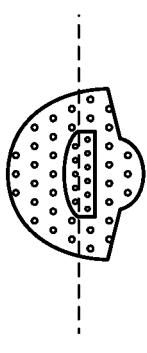
FIG. 26D schematically illustrates an appearance of the target after being irradiated with the main pulse laser beam.

FIG. 26D schematically illustrates an appearance of the target irradiated with the main pulse laser beam M or the main pulse laser beam MP. By irradiating the tertiary target 273 shown in FIG. 26C with the main pulse laser beam M or the main pulse laser beam MP, the tertiary target may turn into plasma from which EUV light may be emitted.

Figure 27A:
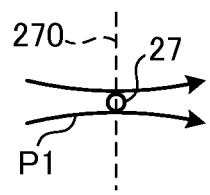
FIG. 27A schematically illustrates an appearance of a target being irradiated with a first pre-pulse laser beam having a pulse duration of a nanosecond order in the first and second embodiments.

7.2 Case where the First Pre-Pulse Laser Beam has a Pulse Duration of the Nanosecond Order FIG. 27A schematically illustrates an appearance of a target 27 being irradiated with the first pre-pulse laser beam P1 having a pulse duration of the nanosecond order in the first and second embodiments. The first pre-pulse laser beam P1 may have a focusing diameter substantially equal to or slightly larger than the diameter of the target 27.

Figure 27B:
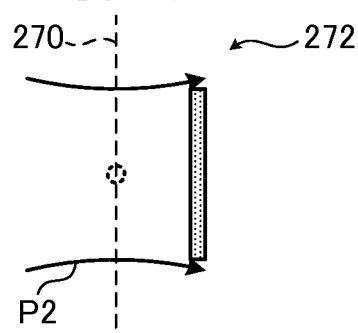
FIG. 27B schematically illustrates an appearance of the target being irradiated with a second pre-pulse laser beam.

FIG. 27B schematically illustrates an appearance of the target being irradiated with the second pre-pulse laser beam P2. By being irradiated with the first pre-pulse laser beam P1, the droplet target 27 may be broken up into a plurality of fine particles and diffused to form a secondary target 272. As shown in FIG. 27B, the secondary target 272, generated by irradiating a target with the first pre-pulse laser beam P1 having a pulse duration of the nanosecond order, may have a disc-shaped distribution. The secondary target 272, which has the disc-shaped distribution, may be diffused downstream along the beam path of the first pre-pulse laser beam P1.

As shown in FIG. 27B, the secondary target 272 thus diffused may be irradiated with the second pre-pulse laser beam P2. The second pre-pulse laser beam P2 may have a focusing diameter substantially equal to or slightly larger than the diameter of the secondary target 272 thus diffused.

Figure 27C:
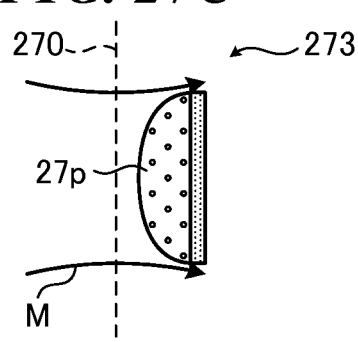
FIG. 27C schematically illustrates an appearance of the target being irradiated with a main pulse laser beam.

FIG. 27C schematically illustrates an appearance of the target being irradiated with the main pulse laser beam M. By irradiating the secondary target 272 shown in FIG. 27B with the second pre-pulse laser beam P2, the secondary target 272 may turn into a tertiary target 273 including fine particles and steam or pre-plasma 27p.

The present disclosure is not limited to a case where the secondary target 272 is irradiated with the second pre-pulse laser beam P2 to form the tertiary target 273, although such a case is described here. Alternatively, by being irradiated with a portion of the main pulse laser beam MP corresponding to the first stage, the secondary target 272 may similarly turn into a tertiary target 273 including fine particles and steam or pre-plasma.

As shown in FIG. 27C, the tertiary target 273 including fine particles and steam or pre-plasma 27p may be irradiated with the main pulse laser beam M or portions of the main pulse laser beam MP corresponding to the second and third stages. The main pulse laser beam M or the main pulse laser beam MP may have a focusing diameter substantially equal to or slightly larger than the dispersion diameter of the tertiary target 273.

Figure 27D:
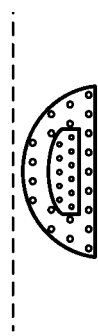
FIG. 27D schematically illustrates an appearance of the target after being irradiated with the main pulse laser beam.

FIG. 27D schematically illustrates an appearance of the target irradiated with the main pulse laser beam M or the main pulse laser beam MP. By irradiating the tertiary target 273 shown in FIG. 27C with the main pulse laser beam M or the main pulse laser beam MP, the tertiary target may turn into plasma from which EUV light may be emitted.

In the first and second embodiments, a target is turned into plasma after being gradually broken up by the first and second pre-pulse laser beams and turned into steam or pre-plasma. This may be the reason why the target is efficiently turned into plasma.

In particular, in a case where the first pre-pulse laser beam has a pulse duration of the picosecond order, the secondary target is diffused in the form of a plurality of finer particles. In this situation, the secondary target may be efficiently turned into plasma by the second pre-pulse laser beam and the main pulse laser beam.

Figure 28:
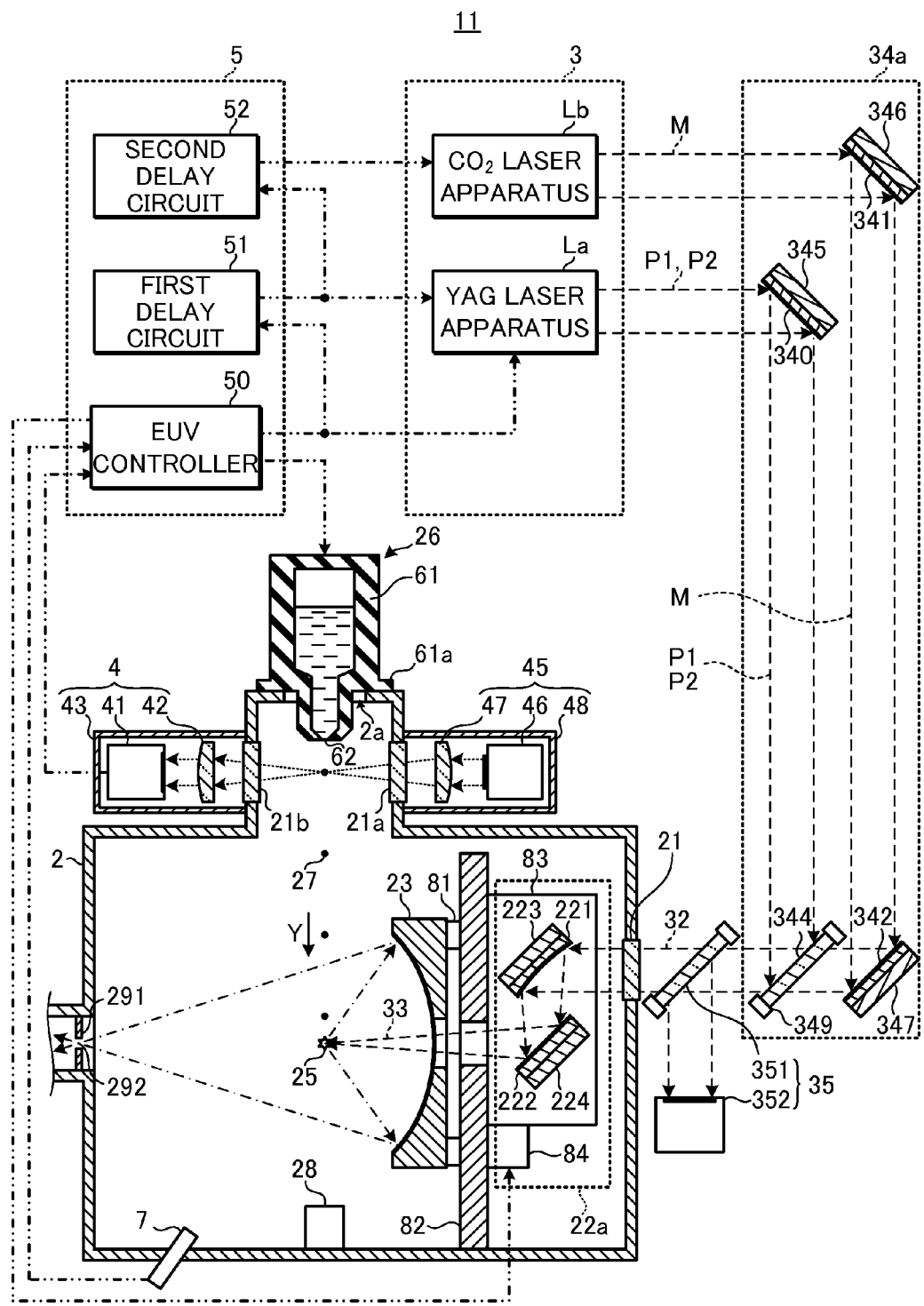
FIG. 28 is a partial cross-sectional view showing a configuration of an EUV light generation system according to a third embodiment.

8. EUV LIGHT GENERATION SYSTEM IN WHICH A YAG LASER APPARATUS OUTPUTS A PLURALITY OF PULSES 8.1 Configuration FIG. 28 is a partial cross-sectional view showing a configuration of an EUV light generation system 11 according to a third embodiment. The third embodiment shown in FIG. 28 differs from the first embodiment shown in FIG. 2 in that the laser system 3 includes a single YAG laser apparatus La and a single $CO_2$ laser apparatus Lb. Furthermore, the third embodiment differs from the first embodiment in that a first trigger signal from the EUV controller 50 and a second trigger signal from the first delay circuit 51 are inputted to the YAG laser apparatus La. The beam combiner 343 in the first embodiment may be eliminated.

8.2 Operation

The EUV controller 50 may output, to the YAG laser apparatus La and to the first delay circuit 51, the first trigger signal on the basis of a target detection signal. The YAG laser apparatus La may output the first pre-pulse laser beam P1 in accordance with the first trigger signal.

The first delay circuit 51 may receive the first trigger signal. The first delay circuit 51 may output, to the YAG laser apparatus La and to the second delay circuit 52, a second trigger signal indicating that a first delay time has elapsed since the timing of reception of the first trigger signal. The YAG laser apparatus La may output the second pre-pulse laser beam P2 in accordance with the second trigger signal.

The second delay circuit 52 may receive the second trigger signal. The second delay circuit 52 may output, to the $CO_2$ laser apparatus Lb, a third trigger signal indicating that a second delay time has elapsed since the timing of reception of the second trigger signal.

Alternatively, the EUV controller 50 may output the first trigger signal also to the second delay circuit 52. Upon receiving the first trigger signal, the second delay circuit 52 may output, to the $CO_2$ laser apparatus Lb, a third trigger signal indicating that the first and second delay times have elapsed since the timing of reception of the first trigger signal.

The $CO_2$ laser apparatus Lb may output the main pulse laser beam M in accordance with the third trigger signal.

In this manner, the laser system 3 may output the first pre-pulse laser beam P1, the second pre-pulse laser beam P2, and the main pulse laser beam M in this order.

Figure 29:
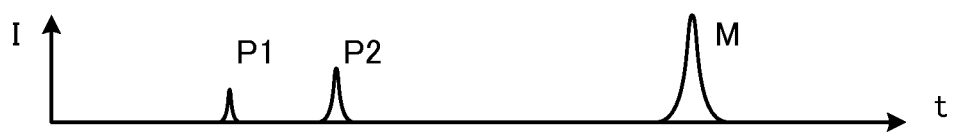
FIG. 29 is a waveform chart showing an example of a laser beam reception signal in the third embodiment.

FIG. 29 is a waveform chart showing an example of a laser beam reception signal in the third embodiment. In FIG. 29, the horizontal axis may represent time t, and the vertical axis may represent light intensity I. The pulse laser beam 32 that the optical sensor 352 receives may include the first pre-pulse laser beam P1, the second pre-pulse laser beam P2, and the main pulse laser beam M. The first pre-pulse laser beam P1, the second pre-pulse laser beam P2, and the main pulse laser beam M may be incident on the optical sensor 352 in this order. The fluence of the second pre-pulse laser beam P2 may be higher than the fluence of the first pre-pulse laser beam P1. The fluence of the main pulse laser beam M may be higher than the fluence of the second pre-pulse laser beam P2.

8.3 Example of Laser Optics

Figure 30:
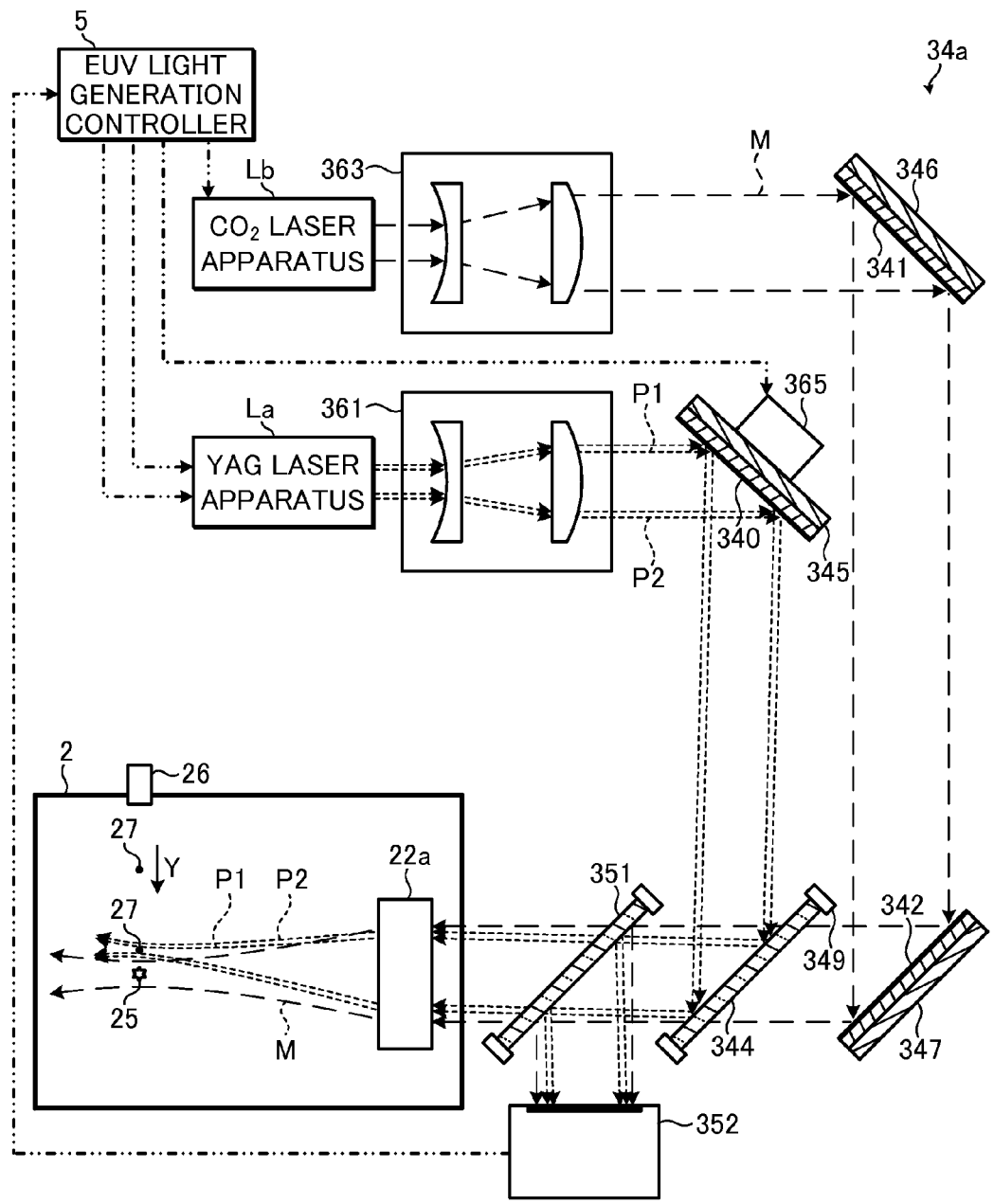
FIG. 30 schematically illustrates a configuration example of a laser beam direction control unit and components therearound in the EUV light generation system shown in FIG. 28.

FIG. 30 schematically illustrates a configuration example of the laser beam direction control unit 34a and components therearound in the EUV light generation system 11 shown in FIG. 28. FIG. 30 omits to illustrate components accompanying the chamber 2, such as the EUV collector mirror 23 and the target sensor 4. FIG. 30 also omits to specifically illustrate the structures of the focusing optics 22a and the target generation unit 26.

As shown in FIG. 30, the first and second pre-pulse laser beams P1 and P2 outputted from the YAG laser apparatus La may be reflected by the high reflection mirror 340 and the beam combiner 344 and enter the focusing optics 22a. The main pulse laser beam M outputted from the $CO_2$ laser apparatus Lb may be reflected by the high reflection mirrors 341 and 342 and enter the focusing optics 22a.

As shown in FIG. 29, a period of time from a timing when a target 27 is irradiated with the first pre-pulse laser beam P1 to a timing when the target 27 is irradiated with the second pre-pulse laser beam P2 may be shorter than a period of time from the timing when the target 27 is irradiated with the second pre-pulse laser beam P2 to a timing when the target 27 is irradiated with the main pulse laser beam M. For this reason, during the period of time from the timing when the target 27 is irradiated with the first pre-pulse laser beam P1 to the timing when the target 27 is irradiated with the second pre-pulse laser beam P2, target movement distance and target diffusion diameter growth may be small.

Therefore, the first and second pre-pulse laser beams P1 and P2 may have substantially the same wavelengths with each other and substantially the same beam diameters with each other. With this configuration, the first and second pre-pulse laser beams P1 and P2 may be focused into substantially the same focusing diameters with each other. Further, the beam paths of the first and second pre-pulse laser beams P1 and P2 may be substantially the same with each other.

The other points may be the same as those of the first embodiment.

8.4 Variation in which a Fourth Trigger Signal is Used

Figure 31:
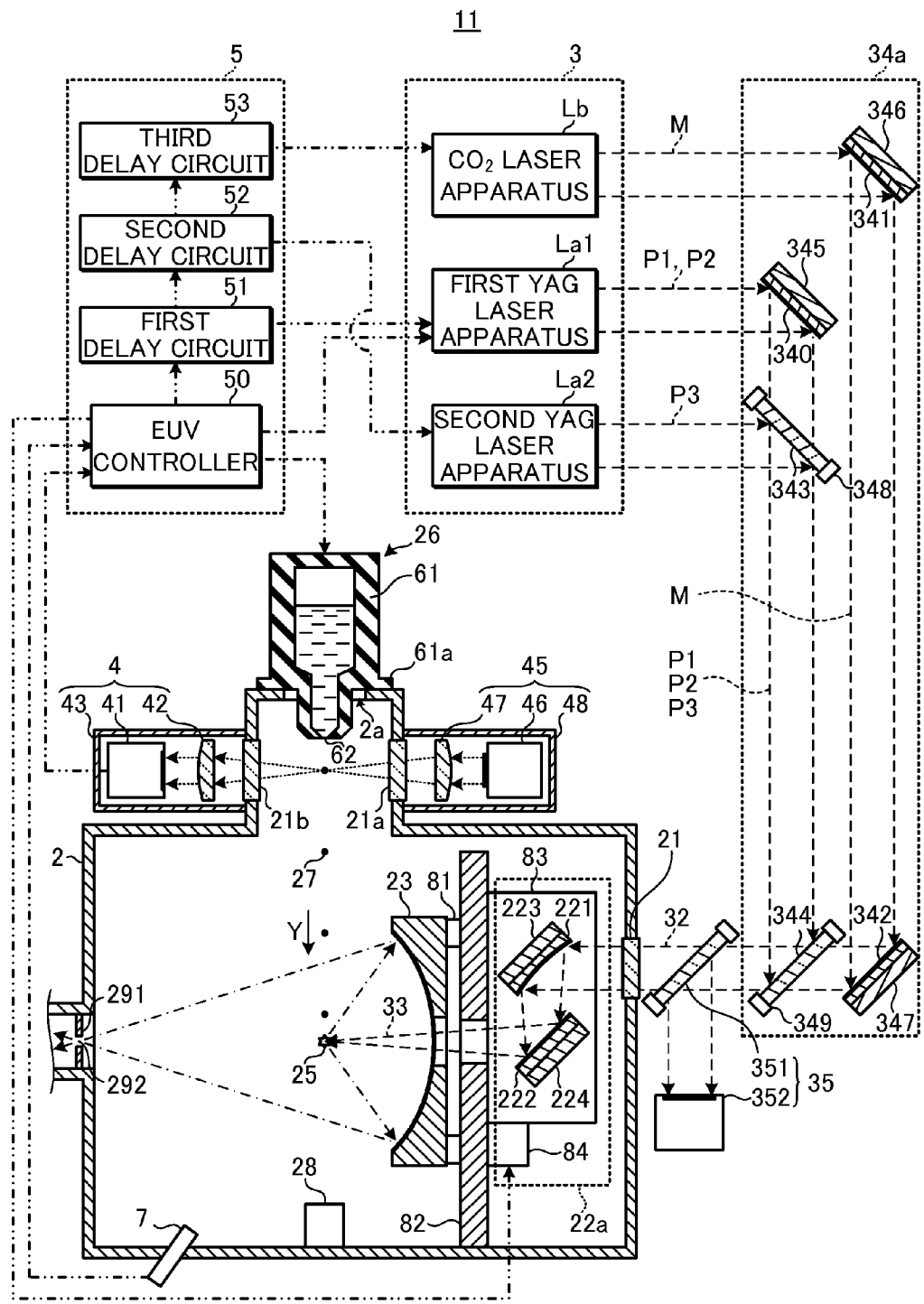
FIG. 31 is a partial cross-sectional view showing a variation of the EUV light generation system according to the third embodiment.

FIG. 31 is a partial cross-sectional view showing a variation of the EUV light generation system 11 according to the third embodiment. In the variation shown in FIG. 31, the laser system 3 may include a first YAG laser apparatus La1, a second YAG laser apparatus La2, and a $CO_2$ laser apparatus Lb. Furthermore, in this variation, the EUV light generation controller 5 may include a third delay circuit 53 in addition to the EUV controller 50, the first delay circuit 51, and the second delay circuit 52.

The other points may be the same as those shown in FIG. 28. The following describes parts that may be different from those shown in FIG. 28.

The EUV controller 50 may output, to the first YAG laser apparatus La1 and to the first delay circuit 51, a first trigger signal on the basis of a target detection signal. The first YAG laser apparatus La1 may output the first pre-pulse laser beam P1 in accordance with the first trigger signal.

The first delay circuit 51 may receive the first trigger signal. The first delay circuit 51 may output, to the first YAG laser apparatus La1 and to the second delay circuit 52, a second trigger signal indicating that a first delay time has elapsed since the timing of reception of the first trigger signal. The first YAG laser apparatus La1 may output the second pre-pulse laser beam P2 in accordance with the second trigger signal.

The second delay circuit 52 may receive the second trigger signal. The second delay circuit 52 may output, to the second YAG laser apparatus La2 and to the third delay circuit 53, a third trigger signal indicating that a second delay time has elapsed since the timing of reception of the second trigger signal.

Alternatively, the EUV controller 50 may output the first trigger signal also to the second delay circuit 52. Upon receiving the first trigger signal, the second delay circuit 52 may output, to the second YAG laser apparatus La2, a third trigger signal indicating that the first and second delay times have elapsed since the timing of reception of the first trigger signal.

The second YAG laser apparatus La2 may output a third pre-pulse laser beam P3 in accordance with the third trigger signal.

The third delay circuit 53 may receive the third trigger signal. The third delay circuit 53 may output, to the $CO_2$ laser apparatus Lb, a fourth trigger signal indicating that a third delay time has elapsed since the timing of reception of the third trigger signal.

Alternatively, the EUV controller 50 may output the first trigger signal also to the third delay circuit 53. Upon receiving the first trigger signal, the third delay circuit 53 may output, to the $CO_2$ laser apparatus Lb, a fourth trigger signal indicating that the first, second, and third delay times have elapsed since the timing of reception of the first trigger signal.

The $CO_2$ laser apparatus Lb may output the main pulse laser beam M in accordance with the fourth trigger signal.

In this manner, the laser system 3 may output the first pre-pulse laser beam P1, the second pre-pulse laser beam P2, the third pre-pulse laser beam P3, and the main pulse laser beam M in this order.

As in the first embodiment shown in FIG. 2, the laser beam direction control unit 34a may include high reflection mirrors 340, 341, and 342 and beam combiners 343 and 344. The beam combiner 343 may have substantially the same functions as that shown in FIG. 2, except for the function of substantially combining the beam paths of the first to third pre-pulse laser beams P1 to P3.

Figure 32:
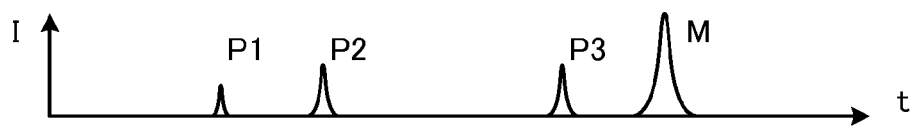
FIG. 32 is a waveform chart showing an example of a laser beam reception signal in the variation of the third embodiment.

FIG. 32 is a waveform chart showing an example of a laser beam reception signal in the variation of the third embodiment. In FIG. 32, the horizontal axis may represent time t, and the vertical axis may represent light intensity I. The pulse laser beam 32 that the optical sensor 352 receives may include the first pre-pulse laser beam P1, the second pre-pulse laser beam P2, the third pre-pulse laser beam P3, and the main pulse laser beam M. The first pre-pulse laser beam P1, the second pre-pulse laser beam P2, the third pre-pulse laser beam P3, and the main pulse laser beam M may be incident on the optical sensor 352 in this order. The fluence of the second pre-pulse laser beam P2 may be higher than the fluence of the first pre-pulse laser beam P1. The fluence of the main pulse laser beam M may be higher than the fluence of either one of the second and third pre-pulse laser beams P2 and P3.

The present disclosure is not limited to a case where the second delay circuit 52 outputs the third trigger signal to the second YAG laser apparatus La1 and the second YAG laser apparatus La2 outputs the third pre-pulse laser beam P3, although FIG. 31 illustrates such a case. The second YAG laser apparatus La2 may be eliminated. That is, the $CO_2$ laser apparatus Lb may receive the third trigger signal and the fourth trigger signal, and the $CO_2$ laser apparatus Lb may output the third pre-pulse laser beam P3 and the main pulse laser beam M. Alternatively, the $CO_2$ laser apparatus Lb may receive the third trigger signal and the fourth trigger signal, and the $CO_2$ laser apparatus Lb may output a main pulse laser beam MP having a pulse waveform including the first to third stages. Such a $CO_2$ laser apparatus Lb has the same functions as that shown in FIG. 7, except for using the third and fourth trigger signals instead of the second and third trigger signals.

8.5 Improvement of CE

Figure 33:
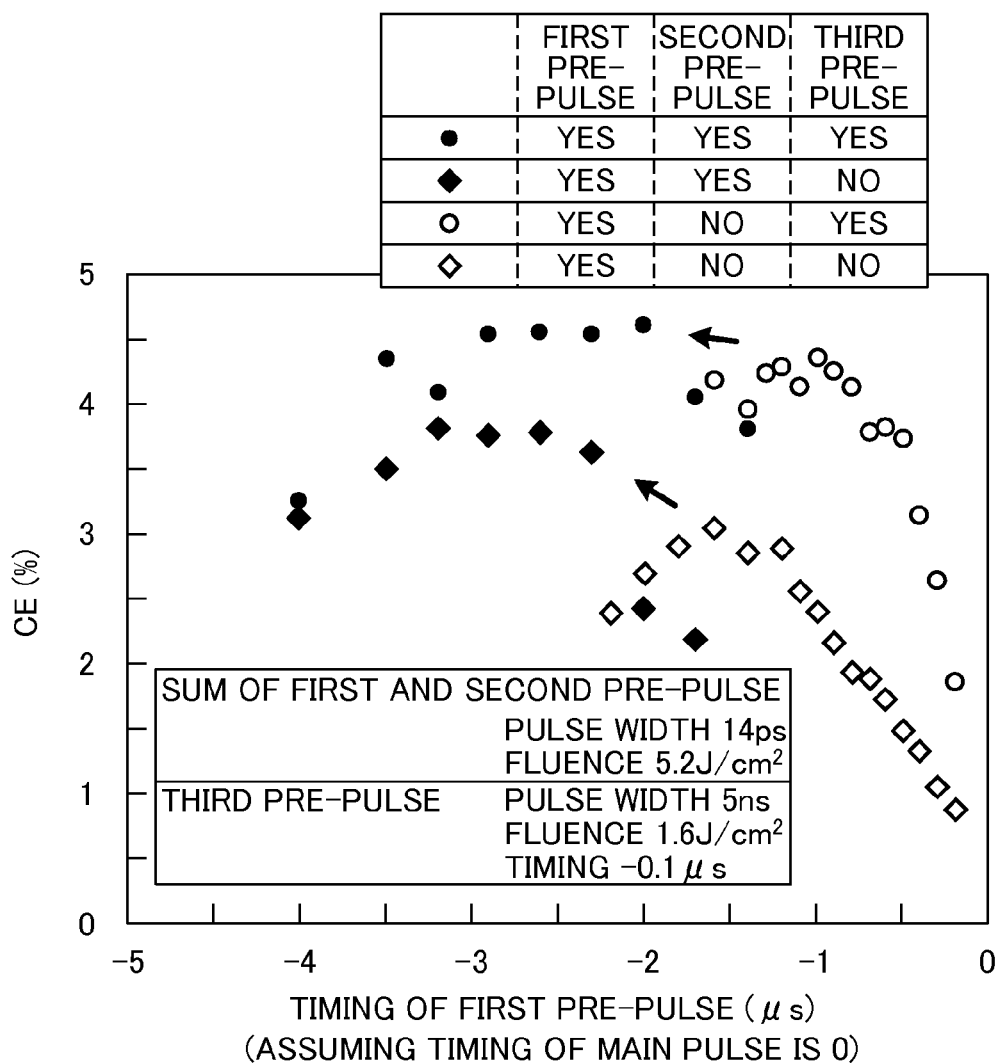
FIG. 33 is a graph showing results of measurement of CE in the EUV light generation system according to the third embodiment.

FIG. 33 is a graph showing results of measurement of CE in the EUV light generation system 11 according to the third embodiment. In FIG. 33, the horizontal axis may represent a time lag between the timing of irradiation with the first pre-pulse laser beam P1 and the timing of irradiation with the main pulse laser beam M, and the vertical axis may represent CE. Here, the timing of irradiation with the first pre-pulse laser beam P1 may be a time that precedes the timing of irradiation with the main pulse laser beam M, assuming that the timing of irradiation with the main pulse laser beam M is 0.

Targets 27 and the conditions of irradiation with the main pulse laser beam M were the same as those described with reference to FIGS. 15 and 16.

As the first and second pre-pulse laser beams P1 and P2, pulse laser beams were outputted by a mode-locked laser apparatus and a regenerative amplifier under the conditions described with reference to FIGS. 15 and 16. Each of the first and second pre-pulse laser beams P1 and P2 had a pulse duration of the picosecond order and an interpulse interval of these beams was 12 ns. The first pre-pulse laser beam P1 had lower light intensity than the second pre-pulse laser beam P2 did, and the fluence of a combination of the first and second pre-pulse laser beams P1 and P2 was 5.2 J/cm$^2$.

The conditions of irradiation with the third pre-pulse laser beam P3 were the same as the conditions of irradiation with the second pre-pulse laser beam P2 described with reference to FIGS. 15 and 16. Note, however, that the fluence of the third pre-pulse laser beam P3 was set to either one of the following two values: 1.6 J/cm$^2$ and 0 J/cm$^2$. The timing of irradiation with the third pre-pulse laser beam P3 was a timing of −0.1 µs, which precedes the timing of irradiation with the main pulse laser beam M, assuming that the timing of irradiation with the main pulse laser beam M is 0.

FIG. 33 also shows results obtained without irradiation with the second pre-pulse laser beam P2 in the third embodiment.

The results shown in FIG. 33 may present the following findings:

By irradiating the target with the second pre-pulse laser beam P2 in the third embodiment, improved CE was obtained, as compared with the situation not irradiating the target with the second pre-pulse laser beam P2.

By irradiating the target with the second pre-pulse laser beam P2 in the third embodiment, an ideal timing of irradiation with the first pre-pulse laser beam P1 became earlier, as compared with the situation not irradiating the target with the second pre-pulse laser beam P2. That is, in the third embodiment, as compared with the case of FIG. 21, CE was improved with a longer time lag between the timing of irradiation with the first pre-pulse laser beam P1 and the timing of irradiation with the main pulse laser beam M.

If the target is irradiated with the third pre-pulse laser beam P3, the time lag between the first pre-pulse laser beam P1 and the main pulse laser beam M may preferably be 1.3 µs or longer and 3.2 µs or shorter, more preferably 2.0 µs or longer and 3.0 µs or shorter.

If the target is not irradiated with the third pre-pulse laser beam P3, the time lag between the first pre-pulse laser beam P1 and the main pulse laser beam M may preferably be 2.0 µs or longer and 3.5 µs or shorter, more preferably 2.3 µs or longer and 3.2 µs or shorter.

8.6 Changes of a Target Irradiated with the Pulse Laser Beams

Figure 34:
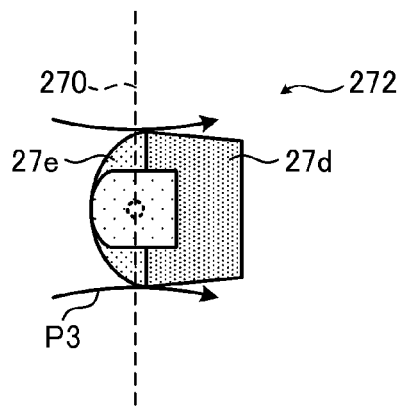
FIG. 34 schematically illustrates an appearance of a target after being irradiated with a first pre-pulse laser beam and a second pre-pulse laser beam in the third embodiment.

FIG. 34 schematically illustrates an appearance of a target 27 irradiated with the first and second pre-pulse laser beams P1 and P2 in the third embodiment. By being irradiated with the first and second pre-pulse laser beams P1 and P2, the droplet target 27 may be broken up into a plurality of fine particles and diffused to form a secondary target 272. The roughness and fineness of dots in FIG. 34 may correspond to the distribution density of the target material. As shown in FIG. 34, the secondary target 272, generated by being irradiated to be broken up with the first and second pre-pulse laser beams P1 and P2, may have a truncated conical portion 27d and a dome portion 27e. The truncated conical portion 27d of the secondary target shown in FIG. 34 may be lower in density of the target material than the disc portion 27a of the secondary target shown in FIG. 26B.

As described above, in the third embodiment, the target irradiated with the first and second pre-pulse laser beams may be diffused in the form of a plurality of finer particles.

Therefore, the target may be efficiently turned into plasma by the third pre-pulse laser beam P3 and the main pulse laser beam M.

9. OTHERS

YAG Laser Apparatus

9.1 First Example

Figure 35:
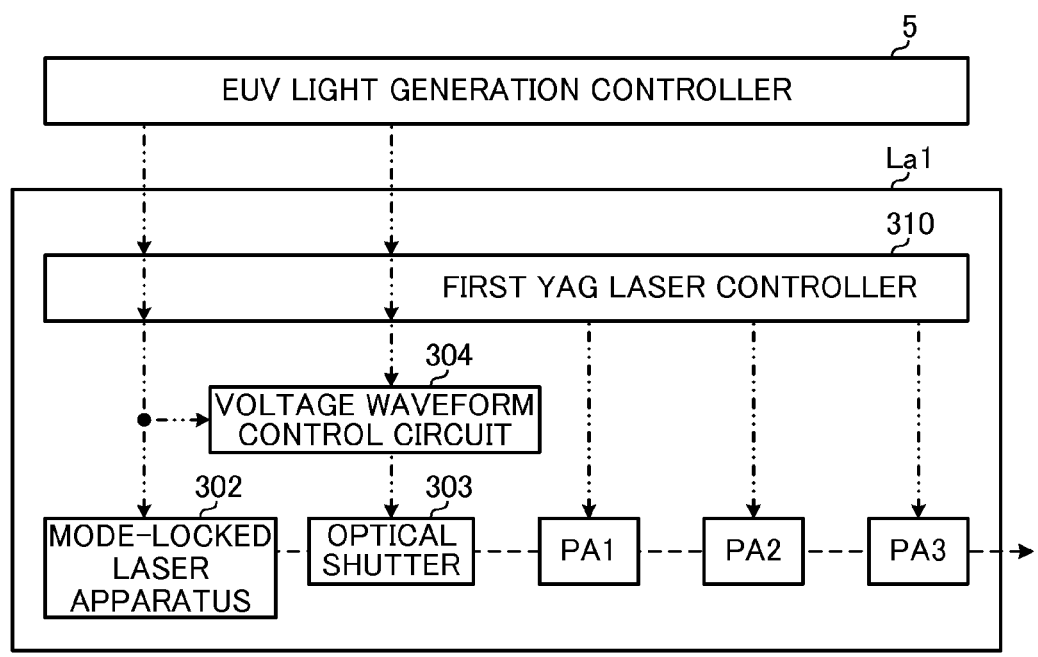
FIG. 35 schematically illustrates a first example of a first YAG laser apparatus that may be used in each of the EUV light generation systems according to the embodiments mentioned above.

FIG. 35 schematically illustrates a first example of a first YAG laser apparatus La1 that may be used in each of the EUV light generation systems according to the embodiments mentioned above. The first YAG laser apparatus La1 shown in FIG. 35 may output a pre-pulse laser beam having a pulse duration of the picosecond order.

The first YAG laser apparatus La1 may include a mode-locked laser apparatus 302, an optical shutter 303, a voltage waveform control circuit 304, amplifiers PA1 to PA3, and a first YAG laser controller 310.

The mode-locked laser apparatus 302 may output a pulse laser beam for example having a pulse duration of the picosecond order and a repetition frequency of approximately 100 MHz. The mode-locked laser apparatus 302 may include an optical resonator (not shown), a Nd:YVO$_4$ crystal serving as a laser medium, and a saturable absorber mirror. The optical resonator of the mode-locked laser apparatus 302 may oscillate laser beams at a plurality of longitudinal modes with fixed phases with each other. Then, when the beams of the plurality of longitudinal modes are combined with each other, a pulse laser beam having a short pulse duration may be outputted from the optical resonator. The repetition frequency of this pulse laser beam may correspond to an inverse of a time period for a beam to travel once back and forth in the optical resonator.

The first YAG laser controller 310 may output control signals to the mode-locked laser apparatus 302, the voltage waveform control circuit 304, and the amplifiers PA1 to PA3, respectively. The first YAG laser controller 310 may receive a first trigger signal and a second trigger signal from the EUV light generation controller 5 and output the first trigger signal and the second trigger signal to the voltage waveform control circuit 304.

The voltage waveform control circuit 304 may send a first voltage signal to the optical shutter 303 in accordance with the first trigger signal so that the optical shutter 303 allows passage of one pulse of the pulse laser beam. The voltage waveform control circuit 304 may send a second voltage signal to the optical shutter 303 in accordance with the second trigger signal so that the optical shutter 303 allows passage of another pulse of the pulse laser beam.

The optical shutter 303 may include an EO Pockels cell and a polarizer and be disposed in a beam path of the pulse laser beam that is outputted from the mode-locked laser apparatus 302. The optical shutter 303 may interrupt the pulse laser beam that is outputted from the mode-locked laser apparatus 302. Upon receiving the first voltage signal outputted by the voltage waveform control circuit 304, the optical shutter 303 may allow passage of one pulse of the pulse laser beam. Upon receiving the second voltage signal outputted by the voltage waveform control circuit 304, the optical shutter 303 may allow passage of one pulse of the pulse laser beam. Here, the light intensity of the first pre-pulse laser beam P1 may preferably be lower than the light intensity of the second pre-pulse laser beam P2. By adjusting the voltage values of the first and second voltage signals, the light intensities of the first and second pre-pulse laser beams P1 and P2 may be controlled.

The amplifiers PA1 to PA3 may be disposed in a beam path of the pulse laser beam having passed through the optical shutter 303. The pulse laser beam having passed through the optical shutter 303 may be amplified by the amplifiers PA1 to PA3 and outputted to the laser beam direction control unit 34a shown for example in FIG. 31. The amplifier PA1 may be a multipath amplifier that includes a slab optical crystal (e.g. Nd:YAG) and two mirrors, for example.

According to the above, the first YAG laser apparatus La1, illustrated in the third embodiment, which outputs the first and second pre-pulse laser beams P1 and P2 may be achieved. Note, however, that in a case where the first YAG laser apparatus La1 has received only the first trigger signal from the EUV light generation controller 5, the first YAG laser apparatus La1, illustrated in the first and second embodiments, which outputs only the first pre-pulse laser beam P1 may be achieved.

9.2 Second Example

Figure 36:
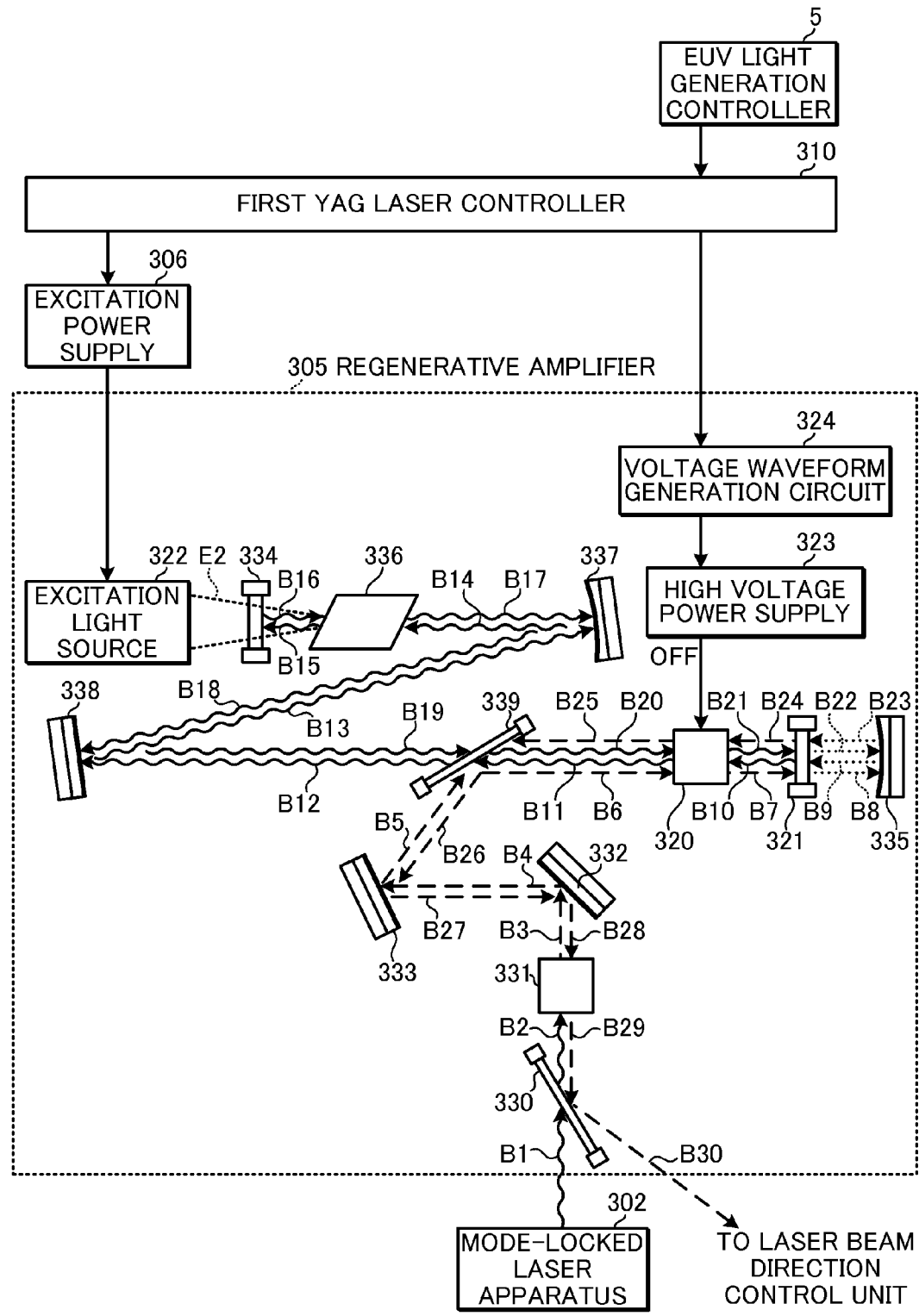
FIG. 36 schematically illustrates a second example of the first YAG laser apparatus that may be used in each of the EUV light generation systems according to the embodiments mentioned above.

FIG. 36 schematically illustrates a second example of the first YAG laser apparatus La1 that may be used in each of the EUV light generation systems according to the embodiments mentioned above. The first YAG laser apparatus La1 shown in FIG. 36 may output a pre-pulse laser beam having a pulse duration of the picosecond order.

The first YAG laser apparatus La1 may include a mode-locked laser apparatus 302, a regenerative amplifier 305, an excitation power supply 306, and a first YAG laser controller 310.

The regenerative amplifier 305 may include an optical resonator constituted by a flat mirror 334 and a concave mirror 335. In the optical resonator, a laser crystal 336, a concave mirror 337, a flat mirror 338, a polarization beam splitter 339, a Pockels cell 320, and a quarter wave plate 321 may be provided in this order from the side of the flat mirror 334. Further, the regenerative amplifier 305 may include an excitation light source 322 configured to output excitation light E2 to the laser crystal 336 from the outside of the optical resonator. The excitation light source 322 may include a laser diode to generate the excitation light E2. Further, the regenerative amplifier 305 may include a polarization beam splitter 330, a Faraday optical isolator 331, and flat mirrors 332 and 333. The Faraday optical isolator 331 may include a Faraday rotator (not shown) and a half-wave plate (not shown).

The flat mirror 334 may be configured to transmit wavelength components of the excitation light E2 from the excitation light source 322 with high transmittance and reflect wavelength components of emitted light from the laser crystal 336 with high reflectance. The laser crystal 336 may be a laser medium excited by the excitation light E2. The laser crystal 336 may, for example, be a Nd:YAG crystal. When a seed beam outputted from the mode-locked laser apparatus 302 is incident on the laser crystal 336 excited by the excitation light E2, the seed beam may be amplified through stimulated emission.

9.2.1 Case where No Voltage is Applied to the Pockels Cell

The polarization beam splitter 330 may be provided in a beam path of a pulse laser beam B1 outputted from the mode-locked laser apparatus 302. The polarization beam splitter 330 may be arranged such that light receiving surfaces thereof are perpendicular to the paper plane. The polarization beam splitter 330 may be configured to transmit a linearly polarized pulse laser beam B1, polarized in a direction parallel to the paper plane, with high transmittance. As described later, the polarization beam splitter 330 may reflect a linearly polarized pulse laser beam B29 polarized in a direction perpendicular to the paper plane with high reflectance.

The Faraday optical isolator 331 may be provided in a beam path of a pulse laser beam B2 which was transmitted through the polarization beam splitter 330 and came from the lower side in FIG. 36. The Faraday optical isolator 331 may rotate the polarization direction of the linearly polarized pulse laser beam B2, which came from the lower side in FIG. 36, by 90 degrees and transmit it as a pulse laser beam B3. As described later, the Faraday optical isolator 331 may transmit a pulse laser beam B28, which may come from the opposite direction corresponding to the upper side in FIG. 36, toward the polarization beam splitter 330 without rotating the polarization direction thereof.

The flat mirror 332 may be provided in a beam path of the pulse laser beam B3 transmitted through the Faraday optical isolator 331. The flat mirror 332 may reflect the pulse laser beam B3 with high reflectance. The flat mirror 333 may reflect a pulse laser beam B4 reflected by the flat mirror 332 with high reflectance.

The polarization beam splitter 339 in the optical resonator may be provided on a beam path of a pulse laser beam B5 reflected by the flat mirror 333. The polarization beam splitter 339 may be provided such that the light receiving surfaces thereof are perpendicular to the paper plane. The pulse laser beam B5 may be incident on a right side (in the drawing) surface of the polarization beam splitter 339. The polarization beam splitter 339 may reflect the linearly polarized pulse laser beam B5 polarized in a direction perpendicular to the paper plane with high reflectance to thereby guide it into the optical resonator as a pulse laser beam B6. As described later, the polarization beam splitter 339 may transmit a linearly polarized pulse laser beam B11 and the like polarized in a direction parallel to the paper plane with high transmittance.

The Pockels cell 320, the quarter wave plate 321, and the concave mirror 335 may be disposed at the right side (in the drawing) of the polarization beam splitter 339 in the optical path of the optical resonator. The flat mirror 334, the laser crystal 336, the concave mirror 337, and the flat mirror 338 may be disposed at the left side (in the drawing) of the polarization beam splitter 339 in the optical path of the optical resonator.

Voltage may be applied to the Pockels cell 320 by a high voltage power supply 323. When the voltage is not applied to the Pockels cell 320 by the high voltage power supply 323, the Pockels cell 320 may transmit the pulse laser beam B6 reflected by the polarization beam splitter 339 to output a pulse laser beam B7 without rotating the polarization direction. The state in which the high voltage power supply 323 does not apply the voltage to the Pockels cell 320 may be referred to as "voltage OFF" and a state in which the high voltage power supply 323 applies the voltage may be referred to as "voltage ON".

The quarter wave plate 321 may be arranged such that the pulse laser beam B7 is incident on the quarter wave plate 321 at an angle of approximately 0 degree. Moreover, the quarter wave plate 321 may be arranged such that the optical axis of the crystal thereof is tilted, within a plane perpendicular to the beam path axis of the incident laser beam on the quarter wave plate 321, by 45 degrees to the paper plane. The pulse laser beam B7, being incident on the quarter wave plate 321, may have a first polarization component parallel to the optical axis of the above crystal, and have a second polarization component perpendicular to both of the optical axis of the crystal and a traveling direction of the pulse laser beam B7. When the first and second polarization components are combined, the resultant vector may be parallel to the polarization direction of the pulse laser beam B7 and perpendicular to the paper plane.

The quarter wave plate 321 may have a double refraction property to transmit the first and second polarization components with different refractive indices. As a result, the quarter wave plate 321 may shift the phase of the second polarization component by ¼ wavelengths with respect to the phase of the first polarization component when the quarter wave plate 321 transmits the pulse laser beam B7 transmitted through the Pockels cell 320. The concave mirror 335 may reflect a pulse laser beam B8 transmitted through the quarter wave plate 321 with high reflectance. A pulse laser beam B9 reflected by the concave mirror 335 may be transmitted again through the quarter wave plate 321. Therefore, the quarter wave plate 321 may further shift the phase of the second polarization component by ¼ wavelengths with respect to the phase of the first polarization component. That is, by the pulse laser beam B7 being transmitted twice through the quarter wave plate 321, the phase of the second polarization component may be shifted by ½ wavelengths in total with respect to the phase of the first polarization component. As a result, the polarization direction of the pulse laser beam B7, linearly polarized in a direction perpendicular to the paper plane, may be rotated by 90 degrees and may be incident on the Pockels cell 320 as a pulse laser beam B10, linearly polarized in a direction parallel to the paper plane.

As stated above, when the voltage from the high voltage power supply 323 is not applied to the Pockels cell 320, the Pockels cell 320 may transmit the incident pulse laser beam without rotating the polarization direction. Accordingly, a pulse laser beam B11 transmitted through the Pockels cell 320 may be incident on the polarization beam splitter 339 as a linearly polarized pulse laser beam polarized in a direction parallel to the paper plane. The polarization beam splitter 339 may transmit the pulse laser beam B11 linearly polarized in the direction parallel to the paper plane with high transmittance.

The flat mirror 338 may reflect with high reflectance a pulse laser beam B12 which was transmitted through the polarization beam splitter 339. The concave mirror 337 may reflect a pulse laser beam B13 reflected by the flat mirror 338 with high reflectance. The laser crystal 336 may amplify and transmit a pulse laser beam B14 as a seed beam reflected by the concave mirror 337.

The flat mirror 334 may reflect a pulse laser beam B15 amplified by and transmitted through the laser crystal 336 with high reflectance back to the laser crystal 336 as a pulse laser beam B16. A pulse laser beam B17 amplified again by the laser crystal 336 may be incident on the concave mirror 337. The pulse laser beam may then be incident on the flat mirror 338, then be incident on the polarization beam splitter 339, then be incident on the Pockels cell 320, and then be incident on the quarter wave plate 321 as a pulse laser beam B21. The pulse laser beam B21 may be transmitted through the quarter wave plate 321, then be reflected by the concave mirror 335, and then be transmitted again through the quarter wave plate 321, to thereby be converted into a linearly polarized pulse laser beam B24 polarized in a direction perpendicular to the paper plane and having the polarization direction thereof turned 90 degrees. The pulse laser beam B24 may be transmitted through the Pockels cell 320, then be reflected by the polarization beam splitter 339 with high reflectance, and outputted as a pulse laser beam B26 to the outside of the optical resonator.

The pulse laser beam B26 may be reflected by the high reflection mirror 333, then be reflected by the high reflection mirror 332, and then be incident on the Faraday optical isolator 331 as a pulse laser beam B28 from the upper side in FIG. 36. The Faraday optical isolator 331 may transmit the linearly polarized pulse laser beam B28, without rotating the polarization direction thereof, as a pulse laser beam B29. The polarization beam splitter 330 may reflect the linearly polarized pulse laser beam B29 polarized in a direction perpendicular to the paper plane with high reflectance.

A pulse laser beam B30 reflected by the polarization beam splitter 330 may be guided through the laser beam focusing optics 22a shown in FIG. 2 to the plasma generation region 25. However, the pulse laser beam B30 outputted after traveling only once in the optical resonator in the regenerative amplifier 305 may have low light intensity; even when a target is irradiated with the pulse laser beam B30, the target may not be broken or turned into plasma.

9.2.2 Case where Voltage is Applied to the Pockels Cell

The high voltage power supply 323 may turn ON the voltage applied to the Pockels cell 320 at given timing after one pulse of the pulse laser beam B11 is transmitted once through the Pockels cell 320 and before the pulse is then incident on the Pockels cell 320 as the pulse laser beam B20. When the voltage is applied to the Pockels cell 320 by the high voltage power supply 323, the Pockels cell 320 may, similarly to the quarter wave plate 321, shift the phase of the second polarization component by ¼ wavelengths with respect to the phase of the first polarization component.

Figure 37:
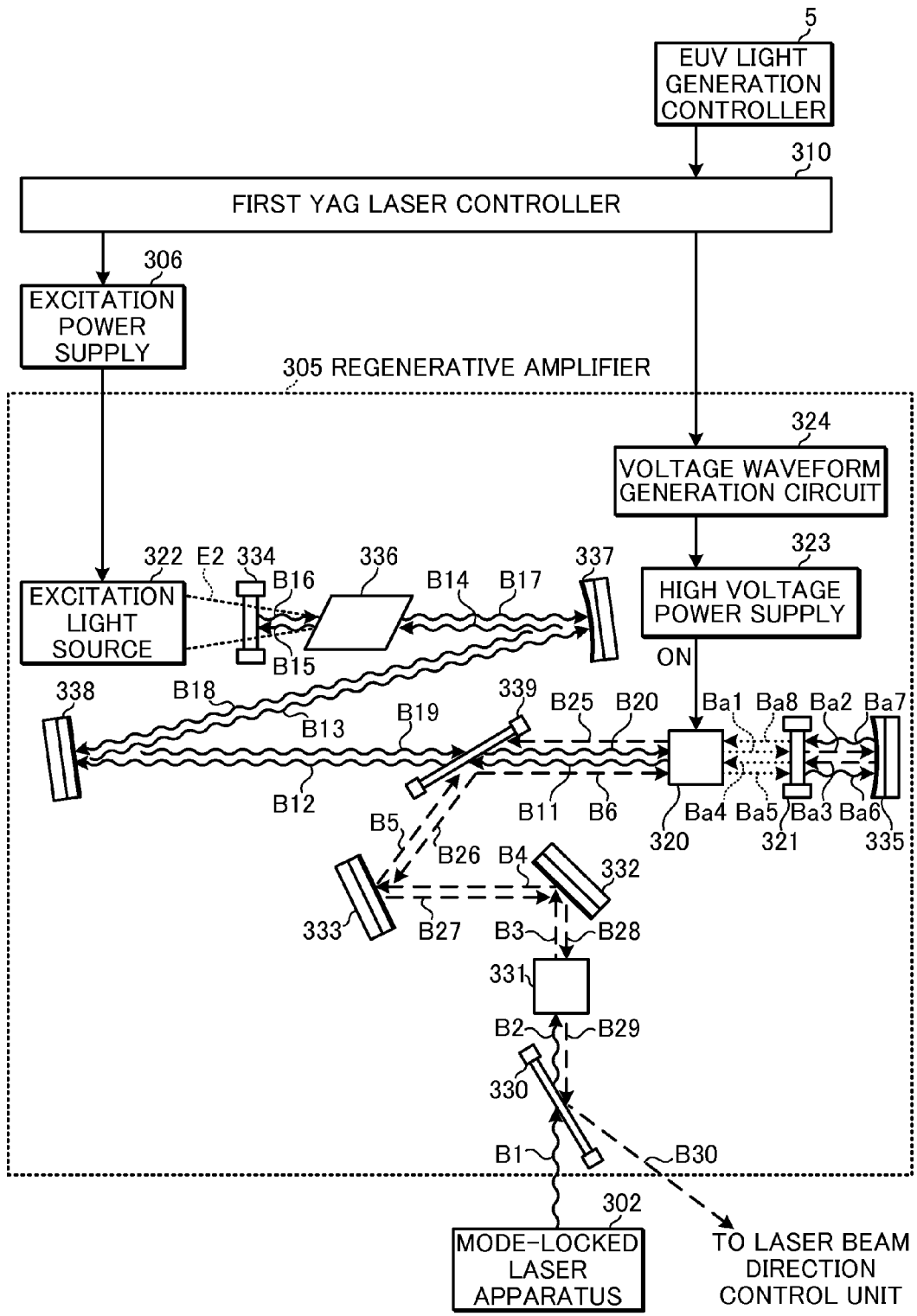
FIG. 37 schematically illustrates a beam path in a regenerative amplifier shown in FIG. 36 when voltage is applied to the Pockels cell.

FIG. 37 schematically illustrates a beam path in the regenerative amplifier 305 shown in FIG. 36 when the voltage is applied to the Pockels cell 320. In this situation, the pulse laser beam B20 may be transmitted through the Pockels cell 320 twice and the quarter wave plate 321 twice, as indicated by pulse laser beams Ba1, Ba2, Ba3, and Ba4, and may return as the pulse laser beam B11. The pulse laser beam B11 that has turned a further 90 degrees due to being transmitted through the quarter wave plate 321 twice and transmitted through the Pockels cell 320 twice which the voltage is applied to turn 90 degrees yet again may have its polarization direction oriented toward the same direction as that of the pulse laser beam B20. Accordingly, the pulse laser beam B11 may be transmitted through the polarization beam splitter 339 again and be amplified by the laser crystal 336. While the voltage is applied to the Pockels cell 320 by the high voltage power supply 323, this amplification operation may be repeated.

After the amplification operation is repeated, the high voltage power supply 323 may set the voltage applied to the Pockels cell 320 to OFF at given timing after the pulse laser beam B11 is transmitted through the Pockels cell 320 once and before the pulse is incident on the Pockels cell 320 as the pulse laser beam B20. As stated above, when the voltage is not applied to the Pockels cell 320 from the high voltage power supply 323 as shown in FIG. 5, the Pockels cell 320 may not rotate polarization direction of the incident pulse laser beam. Accordingly, the pulse laser beam B20 incident on the left side surface of the Pockels cell 320 (in the drawing) when the voltage is not applied thereto may have its polarization direction rotated only by 90 degrees as it is transmitted through the quarter wave plate 321 twice as the pulse laser beams B21, B22, B23, and B24 shown in FIG. 37. Thus, the pulse laser beam after the amplification operation is repeated may be incident on the right side (in the drawing) surface of the polarization beam splitter 339 as the linearly polarized pulse laser beam B25 polarized in a direction perpendicular to the paper plane and be outputted to the outside of the optical resonator.

Alternatively, after the amplification operation is repeated, the high voltage power supply 323 may start dropping the voltage applied to the Pockels cell 320 to OFF at a given timing after the pulse laser beam B11 is transmitted through the Pockels cell 320 once and before the pulse is incident on the Pockels cell 320 as the pulse laser beam B20. The timing to start dropping the voltage and the time required between the start of the dropping of voltage and end of the dropping of voltage may be set so that the pulse laser beam B20 passes through the Pockels cell 320 during the dropping of voltage. With this configuration, a portion of the pulse laser beam B20, i.e. the pulse laser beam B20 having passed through the Pockels cell 320 at the time of voltage OFF, may be reflected by the polarization beam splitter 339 and outputted to the outside of the optical resonator. The remaining portion of the pulse laser beam B20, i.e. the pulse laser beam B20 having passed through the Pockels cell 320 at the time of voltage ON, may be transmitted through the polarization beam splitter 339 again, travel once back and forth in the optical resonator, and then be outputted to the outside of the optical resonator.

This makes it possible to turn a pulse laser beam taken out from the regenerative amplifier 305 into a double pulse and to irradiate a single target 27 with the first and second pre-pulse laser beams in the third embodiment.

With a pre-pulse laser beam having a pulse duration of the picosecond order, a target may be broken up into fine particles and diffused. With this configuration, the diffused target may be efficiently turned into plasma when being irradiated with a main pulse laser beam.

Other examples of laser apparatuses that may be used to output a pulse laser beam having a pulse duration of the picosecond order may include the following laser apparatuses:

(1) As a mode-locked laser apparatus, a solid laser (such as Nd based, Yb based, Ti:sapphire, etc.), a fiber laser, or the like may be used. In this case, a pulse laser beam having a pulse duration ranging from 10 fs to 100 ps may be generated.

(2) A microchip laser such as Nd:YVO$_4$ may be used. In this case, a pulse laser beam having a pulse duration ranging from 50 ps to 500 ps may be generated.

(3) A pulse laser beam having a pulse duration of the picosecond order may be outputted by high-speed modulation of supply current in a semiconductor laser. In this case, a pulse laser beam having a pulse duration ranging from 50 ps to less than 1 ns may be generated.

(4) A pulse laser beam having a pulse duration of the picosecond order may be generated by a combination of a CW oscillation semiconductor laser and a high-speed optical switch and amplified by a plurality of amplifiers. In this case, a pulse laser beam having a pulse duration ranging from 100 ps to less than 1 ns may be generated.

10. CONFIGURATION OF THE CONTROLLER

Figure 38:
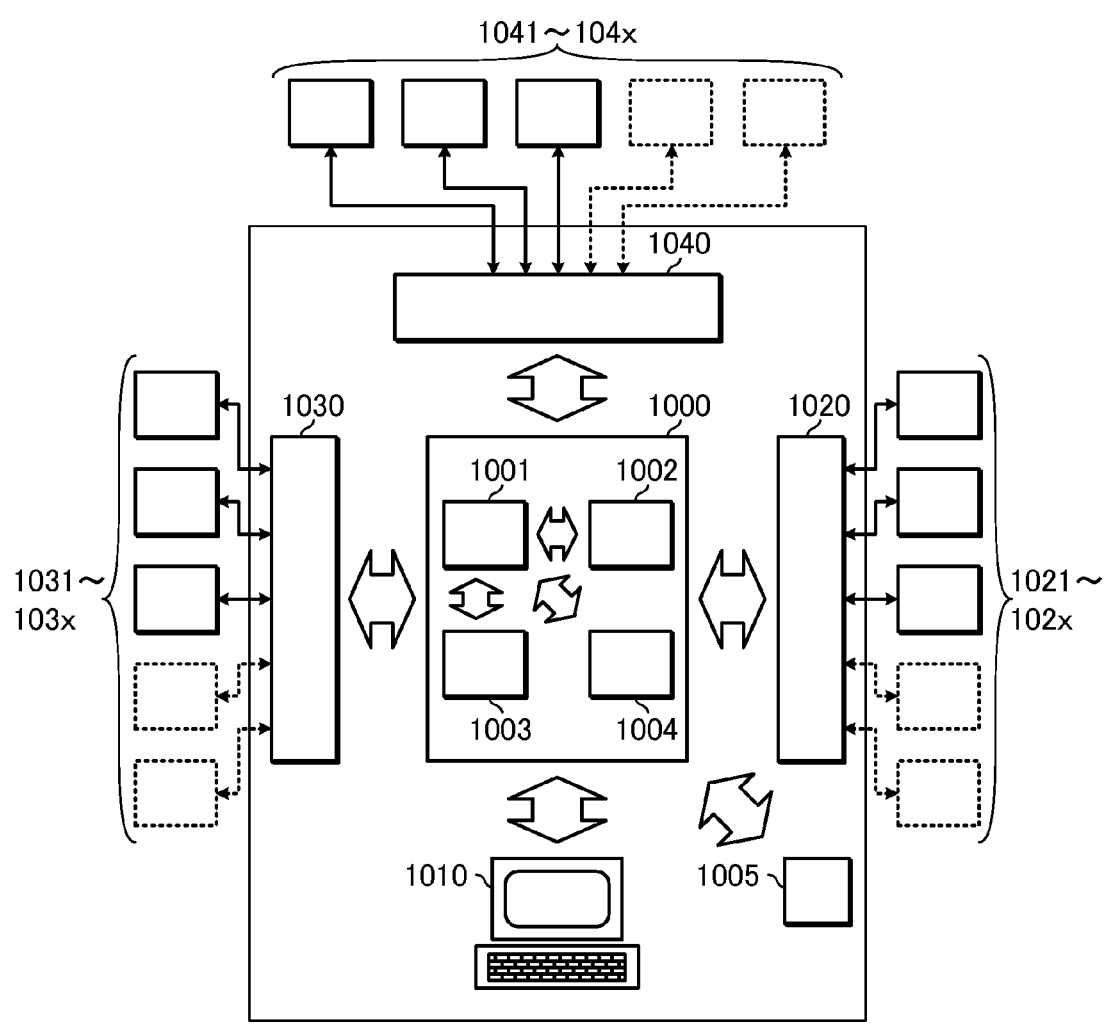
FIG. 38 is a block diagram schematically illustrating a configuration of a controller.

FIG. 38 is a block diagram schematically illustrating a configuration of a controller.

A controller such as the EUV controller 50 in the embodiments described above may be constituted by a general-purpose control device such as a computer or a programmable controller. For example, the controller may be constituted as described below.

(Configuration)

The controller may include a processing unit 1000, and a storage memory 1005, a user interface 1010, a parallel input/output (I/O) controller 1020, a serial I/O controller 1030, and an analog-to-digital (A/D) and digital-to-analog (D/A) converter 1040 that are connected to the processing unit 1000. The processing unit 1000 may include a central processing unit (CPU) 1001, and a memory 1002, a timer 1003, and a graphics processing unit (GPU) 1004 that are connected to the CPU 1001.

(Operation)

The processing unit 1000 may read out programs stored in the storage memory 1005. The processing unit 1000 may execute read-out programs, read out data from the storage memory 1005 in accordance with the execution of the programs, or store data in the storage memory 1005.

The parallel I/O controller 1020 may be connected to devices 1021 to 102x communicable through parallel I/O ports. The parallel I/O controller 1020 may control communication using digital signals through parallel I/O ports that is performed in the process where the processing unit 1000 executes programs.

The serial I/O controller 1030 may be connected to devices 1031 to 103x communicable through serial I/O ports. The serial I/O controller 1030 may control communication using digital signals through serial I/O ports that is performed in the process where the processing unit 1000 executes programs.

The A/D and D/A converter 1040 may be connected to devices 1041 to 104x communicable through analog ports. The A/D and D/A converter 1040 may control communication using analog signals through analog ports that is performed in a process where the processing unit 1000 executes programs.

The user interface 1010 may be configured to display progress of executing programs by the processing unit 1000 to an operator or to receive instructions by the operator to the processing unit 1000 to stop execution of the programs or to execute interruption processing.

The CPU 1001 of the processing unit 1000 may perform arithmetic processing of programs. In the process where the CPU 1001 executes programs, the memory 1002 may temporally store programs or temporally store data in the arithmetic process. The timer 1003 may measure time or elapsed time to output the time or the elapsed time to the CPU 1001 in accordance with the execution of the programs. When image data is input to the processing unit 1000, the GPU 1004 may process the image data in accordance with the execution of the programs and output the results to the CPU 1001.

The devices 1021 to 102x communicable through parallel I/O ports, which are connected to the parallel I/O controller 1020, may be the laser system 3, the exposure apparatus 6, another controller, or the like.

The devices 1031 to 103x communicable through serial I/O ports, which are connected to the serial I/O controller 1030, may be the target sensor 4, the beam detector 35, the positioning mechanism 84, or the like.

The devices 1041 to 104x communicable through analog ports, which are connected to the A/D and D/A converter 1040, may be various sensors such as the EUV light sensor 7.

With the above-described configuration, the controller may be capable of achieving the operation illustrated in each of the embodiments.

The descriptions above are intended to be illustrative only and the present disclosure is not limited thereto. Therefore, it will be apparent to those skilled in the art that it is possible to make modifications to the embodiments of the present disclosure within the scope of the appended claims.

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

The invention claimed is:

1. An extreme ultraviolet light generation system comprising:
    a chamber;
    a target generation unit configured to output a target toward a plasma generation region in the chamber;
    a laser system configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order; and
    a controller configured to control the laser system so that a fluence of the second pre-pulse laser beam is equal to or higher than 1 J/cm$^2$ and equal to or lower than a fluence of the main pulse laser beam.

2. The extreme ultraviolet light generation system according to claim 1, wherein the laser system is configured to generate the first pre-pulse laser beam having a pulse duration of a picosecond order.

3. The extreme ultraviolet light generation system according to claim 1, wherein the laser system includes:
    a mode-locked laser apparatus;
    an optical shutter disposed in a beam path of a pulse laser beam outputted by the mode-locked laser apparatus;
    a voltage waveform control circuit configured to send a voltage signal to the optical shutter so that the optical shutter allows to pass at least one pulse included in the pulse laser beam outputted by the mode-locked laser apparatus;
    an amplifier configured to receive the pulse laser beam passed the optical shutter and to output the first pre-pulse laser beam; and
    a laser controller configured to output control signals to the mode-locked laser apparatus, the voltage waveform control circuit, and the amplifier.

4. The extreme ultraviolet light generation system according to claim 3, wherein the mode-locked laser apparatus includes an optical resonator, a Nd:YVO$_4$ crystal serving as a laser medium, and a saturable absorber mirror.

5. The extreme ultraviolet light generation system according to claim 3, wherein the optical shutter includes an EO Pockels cell and a polarizer.

6. The extreme ultraviolet light generation system according to claim 3, wherein the amplifier is a multipath amplifier including a slab optical crystal and two mirrors.

7. The extreme ultraviolet light generation system according to claim 1, further comprising:
    a first beam combiner disposed at a first position where an optical path of the first pre-pulse laser beam and an optical path of the second pre-pulse laser beam intersect, the first beam combiner being configured to reflect one of a first polarization component included in the first pre-pulse laser beam and a second polarization component included in the second pre-pulse laser beam and to transmit another one of the first polarization component and the second polarization component, so as to output the first pre-pulse laser beam and the second pre-pulse laser beam to a second position located in an optical path of the main pulse laser beam; and a second beam combiner disposed at the second position, the second beam combiner being configured to reflect one of a first wavelength component included in both of the first pre-pulse laser beam and the second pre-pulse laser beam and a second wavelength component included in the main pulse laser beam and to transmit another one of the first wavelength component and the second wavelength component, so as to output the first pre-pulse laser beam, the second pre-pulse laser beam and the main pulse laser beam to a third position.

8. The extreme ultraviolet light generation system according to claim 7, further comprising:

a beam splitter disposed between the second beam combiner and the third position, the beam splitter being configured to output a part of each of the first pre-pulse laser beam, the second pre-pulse laser beam and the main pulse laser beam to a fourth position and to output another part of each of the first pre-pulse laser beam, the second pre-pulse laser beam and the main pulse laser beam to the third position; and an optical sensor disposed at the fourth position, the optical sensor being configured to detect each of the first pre-pulse laser beam, the second pre-pulse laser beam and the main pulse laser beam.

9. An extreme ultraviolet light generation system comprising:

a chamber;

a target generation unit configured to output a target toward a plasma generation region in the chamber;

a laser system configured to generate a pre-pulse laser beam and a main pulse laser beam so that the target is irradiated with the pre-pulse laser beam and the main pulse laser beam in this order; and a controller configured to control a pulse waveform of the main pulse laser beam so that the pulse waveform includes a first stage in which light intensity increases at a rate of increase equal to or lower than a first rate of increase, a second stage in which the light intensity increases at a second rate of increase that is higher than the first rate of increase, and a third stage in which the light intensity decreases and so that a fluence of the main pulse laser beam in the first stage is equal to or higher than 2 J/cm$^2$ and equal to or lower than a fluence of the main pulse laser beam in the second and third stages.

10. An extreme ultraviolet light generation system comprising:

a chamber;

a target generation unit configured to output a target toward a plasma generation region in the chamber;

a laser system configured to generate a first pre-pulse laser beam, a second pre-pulse laser beam, and a main pulse laser beam so that the target is irradiated with the first pre-pulse laser beam, the second pre-pulse laser beam, and the main pulse laser beam in this order;

a first beam expander disposed in a beam path of the first pre-pulse laser beam to control a wavefront of the first pre-pulse laser beam;

a second beam expander disposed in a beam path of the second pre-pulse laser beam to control a wavefront of the second pre-pulse laser beam; and a third beam expander disposed in a beam path of the main pulse laser beam to control a wavefront of the main pulse laser beam.

11. The extreme ultraviolet light generation system according to claim 10, further comprising a controller configured to control the first to third beam expanders so that a focusing diameter of the first pre-pulse laser beam is smaller than a focusing diameter of the main pulse laser beam and a focusing diameter of the second pre-pulse laser beam.

12. The extreme ultraviolet light generation system according to claim 10, wherein:

the first beam expander includes a spherical concave lens and a spherical convex lens;

the second beam expander includes a spherical concave lens and a spherical convex lens; and the third beam expander includes a spherical concave mirror and a spherical convex mirror.

13. The extreme ultraviolet light generation system according to claim 10, further comprising:

a first optical element disposed in a beam path of the first pre-pulse laser beam;

a first actuator configured to move the first optical element so as to control a traveling direction of the first pre-pulse laser beam;

a second optical element disposed in a beam path of the second pre-pulse laser beam;

a second actuator configured to move the second optical element so as to control a traveling direction of the second pre-pulse laser beam;

a third optical element disposed in a beam path of the main pulse laser beam; and a third actuator configured to move the third optical element so as to control a traveling direction of the main pulse laser beam.

14. The extreme ultraviolet light generation system according to claim 10, wherein the laser system is configured to generate the first pre-pulse laser beam having a pulse duration of a picosecond order.

15. The extreme ultraviolet light generation system according to claim 10, wherein the laser system includes:

a mode-locked laser apparatus;

an optical shutter disposed in a beam path of a pulse laser beam outputted by the mode-locked laser apparatus;

a voltage waveform control circuit configured to send a voltage signal to the optical shutter so that the optical shutter allows to pass at least one pulse included in the pulse laser beam outputted by the mode-locked laser apparatus;

an amplifier configured to receive the pulse laser beam passed the optical shutter and to output the first pre-pulse laser beam; and a laser controller configured to output control signals to the mode-locked laser apparatus, the voltage waveform control circuit, and the amplifier.

16. The extreme ultraviolet light generation system according to claim 15, wherein the mode-locked laser apparatus includes an optical resonator, a Nd:YVO$_4$ crystal serving as a laser medium, and a saturable absorber mirror.

17. The extreme ultraviolet light generation system according to claim 15, wherein the optical shutter includes an EO Pockels cell and a polarizer.

18. The extreme ultraviolet light generation system according to claim 15, wherein the amplifier is a multipath amplifier including a slab optical crystal and two mirrors.

19. The extreme ultraviolet light generation system according to claim 10, further comprising:

a first beam combiner disposed at a first position where an optical path of the first pre-pulse laser beam and an optical path of the second pre-pulse laser beam intersect, the first beam combiner being configured to reflect one of a first polarization component included in the first pre-pulse laser beam and a second polarization component included in the second pre-pulse laser beam and to transmit another one of the first polarization component and the second polarization component, so as to output the first pre-pulse laser beam and the second pre-pulse laser beam to a second position located in an optical path of the main pulse laser beam; and a second beam combiner disposed at the second position, the second beam combiner being configured to reflect one of a first wavelength component included in both of the first pre-pulse laser beam and the second pre-pulse laser beam and a second wavelength component included in the main pulse laser beam and to transmit another one of the first wavelength component and the second wavelength component, so as to output the first pre-pulse laser beam, the second pre-pulse laser beam and the main pulse laser beam to a third position.

20. The extreme ultraviolet light generation system according to claim 19, further comprising:

a beam splitter disposed between the second beam combiner and the third position, the beam splitter being configured to output a part of each of the first pre-pulse laser beam, the second pre-pulse laser beam and the main pulse laser beam to a fourth position and to output another part of each of the first pre-pulse laser beam, the second pre-pulse laser beam and the main pulse laser beam to the third position; and an optical sensor disposed at the fourth position, the optical sensor being configured to detect each of the first pre-pulse laser beam, the second pre-pulse laser beam and the main pulse laser beam.

* * * * *